United States Patent
Ide et al.

(10) Patent No.: US 9,589,082 B2
(45) Date of Patent: Mar. 7, 2017

(54) DATA PROCESSING DEVICE THAT CALCULATES AN ARRIVAL PROBABILITY FOR A DESTINATION USING A USER'S MOVEMENT HISTORY INCLUDING A MISSING PORTION

(75) Inventors: Naoki Ide, Tokyo (JP); Masato Ito, Tokyo (JP); Kohtaro Sabe, Tokyo (JP)

(73) Assignee: SONY CORPORATION, Tokyo (JP)

(*) Notice: Subject to any disclaimer, the term of this patent is extended or adjusted under 35 U.S.C. 154(b) by 888 days.

(21) Appl. No.: 13/878,920

(22) PCT Filed: Nov. 7, 2011

(86) PCT No.: PCT/JP2011/075541
§ 371 (c)(1),
(2), (4) Date: Apr. 11, 2013

(87) PCT Pub. No.: WO2012/066951
PCT Pub. Date: May 24, 2012

(65) Prior Publication Data
US 2013/0197890 A1    Aug. 1, 2013

(30) Foreign Application Priority Data
Nov. 18, 2010    (JP) ................. 2010-257485

(51) Int. Cl.
*G06F 17/50* (2006.01)
*G01C 21/34* (2006.01)
(Continued)

(52) U.S. Cl.
CPC ..... *G06F 17/5009* (2013.01); *G01C 21/3484* (2013.01); *G01C 21/3617* (2013.01);
(Continued)

(58) Field of Classification Search
None
See application file for complete search history.

(56) References Cited

U.S. PATENT DOCUMENTS

| 6,611,726 B1 * | 8/2003 | Crosswhite | G06F 17/18 700/100 |
| 7,202,816 B2 * | 4/2007 | Krumm | G01C 21/00 342/451 |

(Continued)

FOREIGN PATENT DOCUMENTS

| JP | 2006-134080 A | 5/2006 |
| JP | 2007-72592 A | 3/2007 |

(Continued)

OTHER PUBLICATIONS

M. Pelanis, S. Saltenis, C. Jensen, "Indexing The Past, Present, and Anticipated Future Positions of Moving Objects." ACM Transactions on Database Systems (TODS). Mar. 1, 2006;31(1):255-98.*

(Continued)

*Primary Examiner* — Aniss Chad
*Assistant Examiner* — David M Rogers
(74) *Attorney, Agent, or Firm* — Oblon, McClelland, Maier & Neustadt, L.L.P.

(57) ABSTRACT

The present invention relates to a data processing device, a data processing method, and a program which enable prediction to be performed even when there is a gap in the current location data to be obtained in real time. A learning main processor 23 represents movement history data serving as data for learning, as a probability model which represents a user's activity, and obtains a parameter thereof. A prediction main processor 33 uses the probability model obtained by learning to estimate a user's current location from movement history data to be obtained in real time. In the event that there is a data missing portion included in movement history data to be obtained in real time, the prediction main processor 33 generates the data missing portion thereof by interpolation processing, and estimates state nose series corresponding to the interpolated data for prediction. With estimation of state node series, an obser- (Continued)

vation probability less contribution of data than actual data is employed regarding interpolated data. The present invention may be applied to a data processing device configured to predict a destination from movement history data, for example.

6 Claims, 62 Drawing Sheets

(51) Int. Cl.
| | | |
|---|---|---|
| *G01C 21/36* | (2006.01) | |
| *G08G 1/01* | (2006.01) | |
| *G06F 17/18* | (2006.01) | |
| *G01S 5/00* | (2006.01) | |
| *G06N 99/00* | (2010.01) | |

(52) U.S. Cl.
CPC ............ *G01S 5/0009* (2013.01); *G06F 17/18* (2013.01); *G06F 17/50* (2013.01); *G06N 99/005* (2013.01); *G08G 1/0129* (2013.01)

(56) References Cited

U.S. PATENT DOCUMENTS

| 7,233,861 | B2* | 6/2007 | Van Buer | G01C 21/3617 340/994 |
|---|---|---|---|---|
| 7,274,332 | B1* | 9/2007 | Dupray | G01S 19/45 342/357.64 |
| 7,298,327 | B2* | 11/2007 | Dupray | G01S 1/026 342/451 |
| 7,512,487 | B1* | 3/2009 | Golding | G01C 21/3484 701/424 |
| 7,610,151 | B2* | 10/2009 | Letchner | G01C 21/3484 701/424 |
| 7,680,749 | B1* | 3/2010 | Golding | G01C 21/3484 706/14 |
| 7,706,964 | B2* | 4/2010 | Horvitz | G01C 21/3492 342/357.31 |
| 7,706,965 | B2* | 4/2010 | Downs | G08G 1/0104 701/117 |
| 7,764,231 | B1* | 7/2010 | Karr | G01S 1/026 342/450 |
| 7,996,345 | B2* | 8/2011 | Golding | G01C 21/3484 706/14 |
| 8,718,925 | B2* | 5/2014 | Letchner | G01C 21/3484 701/410 |
| 2001/0022558 | A1* | 9/2001 | Karr, Jr. | G01S 1/026 342/450 |
| 2007/0208495 | A1* | 9/2007 | Chapman | G08G 1/0104 701/117 |
| 2008/0004789 | A1* | 1/2008 | Horvitz | G01C 21/3492 701/117 |
| 2008/0071465 | A1* | 3/2008 | Chapman | G01C 21/3691 701/117 |
| 2008/0167049 | A1* | 7/2008 | Karr | G01S 1/026 455/456.2 |
| 2009/0006297 | A1* | 1/2009 | Horvitz | G06N 99/005 706/46 |
| 2009/0192705 | A1* | 7/2009 | Golding | G01C 21/3484 701/533 |
| 2009/0210276 | A1* | 8/2009 | Krumm | G06Q 10/025 705/7.33 |
| 2009/0271104 | A1* | 10/2009 | Letchner | G01C 21/3484 701/532 |
| 2010/0010733 | A1* | 1/2010 | Krumm | G01C 21/3484 701/533 |
| 2010/0174479 | A1* | 7/2010 | Golding | G01C 21/3484 706/14 |
| 2010/0228768 | A1* | 9/2010 | Yamasuge | G06F 17/30578 707/769 |

FOREIGN PATENT DOCUMENTS

| JP | 2008-204040 A | 9/2008 |
|---|---|---|
| JP | 2010-211425 A | 9/2010 |

OTHER PUBLICATIONS

R. Hariharan, K. Toyama "Project Lachesis: Parsing and Modeling Location Histories" M.J. Egenhofer, C. Freksa, and H.J. Miller (Eds.): GIScience 2004, LNCS 3234, pp. 106-124, 2004.*
J. Krumm, E. Horvitz, "Predestination: Inferring Destinations from Partial Trajectories" P.Dourish and A. Friday (Eds.): Ubicomp 2006, LNCS 4206, pp. 243-260, 2006.*
International Search Report issued Dec. 13, 2011, in PCT/JP2011/075541.
Brian Patrick Clarkson, "Life Patterns: structure from wearable sensors" Massachusetts Institute of Technology, 2002, Sep. 2002, 130 pages.
Daniel Ashbrook, et al., "Learning Significant Locations and Predicting User Movement with GPS", Proceedings of the 6th International Symposium on Wearable Computers (ISWC'02), 2002, 8 pages.
Tatsuya Ushigoe, et al., "Classification of user behavior using detection hysteresis of Bluetooth Device" Research Paper of Information Processing Society of Japan IPSJ SIG Technical Report, vol. 2009-UBI-22, No. 2, Jun. 2009, cover pages, pp. 1-8 with English translation.
Kazuya Murao, et al., "A Sensed Data Complementing Method Considering Breakdowns of Wearable Sensors for Wearable Computing Systems", DEWS2007, Jun. 1, 2007,9 pages (with English Abstract).

* cited by examiner

FIG. 56

| MOVEMENT HISTORY DATA (INCLUDING INTERPOLATED DATA) | | | VIRTUAL ERROR SERIES DATA | | |
|---|---|---|---|---|---|
| t | x | y | et | ex | ey |
| $t_1$ | $x_1$ | $y_1$ | 0 | 0 | 0 |
| $t_2$ | $x_2$ | $y_2$ | 0 | 0 | 0 |
| $t_3$ | $x_3$ | $y_3$ | 0 | 0 | 0 |
| ... | ... | ... | ... | ... | ... |
| virtual $t_6$ | virtual $x_6$ | virtual $y_6$ | 0 | $ex_6$ | $ey_6$ |
| virtual $t_7$ | virtual $x_7$ | virtual $y_7$ | 0 | $ex_7$ | $ey_7$ |
| virtual $t_8$ | virtual $x_8$ | virtual $y_8$ | 0 | $ex_8$ | $ey_8$ |
| ... | ... | ... | ... | ... | ... |
| $t_k$ | $x_k$ | $y_k$ | 0 | 0 | 0 |

GENERATED BY LINEAR INTERPOLATION

| virtual $t_{k+1}$ | virtual $x_k$ | virtual $y_k$ | 0 | $ex_{k+1}$ | $ey_{k+1}$ |
|---|---|---|---|---|---|
| ... | ... | ... | ... | ... | ... |
| virtual $t_T$ | virtual $x_k$ | virtual $y_k$ | 0 | $ex_T$ | $ey_T$ |

GENERATED BY HOLD INTERPOLATION

FIG. 63

(1) ROUTE $R_1$, PROBABILITY $P_1$, TIME $T_1$ | $r_1$ | $r_2$ | $r_3$ | $r_4$ | $g_1$ |

(2) ROUTE $R_2$, PROBABILITY $P_2$, TIME $T_2$ | $r_1$ | $r_2$ | $r_3$ | $r_5$ | $g_2$ |

(3) ROUTE $R_3$, PROBABILITY $P_3$, TIME $T_3$ | $r_1$ | $r_2$ | $r_6$ | $g_3$ |

(4) ROUTE $R_4$, PROBABILITY $P_4$, TIME $T_4$ | $r_1$ | $r_2$ | $r_7$ | $w_2$ |

(5) ROUTE $R_5$, PROBABILITY $P_5$, TIME $T_5$ | $r_1$ | $r_8$ | $w_1$ |

(6) ROUTE $R_6$, PROBABILITY $P_6$, TIME $T_6$ | $r_1$ | $r_8$ | $w_1$ | $r_8$ | $r_9$ | $g_3$ |

(7) ROUTE $R_7$, PROBABILITY $P_7$, TIME $T_7$ | $r_1$ | $r_{10}$ | $r_{11}$ | $g_2$ |

DESTINATIONS: [$g_1$, $g_2$, $g_3$]
ARRIVAL PROBABILITIES: [$P_1$, $P_2+P_7$, $P_3+P_6$]
REPRESENTATIVE ROUTES: [$R_1$, $R_2$, $R_3$, $R_6$]
ARRIVAL TIME: [$T_1$, $T_2$, $T_3$, $T_6$]

ROUTE POINTS: [$w_1$, $w_2$]
ARRIVAL PROBABILITIES: [$P_5$, $P_4$]
REPRESENTATIVE ROUTES: [$R_5$, $R_4$]
ARRIVAL TIME: [$T_5$, $T_4$]

DATA PROCESSING DEVICE THAT CALCULATES AN ARRIVAL PROBABILITY FOR A DESTINATION USING A USER'S MOVEMENT HISTORY INCLUDING A MISSING PORTION

TECHNICAL FIELD

The present invention relates to a data processing device, a data processing method, and a program, and specifically relates to a data processing device, a data processing method, and a program, which enable prediction to be performed even when there is a gap in the data of the current location obtained in real time.

BACKGROUND ART

In recent years, study has been actively undertaken wherein a user's state is modeled and learned using time series data obtained from a wearable sensor which is a sensor to be wearable by a user, and the user's current state is recognized using a model obtained by learning (see PTLs 1 and 2, and NPL 1).

The present applicant has previously proposed a method for stochastically predicting multiple probabilities of a user's activity state in predetermined point-in-time in the future as Japanese Patent Application No. 2009-180780 (hereinafter, referred to as prior application 1). With the method according to the prior application 1, a user's activity state is learned from time series data as a probabilistic state transition model, and the current activity state is recognized using the learned probabilistic state transition model, and accordingly, a user's activity state "after predetermined time" may probabilistically predict. With the prior application 1, an example is illustrated as an example of prediction of a user's activity state "after predetermined time" wherein a user's current position is recognized using a probabilistic state transition model in which the user's movement history time series data (movement history data) has been learned to predict the user's destination (place) after predetermined time.

Further, the present applicant has developed on the prior application 1 and proposed a method for predicting arrival probability, route, and time for multiple destinations even in the event that there is no specification of elapse time from the current point-in-time serving as "after predetermined time", as Japanese Patent Application No. 2009-208064 (hereinafter, referred to as the prior application 2). With the method according to the prior application 2, an attribute of "moving state" or "stay state" is added to a state node making up a probabilistic state transition model. A destination candidate may automatically be detected by finding a state node in "stay state" as a state node for the destination, out of state nodes making up the probabilistic state transition model.

The present applicant has enabled the learning model (probabilistic state transition model) according to the prior application 2 to be developed when movement history data of a new movement route is added as Japanese Patent Application No. 2010-141946 (hereinafter, referred to as the prior application 3), thereby enabling effective learning.

CITATION LIST

Patent Literature

PTL 1: Japanese Unexamined Patent Application Publication No. 2006-134080

PTL 2: Japanese Unexamined Patent Application Publication No. 2008-204040

Non Patent Literature

NPL 1: "Life Patterns: structure from wearable sensors", Brian Patrick Clarkson, Doctor Thesis, MIT, 2002

SUMMARY OF INVENTION

Technical Problem

However, with the method according to the prior application 3, based on the current movement history data to be obtained in real time, a destination is predicted after estimating the current value (current state), but in the event that the data of the current location cannot be obtained, the current state cannot be estimated, and prediction of a destination also cannot be performed.

The present invention has been made in the light of such a situation, and enables prediction to be performed even when there is a gap in the data of the current location to be obtained in real time.

Solution to Problem

A data processing device according to an aspect of the present invention includes:

learning means configured to obtain a parameter of a probability model when a user's movement history data to be obtained as data for learning represented as a probability model that represents the user's activity;

destination and route point estimating means configured to estimate, of state nodes of the probability model using the parameter obtained by the learning means, a destination node and a route point node equivalent to a movement destination and a route point;

prediction data generating means configured to obtain the user's movement history data within a predetermined period of time from the present which differs from the data for learning, as data for prediction, and in the event that there is a data missing portion included in the obtained data for prediction, to generate the data missing portion thereof by interpolation processing, and to calculate virtual error with actual data corresponding to interpolated data generated by the interpolation processing;

current point estimating means configured to input the data for prediction of which the data missing portion has been interpolated to the probability model using the parameter obtained by learning, and with estimation of state node series corresponding to the data for prediction of which the data missing portion has been interpolated, to estimate a current point node equivalent to the user's current location by using the virtual error as an observation probability of the state nodes regarding the interpolated data, and using an observation probability with less contribution of data than actual data;

search means configured to search a route from the user's current location to a destination using information regarding the estimated destination node and route point node and the current point node, and the probability model obtained by learning; and calculating means configured to calculate an arrival probability and time required for the searched destination.

A data processing method according to an aspect of the present invention includes the steps of:

obtaining, with learning means of a data processing device configured to process a user's movement history data, a parameter of a probability model when a user's movement history data to be obtained as data for learning is represented as a probability model that represents the user's activity;

estimating, with destination and route point estimating means of the data processing device, of state nodes of the probability model using the parameter obtained by the learning means, a destination node and a route point node equivalent to a movement destination and a route point;

obtaining, with prediction data generating means of the data processing device, the user's movement history data within a predetermined period of time from the present which differs from the data for learning, as data for prediction, and in the event that there is a data missing portion included in the obtained data for prediction, generating the data missing portion thereof by interpolation processing, and calculating virtual error with actual data corresponding to interpolated data generated by the interpolation processing;

inputting, with current point estimating means of the data processing device, the data for prediction of which the data missing portion has been interpolated to the probability model using the parameter obtained by learning, and with estimation of state node series corresponding to the data for prediction of which the data missing portion has been interpolated, estimating a current point node equivalent to the user's current location by using the virtual error as an observation probability of the state nodes regarding the interpolated data, and using an observation probability with less contribution of data than actual data;

searching, with search means of the data processing device, a route from the user's current location to a destination using information regarding the estimated destination node and route point node and the current point node, and the probability model obtained by learning; and calculating, with calculating means of the data processing device, an arrival probability and time required for the searched destination.

A program according to an aspect of the present invention causing a computer to serve as:

learning means configured to obtain a parameter of a probability model when a user's movement history data to be obtained as data for learning is represented as a probability model that represents the user's activity;

destination and route point estimating means configured to estimate, of state nodes of the probability model using the parameter obtained by the learning means, a destination node and a route point node equivalent to a movement destination and a route point;

prediction data generating means configured to obtain the user's movement history data within a predetermined period of time from the present which differs from the data for learning, as data for prediction, and in the event that there is a data missing portion included in the obtained data for prediction, to generate the data missing portion thereof by interpolation processing, and to calculate virtual error with actual data corresponding to interpolated data generated by the interpolation processing;

current point estimating means configured to input the data for prediction of which the data missing portion has been interpolated to the probability model using the parameter obtained by learning, and with estimation of state node series corresponding to the data for prediction of which the data missing portion has been interpolated, to estimate a current point node equivalent to the user's current location by using the virtual error as an observation probability of the state nodes regarding the interpolated data, and using an observation probability with less contribution of data than actual data;

search means configured to search a route from the user's current location to a destination using information regarding the estimated destination node and route point node and the current point node, and the probability model obtained by learning; and calculating means configured to calculate an arrival probability and time required for the searched destination.

With an aspect of the present invention, a parameter of a probability model when a user's movement history data to be obtained as data for learning is represented as a probability model that represents the user's activity is obtained, and of state nodes of the probability model using the parameter obtained by the learning means, a destination node and a route point node equivalent to a movement destination and a route point are estimated. The user's movement history data within a predetermined period of time from the present which differs from the data for learning is obtained as data for prediction, and in the event that there is a data missing portion included in the obtained data for prediction, the data missing portion thereof is generated by interpolation processing, and virtual error with actual data corresponding to the generated interpolated data us calculated. The data for prediction of which the data missing portion has been interpolated is input to the probability model using the parameter obtained by learning, and with estimation of state node series corresponding to the data for prediction of which the data missing portion has been interpolated, a current point node equivalent to the user's current location is estimated by using the virtual error as an observation probability of the state nodes regarding the interpolated data, and using an observation probability with less contribution of data than actual data. A route from the user's current location to a destination is searched using information regarding the estimated destination node and route point node and the current point node, and the probability model obtained by learning, and an arrival probability and time required for the searched destination are calculated.

Advantageous Effects of Invention

According to an aspect of the present invention, prediction can be made even when there is a gap in the data of the current location to be obtained in real time.

BRIEF DESCRIPTION OF DRAWINGS

FIG. 56 is a diagram indicating movement history data after interpolation processing and virtual error series data.

FIG. 63 is a diagram illustrating a search result list in the tree search processing.

DESCRIPTION OF EMBODIMENTS

Configuration Example of Prediction System

Figure 1:
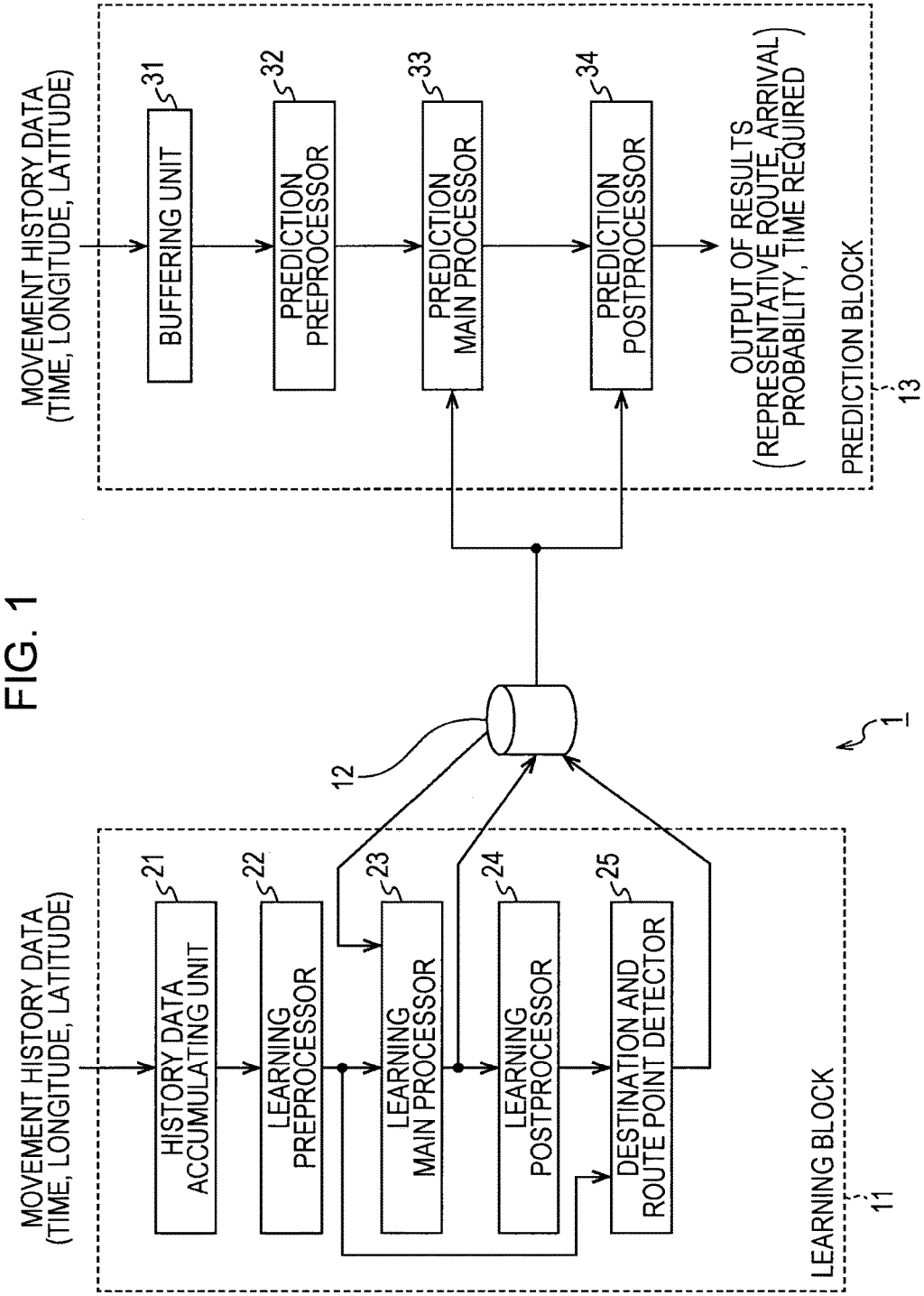
FIG. 1 is a block diagram illustrating a configuration example of an embodiment of a prediction system to which the present invention has been applied.

FIG. 1 illustrates a configuration example of an embodiment of a prediction system to which the present invention has been applied.

A prediction system 1 in FIG. 1 is configured of a learning block 11, a model-parameter-by-user storage unit 12, and a prediction block 13.

There is supplied to the learning block 11 time series data that indicates the position (latitude and longitude) of a user at predetermined point-in-time to be obtained at a sensor device (not illustrated) such as a GPS (Global Positioning System) sensor or the like for a predetermined period of time. Specifically, time series data that indicates the user's moving route (hereinafter, referred to as movement history data) made up of three dimensions of data in a position (latitude and longitude) sequentially obtained with at certain time intervals (e.g., 15-second intervals), and point-in-time at that time is supplied to the learning block 11. Note that one set of latitude, longitude, and point-in-time that make up the time series data will also be referred to as three-dimensional data as appropriate.

The learning block 11 performs learning processing wherein the user's activity model (state model that represents the user's behavior and activity patterns) is learned as a probabilistic state transition model using the user's movement history data.

There may be employed, as the probabilistic state transition model used for learning, a probability model including a hidden state such as an Ergodic HMM (Hidden Markov Model) or the like, for example. With the prediction system 1, the Ergodic HMM to which sparse constraints have been applied will be employed as a probabilistic state transition model. Note that the Ergodic HMM to which sparse constraints have been applied, a method for calculating parameters of the Ergodic HMM, and so forth will be described later with reference to FIG. 4 to FIG. 6.

The model-parameter-by-user storage unit 12 stores parameters that represent the user's activity model obtained by learning of the learning block 11.

The prediction block 13 obtains the parameters of the user's activity model obtained by learning of the learning block 11 from the model-parameter-by-user storage unit 12. The prediction block 13 estimates the user's current location using the user's activity model using a user activity model according to the parameters obtained by learning, and further predicts a movement destination from the current location. Further, the prediction block 13 also calculates an arrival probability, a route, and arrival time (time required) up to the predicted destination. Note that the number of destinations is not restricted to one, and multiple destinations can be predicted.

Details of the learning block 11 and prediction block 13 will be described.

The learning block 11 is configured of a history data accumulating unit 21, a learning preprocessor 22, a learning main processor 23, a learning postprocessor 24, and a destination and route point detector 25.

The history data accumulating unit 21 accumulates (stores) the user's movement history data to be supplied from the sensor device as data for learning. The history data accumulating unit 21 supplies the movement history data to the learning preprocessor 22 according to need.

The learning preprocessor 22 solves a problem to be caused from the sensor device. Specifically, the learning preprocessor 22 interpolates the movement history data by organizing the movement history data, and also performing interpolation processing or the like on a temporarily data missing. Also, the learning preprocessor 22 adds one movement attribute of "stay state" in which the user stays (stops) in the same place, or "moving state" in which the user is moving to each three-dimensional data that makes up the movement history data. The movement history data after adding of the movement attribute is supplied to the learning main processor 23 and destination and route point detector 25.

The learning main processor 23 models the user's movement history as the user's activity model. Specifically, the learning main processor 23 obtains parameters at the time of modeling the user's movement history to the user's activity model. The parameters of the user's activity model obtained by learning are supplied to the learning postprocessor 24 and model-parameter-by-user storage unit 12.

Also, after learning the user's movement history as the user's activity model, in the event that movement history data serving as new data for learning has been supplied, the learning main processor 23 obtains and updates the parameters of the current user's activity model from the model-parameter-by-user storage unit 12.

Specifically, first, the learning main processor 23 determines whether the movement history data serving as new data for learning is movement history data in a known route or movement history data in an unknown route. In the event that determination is made that the new data for learning is movement history data in a known route, the learning main processor 23 update the parameters of an existing user's activity model (hereinafter, simply referred to as existing model). On the other hand, in the event that the new data for learning is movement history data in an unknown route, the learning main processor 23 obtains the parameters of the user's activity model serving as a new model corresponding to the movement history data in an unknown route. The learning main processor 23 then synthesizes the parameters of the existing model and the parameters of the new model, thereby generating an updated model obtained by connecting the existing model and new model.

Now, hereinafter, the user's activity model updated by the movement history data of a known route will be referred to as parameter updated model. On the other hand, the user's activity model of which the parameters have been updated by the movement history data of an unknown route will be referred to as topology updated model since the topology has also been updated according to expansion of the unknown route. Also, hereinafter, the movement history data in a known route and the movement history data in an unknown route will also simply be referred to as known movement history data and unknown movement history data.

The parameters of a parameter updated model or topology updated model are supplied to the learning postprocessor 24 and model-parameter-by-user storage unit 12, and on the subsequent stage, processing will be performed using the user's activity model after updating.

The learning postprocessor 24 converts each three-dimensional data that makes up the movement history data into a state node of the user's activity model using the user's activity model obtained by learning of the learning main processor 23. Specifically, the learning postprocessor 24 generates times series data of a state node (node series data) of the user's activity model corresponding to the movement history data. The learning postprocessor 24 supplies the node series data after conversion to the destination and route point detector 25.

The destination and route point detector 25 correlates the movement history data after adding of the movement attribute supplied from the learning preprocessor 22 with the node series data supplied from the learning postprocessor 24. Specifically, the destination and route point detector 25 allocates a state node of the user's activity model to each three-dimensional data that makes up the movement history data.

The destination and route point detector 25 adds the attribute of a destination or route point to the state node corresponding to the three-dimensional data of which the movement attribute is "stay state" of the state nodes of the node series data. Thus, (the state node corresponding to) a predetermined place within the user's movement history is allocated to the destination or route point. Information regarding the attribute of the destination or route point added to the state node by the destination and route point detector 25 is supplied to the model-parameter-by-user storage unit 12 and stored therein.

The prediction block 13 is configured of a buffering unit 31, a prediction preprocessor 32, a prediction main processor 33, and a prediction postprocessor 34.

The buffering unit 31 buffers (stores) movement history data to be obtained in real time for prediction processing. Note that as for movement history data for the prediction processing, data of which the period is shorter than that of movement history data at the time of learning processing, e.g., movement history data of around 100 steps is sufficient. The buffering unit 31 constantly stores the latest movement history data for an amount equivalent to a predetermined period, and deletes the oldest data of stored data when new data is obtained.

The prediction preprocessor 32 solves, in the same way as with the learning preprocessor 22, a problem to be caused from the sensor device. Specifically, the prediction preprocessor 32 interpolates the movement history data by organizing the movement history data, and also performing interpolation processing or the like on a temporarily data missing.

Parameters that represent the user's activity model obtained by learning of the learning block 11 are supplied to the prediction main processor 33 from the model-parameter-by-user storage unit 12.

The prediction main processor 33 estimates a state node corresponding to the user's current location (current point node) using the movement history data supplied from the prediction preprocessor 32 and the user's activity model obtained by learning of the learning block 11. As for estimation of a state node, the Viterbi maximum likelihood estimation or soft decision Viterbi estimation may be employed.

Further, the prediction main processor 33 calculates node series up to the state node of the destination (destination node) and an occurrence probability thereof in a tree structure made up of multiple estimated state nodes that may be changed from the current point node. Note that the node of a route point may be included in the node series (route) to the state node of the destination, and accordingly, the prediction main processor 33 also predicts a route point at the same time as with the destination.

The prediction postprocessor 34 obtains a sum, of selection probabilities (occurrence probabilities) of multiple routes to the same destination as an arrival probability to the destination. Also, the prediction postprocessor 34 selects one or more routes serving as representatives of routes to the destination (hereinafter, referred to as representative routes), and calculates time required of the representative routes. The prediction postprocessor 34 then outputs the predicted representative routes, arrival probabilities, and time required to the destination as prediction results. Note that frequency instead of the occurrence probability of a route, and arrival frequency instead of the arrival probability to the destination can be output as prediction results.

[Hardware Configuration Example of Prediction System]

Figure 2:
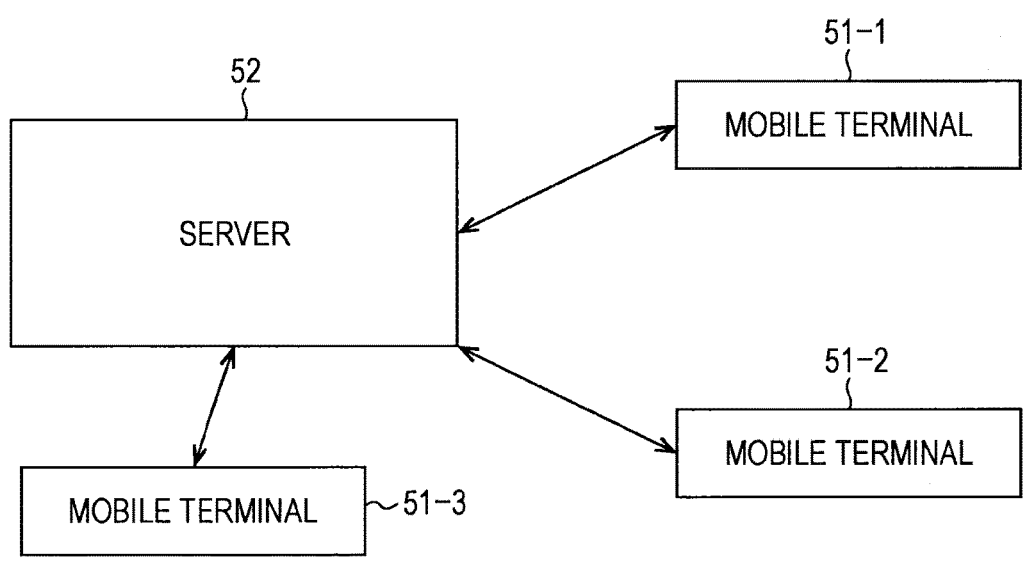
FIG. 2 is a block diagram illustrating a hardware configuration example of the prediction system.

The prediction system 1 configured as described above may employ a hardware configuration illustrated in FIG. 2, for example. Specifically, FIG. 2 is a block diagram illustrating a hardware configuration example of the prediction system 1.

In FIG. 2, the prediction system 1 is configured of three mobile terminals 51-1 to 51-3 and a server 52. Though the mobile terminals 51-1 to 51-3 are the same type mobile terminal 51 having the same function, with the mobile terminals 51-1 to 51-3, users who own these differ. Accordingly, in FIG. 2, only the three mobile terminals 51-1 to 51-3 are illustrated, but actually, there are mobile terminals 51 of which the number corresponds the number of users.

The mobile terminals 51 may perform exchange of data with the server 52 by communication via a network such as wireless communication, the Internet, or the like. The server 52 receives data transmitted from the mobile terminals 51, and performs predetermined processing on the received data. The server 52 then transmits processing results of data processing to the mobile terminals 51 by wireless communication or the like.

Accordingly, the mobile terminals 51 and server 52 have at least a communication unit by radio or by cable.

Further, an arrangement may be employed wherein the mobile terminals 51 include the prediction block 13 in FIG. 1, and the server 52 includes the learning block 11 and model-parameter-by-user storage unit 12 in FIG. 1.

In the event of this arrangement being employed, for example, with learning processing, movement history data obtained by the sensor devices of the mobile terminals 51 is transmitted to the server 52. The server 52 learns, based on the received movement history data for learning, a user's activity model, and stores this. With prediction processing, the mobile terminals 51 then obtain the parameters of the user's activity model obtained by learning, estimates the user's current point node from movement history data to be obtained in real time, and further calculates the destination node, and an arrival probability, representative routes, and time required thereto. The mobile terminals 51 then display the prediction results on a display unit such as a liquid crystal display or the like which is not illustrated.

Division of roles between the mobile terminals 51 and server 52 may be determined according to processing capabilities and a communication environment serving as each of the data processing devices as appropriate.

With the learning processing, time per once required for the processing is very long, but the processing does not frequently have to be processed so much. Accordingly, in general, the processing capability of the server 52 is higher than those of the portable mobile terminals 51, and accordingly, the server 52 may perform the learning processing (updating of the parameters) based on movement history data accumulated around once at a day.

On the other hand, with the prediction processing, it is desirable to rapidly perform the processing and to display the processing results in response to movement history data to be updated from hour to hour in real time, and accordingly, it is desirable to perform the prediction processing at the mobile terminals 51. If the communication environment is rich, it is desirable for the server 52 to also perform the prediction processing and to receive the prediction results alone from the server 52, which reduces load of the mobile terminals 51 of which the portability and reduction in size are requested.

Also, in the event that the mobile terminals 51 alone may perform the learning processing and prediction processing at high speed as data processing devices, it goes without saying that the mobile terminals 51 may include all of the configurations of the prediction system 1 in FIG. 1.

[Example of Movement History Data to be Input]

Figure 3:
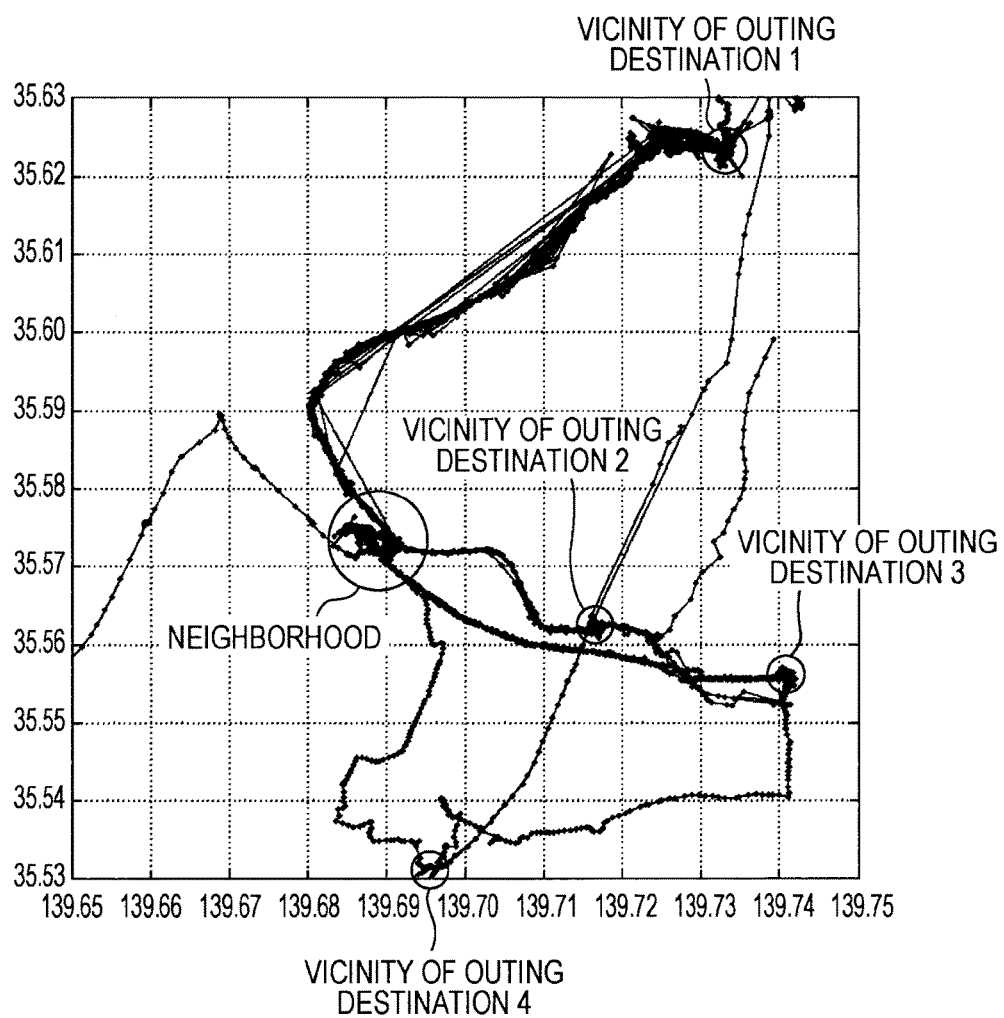
FIG. 3 is a diagram illustrating an example of movement history data.

FIG. 3 illustrates an example of movement history data obtained at the prediction system 1. In FIG. 3, the horizontal axis represents longitude, and the vertical axis represents latitude.

The movement history data illustrated in FIG. 3 indicates movement history data accumulated for a period of around one month and a half of an experimenter. As illustrated in FIG. 3, the movement history data is data wherein the user has principally moved the neighborhood and four outing destinations such as a place of work and so forth. Note that this movement history data also includes data of which the position has skipped due to failure to catch a satellite.

[Ergodic HMM]

Next, description will be made regarding the Ergodic HMM to be employed by the prediction system 1 as a learning model.

Figure 4:
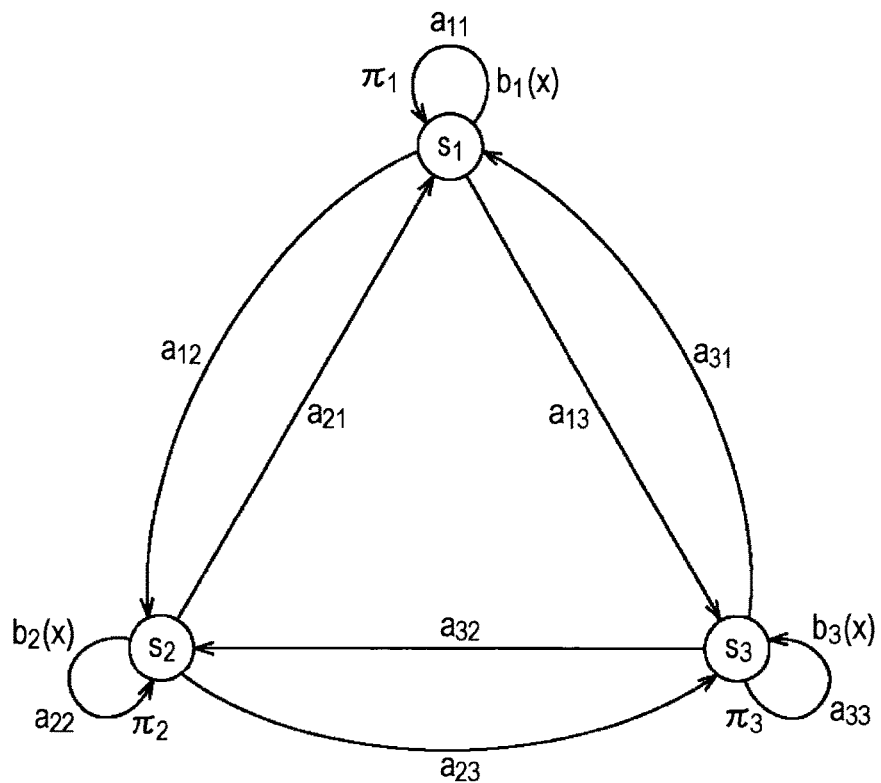
FIG. 4 is a diagram illustrating an example of an HMM.

FIG. 4 illustrates an example of an HMM.

The HMM is a state transition model including state nodes and a transition between state nodes.

FIG. 4 illustrates an example of an HMM with three states.

In FIG. 4 (this is the same in the following diagrams), circle marks represent state nodes, and arrows represent transition of a state node. Note that, hereinafter, state nodes will also simply be referred to as nodes or states.

Also, in FIG. 4, $s_i$ (i=1, 2, 3 in FIG. 4) represents a state, and $a_{ij}$ represents a state transition probability from a state $s_i$ to a state $s_j$. Further, $b_j(x)$ represents an output probability density function wherein an observed value x is observed at the time of state transition to the state $s_j$, and $\pi_i$ represents an initial probability that the state $s_i$ is an initial state.

Note that as for the output probability density function $b_j(x)$, a normal probability distribution or the like is employed, for example.

Here, the HMM (continuous HMM) is defined with the state transition probability $a_{ij}$, output probability density function $b_j(x)$, and initial probability $\pi_i$. These state transition probability $a_{ij}$, output probability density function $b_j(x)$, and initial probability $\pi_i$ will be referred to as parameter $\lambda = \{a_{ij}, b_j(x), \pi_i, i=1, 2, \ldots, M, j=1, 2, \ldots, M\}$ of the HMM. M represents the number of states of the HMM.

As for a method for estimating the parameter $\lambda$ of the HMM, the Baum-Welch's maximum likelihood estimating method has widely been employed. The Baum-Welch maximum likelihood estimating method is a method for estimating a parameter based on the EM algorithm (EM (Expectation-Maximization) algorithm).

According to the Baum-Welch's maximum likelihood estimating method, based on time series data $x=x_1, x_2, \ldots, x_T$ to be observed, estimation of the parameter $\lambda$ of the HMM is performed so as to maximize likelihood to be obtained from an occurrence probability which is a probability that the time series data thereof will be observed (will occur). Here, $x_t$ represents a signal (sample value) to be observed at point-in-time t, and T represents the length (the number of samples) of the time series data.

The Baum-Welch's maximum likelihood estimating method is described in, for example, "Pattern Recognition and Machine Learning (Volume 2), by C. M. Bishop, P. 333 (Original English Edition: "Pattern Recognition and Machine Learning (Information Science and Statistics)", Christopher M. BishopSpringer, New York, 2006) (hereinafter, referred to as document A).

The Baum-Welch's maximum likelihood estimating method is a parameter estimating method based on likelihood maximization, but does not guarantee optimality, and may converge a local solution (local minimum) depending on the configuration of the HMM and the initial value of the parameter $\lambda$.

The HMM has widely be employed for audio recognition, but with the HMM employed for audio recognition, in general, the number of states, how to perform state transition, and so forth are determined beforehand.

Figure 5:
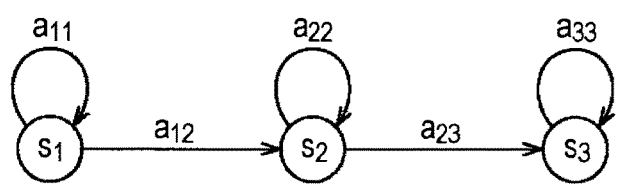
FIG. 5 is a diagram illustrating an example of a Left-to-right type HMM.

FIG. 5 illustrates an example of the HMM to be used for audio recognition.

The HMM in FIG. 5 is referred to as Left-to-right type.

In FIG. 5, the number of states is three, state transition is restricted to a configuration which allows only self transition (state transition from the state $s_i$ to the state $s_i$), and state transition from the left to right adjacent state.

As against the HMM with restrictions for state transition as with the HMM in FIG. 5, the HMM without restriction for state transition illustrated in FIG. 4, i.e., the HMM wherein state transition from an optional state $s_i$ to an optional state $s_j$ may be made is referred to as Ergodic (Ergodic) HMM.

The Ergodic HMM is an HMM with the highest flexibility as a configuration, but if the number of states increases, it becomes difficult to perform estimation of the parameter $\lambda$.

For example, in the event that the number of states of the Ergodic HMM is 1000, the number of state transitions becomes one million (=1000×1000).

Accordingly, in this case, of the parameter $\lambda$, one million state transition probabilities $a_{ij}$ have to be estimated regarding the state transition probability $a_{ij}$.

Therefore, a constraint to have a sparse (Sparse) configuration (sparse constraint) may be applied to state transition to be set to a state, for example.

The sparse configuration mentioned here is a configuration wherein states to be changed from a certain state are very restricted instead of density state transition as with the Ergodic HMM wherein state transition may be made from an optional state to an optional state. Now, let us say that even with the sparse configuration, there is at least one state transition to another state, and also there is self transition.

Figure 6:
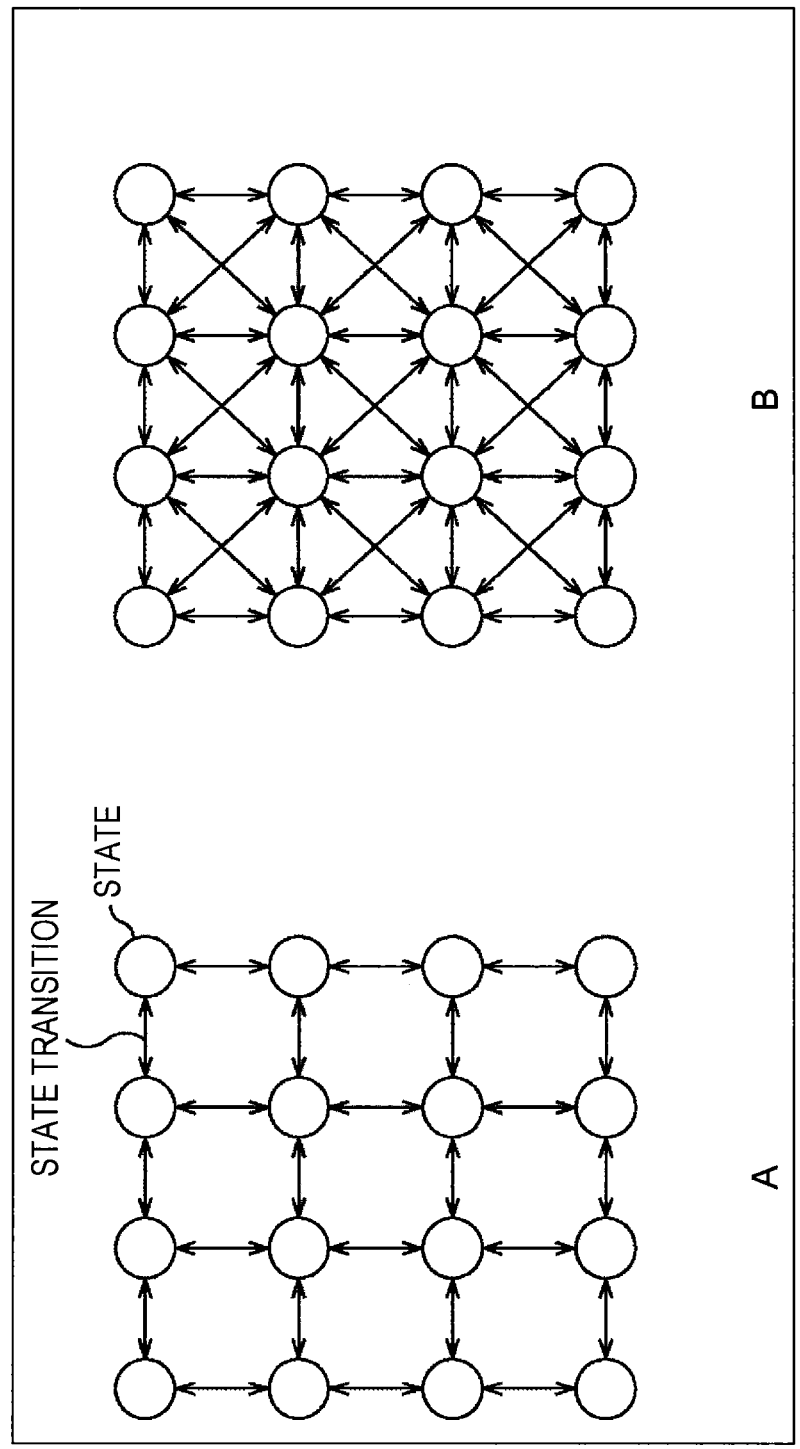
FIG. 6 is a diagram illustrating an example of an HMM to which sparse constraints have been applied.

FIG. 6 illustrates an HMM to which the sparse constraint has been applied.

Here, in FIG. 6, bidirectional arrows which connect two states represent state transition from one to the other of the two states, and state transition from the other to one. Also, in FIG. 6, each state may perform self transition, and drawing of arrows that represent self transition thereof are omitted.

In FIG. 6, 16 states are disposed in a grid manner on two-dimensional space. Specifically, in FIG. 6, four states are disposed in the horizontal direction, and four states are also disposed in the vertical direction.

If we say that both of distance between adjacent states in the horizontal direction, and distance between adjacent states in the vertical direction are 1, A in FIG. 6 illustrates an HMM to which sparse constraint has been applied wherein state transition to a state of which the distance is equal to or less than 1 can be made, and state transition to another state cannot be made.

Also, B in FIG. 6 illustrates an HMM to which sparse constraint has been applied wherein state transition to a state of which the distance is equal to or less than $\sqrt{2}$ can made, and state transition to another state cannot be made.

With the example in FIG. 1, the movement history data x=$x_1, x_2, \ldots, x_T$ is supplied to the prediction system 1, and the learning block 11 estimates the parameter λ of an HMM that represents the user's activity model, using the movement history data x=$x_1, x_2, \ldots, x_T$.

Specifically, let us consider that data of the position (latitude and longitude) at each point-in-time that represents the user's movement trace is observed data of a probability variable normally distributed from one point on a map corresponding to any of the states $s_i$ of the HMM with spread of a predetermined distributed value. The learning block 11 optimizes the one point on a map corresponding to the states $s_i$ (center value $\mu_i$), a distributed value $\sigma_i^2$ thereof, and state transition probability $a_{ij}$.

Note that the initial probability $\pi_i$ of the state $s_i$ may be set to an even value. For example, the initial probability $\pi_i$ of each of the M states $s_i$ is set to 1/M.

The prediction main processor 33 applies the Viterbi algorithm to the user's activity model (HMM) obtained by learning to obtain state transition process (state series) (path) (hereinafter, also referred to as maximum likelihood path) to maximize likelihood that the movement history data x=$x_1, x_2, \ldots, x_T$ will be observed. Thus, the state $s_i$ corresponding to the user's current location is recognized.

The Viterbi algorithm mentioned here is an algorithm to determine, of the state transition paths with each state $s_i$ as a starting point, a path (maximum likelihood path) to maximize values (occurrence probability) by accumulating the state transition probability $a_{ij}$ that state transition will be made from the state $s_i$ to the state $s_j$ at point-in-time t, and with the state transition thereof, a probability that the sample value $x_t$ at the point-in-time t will be observed of the movement history data x=$x_1, x_2, \ldots, x_T$ (output probability to be obtained from the output probability density function $b_j(x)$), over the length T of the time series data x after the processing. Details of the Viterbi algorithm are described in P347 of the above-mentioned document A.

[Configuration Example of Learning Preprocessor 22]

Figure 7:
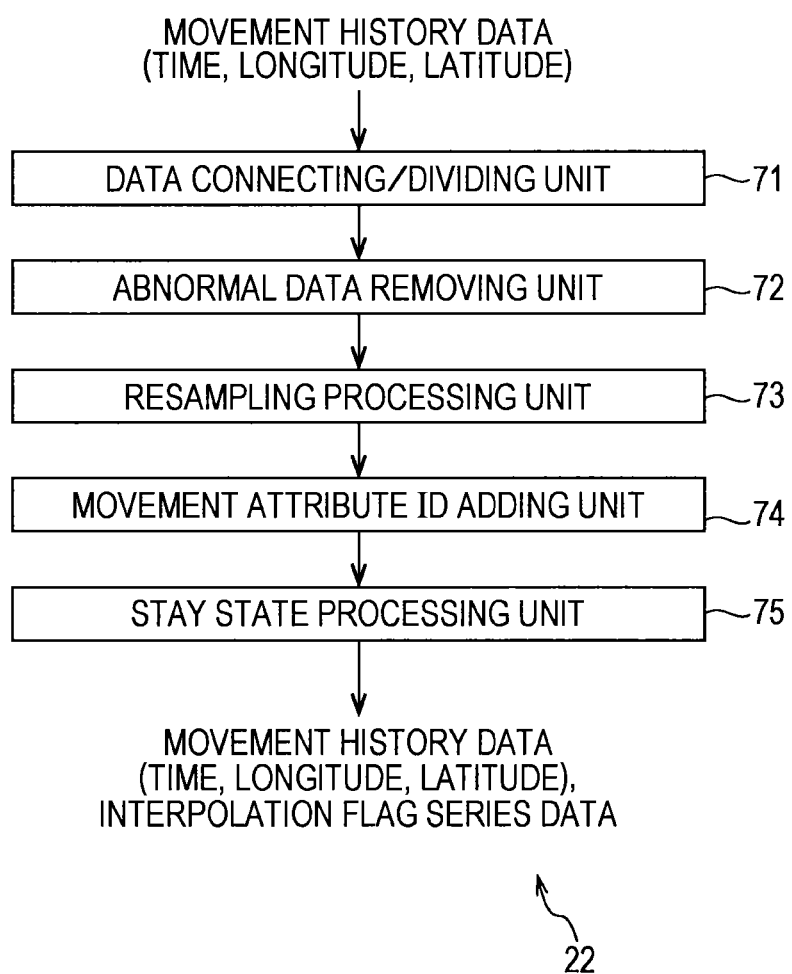
FIG. 7 is a block diagram illustrating a detailed configuration example of a learning preprocessor.

FIG. 7 is a block diagram illustrating a detailed configuration example of the learning preprocessor 22 of the learning block 11.

The learning preprocessor 22 is configured of a data connecting/dividing unit 71, an abnormal data removing unit 72, a resampling processing unit 73, a movement attribute identification adding unit 74, and a stay-state processing unit 75.

The data connecting/dividing unit 71 performs connection and dividing processing of movement history data. Movement history data is supplied from the sensor device to the data connecting/dividing unit 71 as a log file in predetermined increments such as increments of days or the like. Accordingly, movement history data which originally should have continued can be obtained by being divided since the date was straddled in the middle of movement for a certain destination. The data connecting/dividing unit 71 connects such divided movement history data. Specifically, in the event that time difference between the final three-dimensional (latitude, longitude, point-in-time) data within one log file, and the first three-dimensional data of a log file created after that log file is within predetermined time, the data connecting/dividing unit 71 connects the movement history data within these files.

Also, for example, the GPS sensor cannot catch a satellite in a tunnel or a basement, and accordingly, acquisition intervals of movement history data may be long. In the event that movement history data has a gap for a long period of time, it is difficult to estimate where the user was. Therefore, in the event that, with the obtained movement history data, acquisition time intervals before and after this data is equal to or longer than a predetermined time interval (hereinafter, referred to as missing threshold time), the data connecting/dividing unit 71 divides the movement history data before and after the interval thereof. The missing threshold time mentioned here is five minutes, ten minutes, one hour, or the like, for example.

The abnormal data removing unit 72 performs processing for removing explicit abnormal data of movement history data. For example, in the event that data in a position at certain point-in-time has leaped to 100 m or more away from a position before and after thereof, the data in the position thereof is abnormal. Therefore, in the event that data in a position at certain point-in-time is away by an amount equal to or longer than a predetermined distance from both positions before and after thereof, the abnormal data removing unit 72 removes the three-dimensional data thereof from the movement history data.

The resampling processing unit 73 resamples movement history data at a certain time interval adapted to processing units on the subsequent stage (such as learning main processor 23 and so forth). Note that, in the event that the obtained time interval agrees with a desired time interval, this processing is omitted.

Also, in the event that the obtained time interval is equal to or longer than the missing threshold time, the movement history data is divided by the data connecting/dividing unit 71, but a gap of the data shorter than the missing threshold time remains. Therefore, the resampling processing unit 73 generates (embeds) the missing data shorter than the missing threshold time by linear interpolation with a time interval after resampling.

For example, if we say that three-dimensional data at point-in-time $T_1$ immediately before data missing is $x^{real}_{T_1}$, and three-dimensional data at the first point-in-time $T_2$ when data acquisition was restored is $x^{real}_{T_2}$, three-dimensional data $x^{virtual}_t$ at point-in-time t within data missing from the point-in-time $T_1$ to the point-in-time $T_2$ can be calculated as the following Expression (1).

$$x^{virtual}_t = \frac{(T_2 - t)x^{real}_{T_1} + (t - T_1)x^{real}_{T_2}}{T_2 - T_1} \quad (1)$$

Also, the resampling processing unit 73 also generates interpolation flag series data made up of time series data of an interpolation flag (interpolation information) that indicates whether each three-dimensional data that makes up movement history data is interpolated data generated by the linear interpolation.

The movement attribute identification adding unit 74 identifies a movement attribute that indicates whether each three-dimensional data of a movement history is in "stay state" in which the user stays (stops) in the same place or "moving state" where the user is moving, and adds this. Thus, there is generated movement history data with a movement attribute wherein the movement attribute is added to each three-dimensional data of movement history data.

The stay-state processing unit 75 processes three-dimensional data of which the movement attribute is "stay state" based on the movement history data with a movement attribute supplied from the movement attribute identification adding unit 74. More specifically, in the event that the movement attribute of "stay state" is continued equal to or longer than a predetermined time (hereinafter, referred to as stay threshold time), the stay-state processing unit 75 divides the movement history data before and after thereof. Also, in the event that the movement attribute of "stay state" is continued shorter than the stay threshold time, the stay-state processing unit 75 holds data in positions of multiple three-dimensional data in "stay state" that continues for a predetermined period of time with the stay threshold time thereof (corrects to the data in the same position). Thus, multiple "stay state" nodes can be prevented from being assigned to movement history data in the same destination or route point. In other words, the same destination or route point can be prevented from being expressed with multiple nodes.

The movement history data divided into predetermined length and interpolation flag series data corresponding thereto are supplied from the learning preprocessor 22 thus configured to the learning main processor 23 and destination and route point detector 25 on the subsequent stages.

[Processing of Learning Preprocessor 22]

Figure 8:
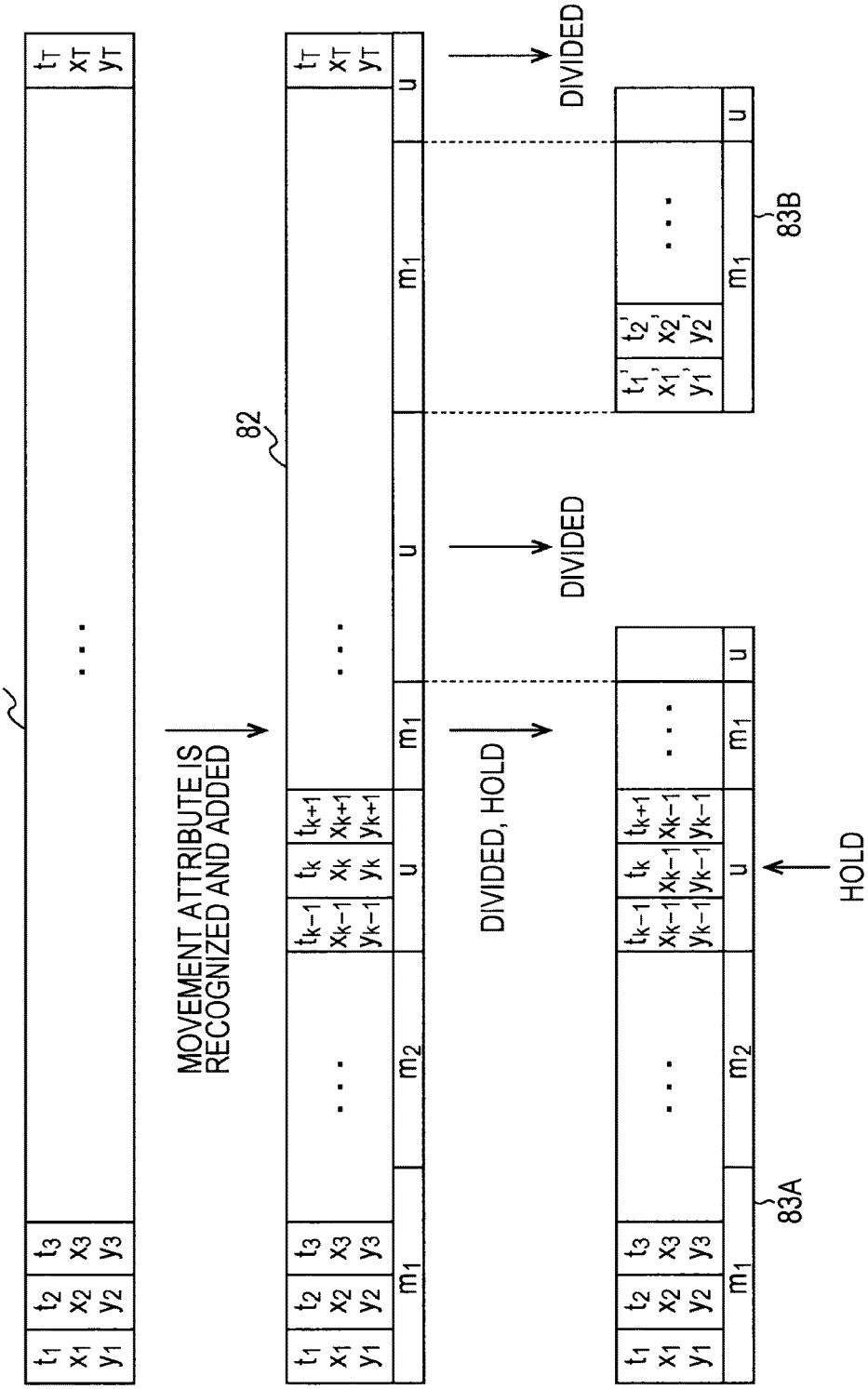
FIG. 8 is a diagram for describing processing of the learning preprocessor.

FIG. 8 conceptually illustrates processing of the movement attribute adding unit 74 and stay-state processing unit 75 of the learning preprocessor 22. Note that the interpolation flag series data is omitted assuming that interpolated data is not included in the movement history data in FIG. 8.

The movement attribute identification adding unit 74 identifies a moment attribute of "stay state" or "moving state" regarding movement history data 81 supplied from the resampling processing unit 73, illustrated in the upper tier in FIG. 8, and adds this thereto. As a result thereof, movement history data 82 with a movement attribute illustrated in the middle tier in FIG. 8 is generated.

With the movement history data 82 with a movement attribute in the middle tier in FIG. 8, "$m_1$" and "$m_2$" represent the movement attribute of "moving state", and "u" represents the movement attribute of "stay state". Note that "$m_1$" and "$m_2$" are the same "moving state", but moving means (car, bus, train, walk, or the like) differ.

Processing to divide and hold movement history data is executed on the movement history data 82 with a movement attribute in the middle tier in FIG. 8 by the stay-state processing unit 75 to generate movement history data 83 (83A and 83B) with a movement attribute in the lower tier in FIG. 8.

With the movement history data 83 with a movement attribute, the dividing processing is performed on a portion (three-dimensional data) of "moving state" occurred at the second time in the movement history data 82 with a movement attribute, which is divided into movement history data 83A and 83B with a movement attribute.

With the dividing processing, first, the movement history data 82 with a movement attribute is divided at the "moving state" occurred at the second time of the movement history data 82 with a movement attribute and multiple three-dimensional data thereof, which are taken as the movement history data 83A and 83B with a movement attribute. Next, of the movement history data 83A and 83B with a movement attribute after the dividing, multiple three-dimensional data in "moving state" equal to or longer than the final stay threshold time of the movement history data 83A with a movement attribute earlier in time are organized to one three-dimensional data in "stay state". Thus, unnecessary movement history data is deleted, and accordingly, learning time can be reduced.

Note that, with the example in FIG. 8, three-dimensional data in "multiple moving states" occurred at the third time of the movement history data 82 with a movement attribute is data of which the "moving state" equal to or longer than the stay threshold time is continued, and similar dividing processing is performed. However, there is no subsequent three-dimensional data after the dividing, and accordingly, three-dimensional data in multiple "moving states" equal to or longer than the stay threshold time are organized to three-dimensional data in one "stay state".

On the other hand, of the movement history data 83A with a movement attribute, with the movement history data in the first time "moving state", hold processing has been executed. After the hold processing, three-dimensional data in three "moving states" (($t_{k-1}$, $x_{k-1}$, $y_{k-1}$), ($t_k$, $x_k$, $y_k$), ($t_{k+1}$, $x_{k+1}$, $y_{k+1}$)) has become (($t_{k-1}$, $x_{k-1}$, $y_{k-1}$), ($t_k$, $x_{k-1}$, $y_{k-1}$), ($t_{k+1}$, $x_{k-1}$, $y_{k-1}$)). That is to say, positional data has been corrected to data of the first position of "moving state". Note that, with the hold processing, an arrangement may be made wherein positional data is not be changed to data in the first position of "moving state", but rather is changed to a mean value of the positions, data in the position of the middle point-in-time of a period of "moving state", or the like.

Figure 9:
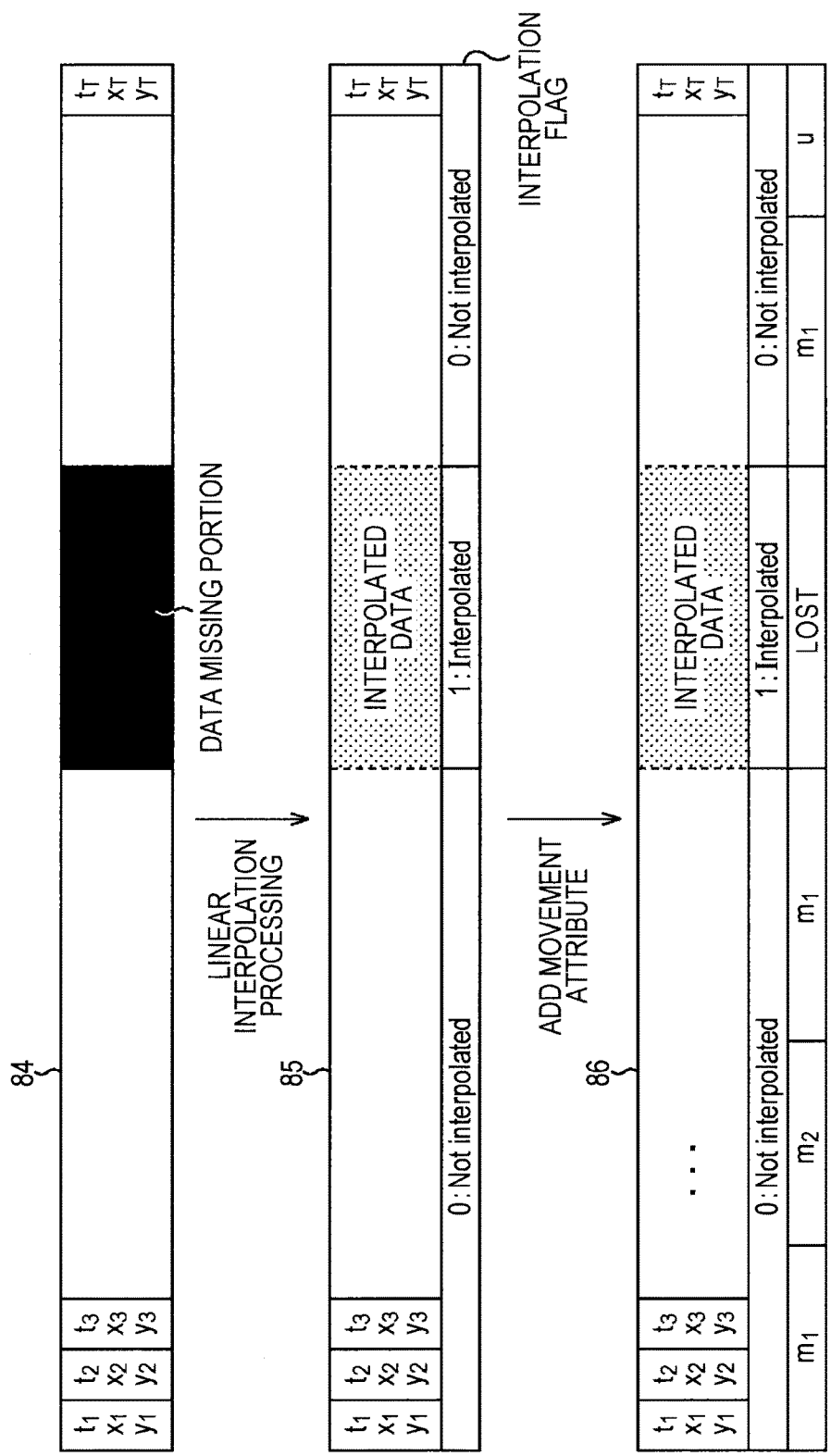
FIG. 9 is a diagram for describing processing of the learning preprocessor.

FIG. 9 is a diagram for describing linear interpolation processing and generation of interpolation flag series data to be performed by the resampling processing unit 73 of the learning preprocessor 22.

Of movement history data 84 illustrated in the upper tier in FIG. 9, a portion indicated with black is a data missing portion where three-dimensional data has not been obtained.

The resampling processing unit 73 embeds the data missing portion of the movement history data 84 with the interpolated data generated by the linear interpolation. Also, the resampling processing unit 73 adds an interpolation flag (interpolation information) that indicates whether the data is interpolated data to each three-dimensional data that makes up movement history data. With the example in FIG. 9, interpolation flag series data is generated wherein "1" has been added to three-dimensional data that is interpolated data, and "0" has been added to three-dimensional data that is not interpolated data.

The movement attribute is added to the movement history data 85 after the interpolation processing by the movement attribute identification adding unit 74. At this time, the movement attribute identification adding unit 74 cannot accurately identify the movement attribute for interpolated data as illustrated in the lower tier in FIG. 9, does not identify the movement attribute by taking the movement attribute of interpolated data as "LOST".

[Configuration Example of Movement Attribute Identification Adding Unit 74]

Figure 10:
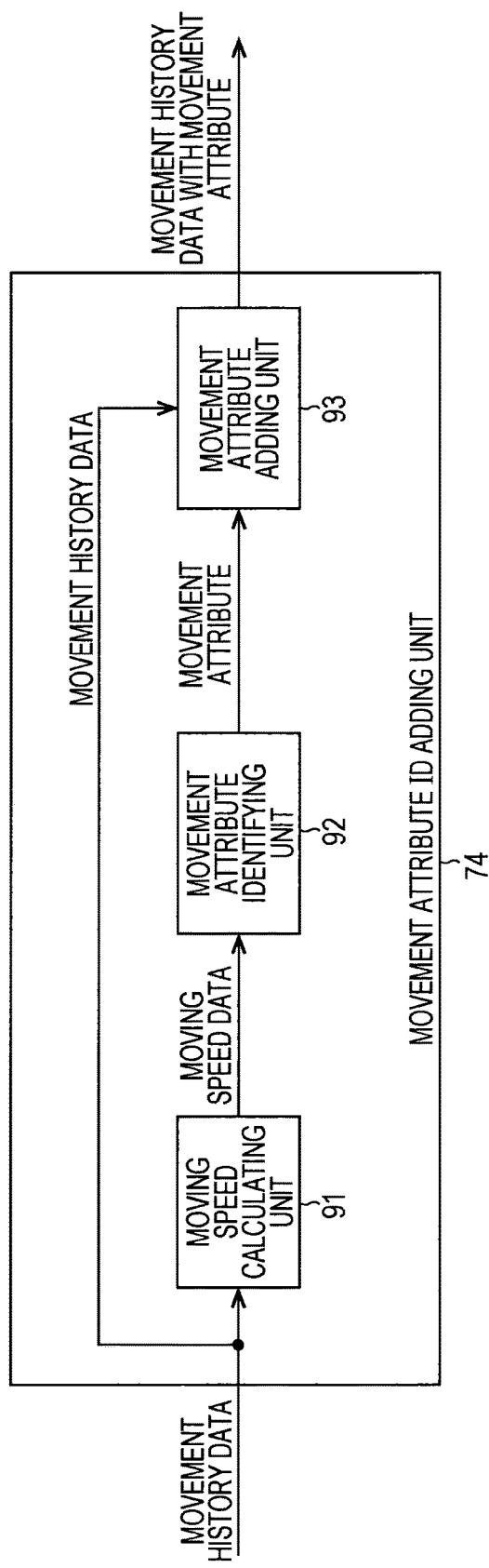
FIG. 10 is a block diagram illustrating a detailed configuration example of a movement attribute identification adding unit.

FIG. 10 is a block diagram illustrating a detailed configuration example of the movement attribute identification adding unit 74.

The movement attribute identification adding unit 74 is configured of a moving speed calculating unit 91, a movement attribute identifying unit 92, and a movement attribute adding unit 93.

The moving speed calculating unit 91 calculates moving speed from movement history data to be supplied.

Specifically, if three-dimensional data obtained in the k-th step (at the k-th data) with a certain time interval is represented as point-in-time $t_k$, longitude $y_k$, and latitude $x_k$, moving speed $vx_k$ in the x direction and moving speed $vy_k$ in the y direction in the k-th step can be calculated by the following Expression (2).

$$vx_k = \frac{x_k - x_{k-1}}{t_k - t_{k-1}}$$
$$vy_k = \frac{y_k - y_{k-1}}{t_k - t_{k-1}} \quad (2)$$

In Expression (2), latitude and longitude data is used without change, but processing such as converting latitude and longitude into distance, converting speed into speed per hour, or speed per minute, or the like may be performed as appropriate according to need.

Also, the moving speed calculating unit 91 further obtains, from the moving speed $vx_k$ and moving speed $vy_k$ obtained in Expression (2), moving speed $v_k$ in the k-th step and change $\theta_k$ in the advancing direction, which is represented with Expression (3).

$$v_k = \sqrt{vx_k^2 + vy_k^2}$$
$$\theta_k = \sin^{-1}\left(\frac{vx_k \cdot vy_{k-1} - vx_{k-1} \cdot vy_k}{v_k \cdot v_{k-1}}\right) \quad (3)$$

Features can be extracted better by using the moving speed $v_k$ and change $\theta_k$ in the advancing direction represented in Expression (3) instead of the moving speed $vx_k$ and $vy_k$ in Expression (2), with regard to the following points.

1. There may be a possibility that a data distribution of the moving speed $vx_k$ and $vy_k$ will not be able to be identified in the event that the angles differ even though moving means are the same (train, walk, or the like) since bias is imposed on the latitude and longitude axes, but there is little possibility thereof in the event of the moving speed $v_k$.

2. When learning is performed with only the absolute magnitude (M) of the moving speed, |v| is caused by noise from the device, and accordingly, walk and stay cannot be distinguished. Influence of noise can be reduced by also taking change in the advancing direction into consideration.

3. Though change in the advancing direction is little in the event of moving, the advancing direction is not determined in the event of stay, and accordingly, moving and stay may readily be performed by using change in the advancing direction.

From the above-mentioned reasons, with the present embodiment, the moving speed calculating unit 91 obtains the moving speed $v_k$ and change $\theta_k$ in the advancing direction that are represented by Expression (3) as data of moving speed, and supplies these to the movement attribute identifying unit 92.

The moving speed calculating unit 91 may perform filtering processing (preprocessing) according to moving average before calculating the moving speed $v_k$ and change $\theta_k$ in the advancing direction to remove noise components.

Note that, of sensor devices, there is a sensor device capable of outputting moving speed. In the event of such a sensor device being employed, moving speed that the sensor device outputs can be used without change by omitting the moving speed calculating unit 91. Hereinafter, the change $\theta_k$ in the advancing direction will be abbreviated as advancing direction $\theta_k$.

The movement attribute identifying unit 92 identifies the movement attribute based on the moving speed to be supplied to supply the recognition result to the movement attribute adding unit 93. More specifically, the movement attribute identifying unit 92 learns the user's behavioral state (moving state) as a probabilistic state transition model (HMM), and identifies the movement attribute using the probabilistic state transition model obtained by learning. As for the movement attribute, at least "stay state" and "moving state" have to exist. With the present embodiment, as will be described with reference to FIG. 12 and so forth, the movement attribute identifying unit 92 outputs the movement attribute obtained by further classifying "moving state" using multiple moving means such as walk, bicycle, car, and so forth.

The movement attribute adding unit 93 adds the movement attribute recognized by the movement attribute identifying unit 92 to each three-dimensional data that makes up movement history data from the resampling processing unit 73 to generate movement history data with a movement attribute, and outputs this to the stay state processing unit 75.

Next, description will be made regarding how to obtain parameters of a probabilistic state transition model that represents the user's behavioral state, to be used at the movement attribute identifying unit 92, with reference to FIG. 11 to FIG. 18.

[First Configuration Example of Learning Device of Movement Attribute Identifying Unit 92]

Figure 11:
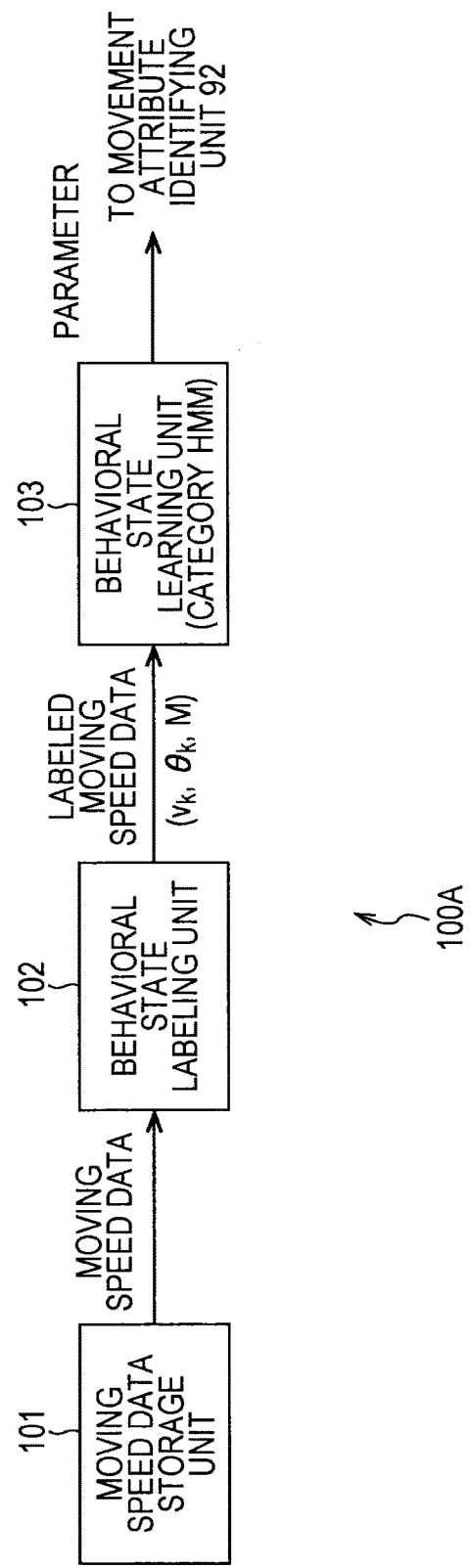
FIG. 11 is a block diagram illustrating a configuration example of a learning device of a movement attribute identifying unit.

FIG. 11 illustrates a configuration example of a learning device 100A configured to learn parameters of a probabilistic state transition model to be used at the movement attribute identifying unit 92, using a category HMM.

With the category HMM, it is known which category (class) tutor data to be learned belongs to, and parameters of the HMM are learned for each category.

The learning device 100A is configured of a moving speed data storage unit 101, a behavioral state labeling unit 102, and a behavioral state learning unit 103.

The moving speed data storage unit 101 stores time series data of moving speed serving as data for learning.

The behavioral state labeling unit 102 adds the user's behavioral state to the data of moving speed to be sequentially supplied from the moving speed data storage unit 101 in a time-series manner as a label (category). The behavioral state labeling unit 102 supplies the labeled moving speed data which is the data of moving speed correlated with the behavioral state, to the behavioral state learning unit 103. For example, data obtained by adding a label M that represents the behavioral state to the moving speed $v_k$ in the k-th step and advancing direction $\theta_k$ is supplied to the behavioral state learning unit 103.

The behavioral state learning unit 103 classifies the labeled moving speed data supplied from the behavioral state labeling unit 102 for each category, and learns parameters of the user's activity model (HMM) in increments of categories. The parameters for each category obtained as a result of the learning are supplied to the movement attribute identifying unit 92.

[Classification Example of Behavioral State]

Figure 12:
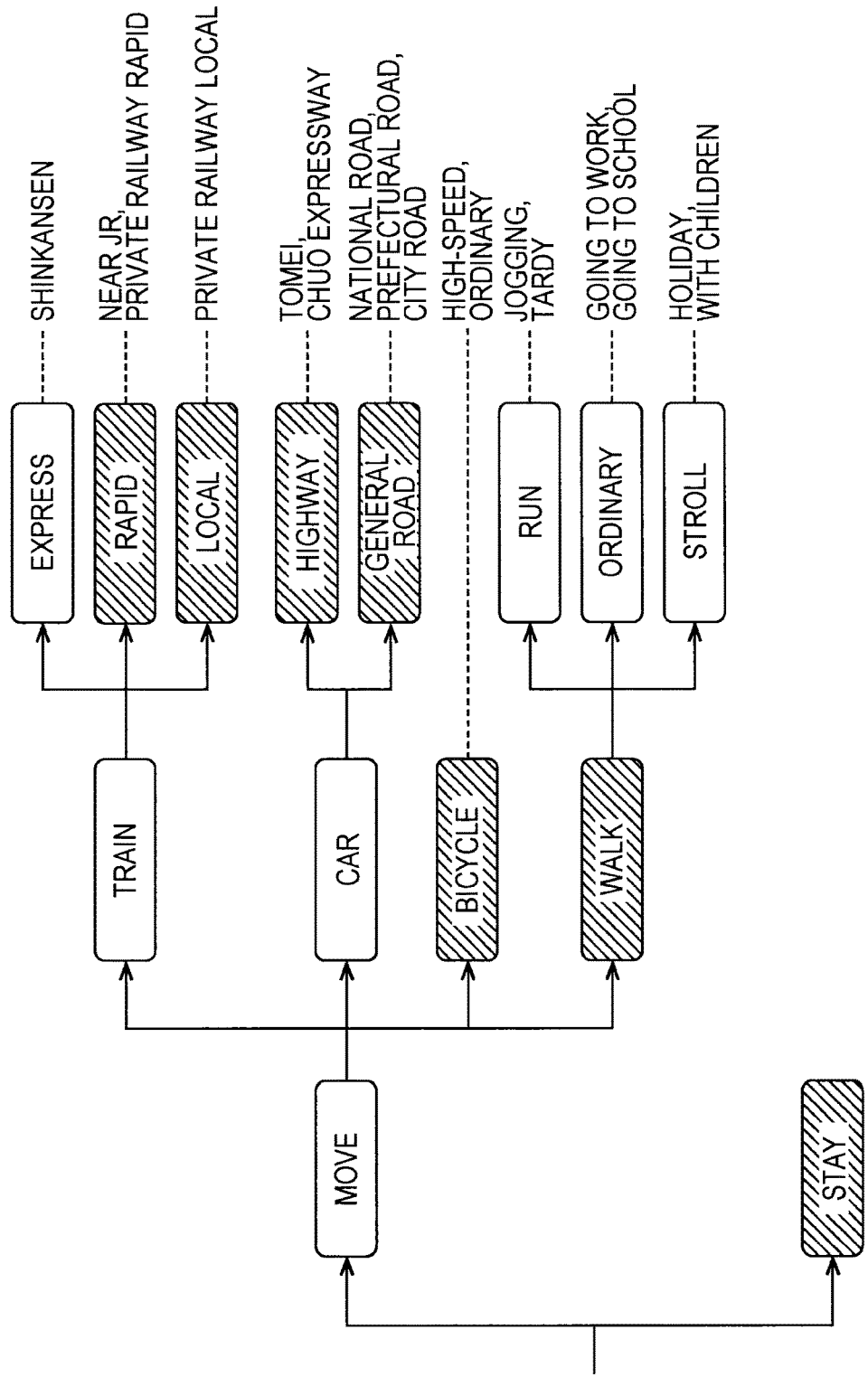
FIG. 12 is a diagram illustrating a classification example in the event of classifying a behavioral state for each category.

FIG. 12 illustrates a classification example in the event of classifying the behavioral state for each category.

As illustrated in FIG. 12, first, the user's behavioral state may be classified into a stay state and a moving state. With the present embodiment, as described above, at least the stay state and the moving state have to exist as the user's behavioral state that the movement attribute identifying unit 92, and accordingly, it is fundamental to classify the user's behavioral state into these two.

Further, the moving state may be classified into train, car (including bus and so forth), bicycle, and walk. The train may further be classified into express, rapid, local, and so forth, and the car may be classified into highway, general road, and so forth. Also, the walk may be classified into run, ordinary, stroll, and so forth.

With the present embodiment, let us say that the user's behavioral state is classified into "stay", "train (rapid)", "train (local)", "car (highway)", "car (general road)", "bicycle", and "walk". Note that "train (express)" has been omitted since no data for learning has been obtained.

Note that it goes without saying that how to classify categories is not restricted to the example illustrated in FIG. 12. Also, change in moving speed by moving means does not greatly differ depending on users, and accordingly, time series data of moving speed serving as data for learning does not have to be belonged to a user to be recognized.

[Processing Example of Behavioral State Labeling Unit 102]

Next, a processing example of the behavioral state labeling unit 102 will be described with reference to FIG. 13 and FIG. 14.

Figure 13:
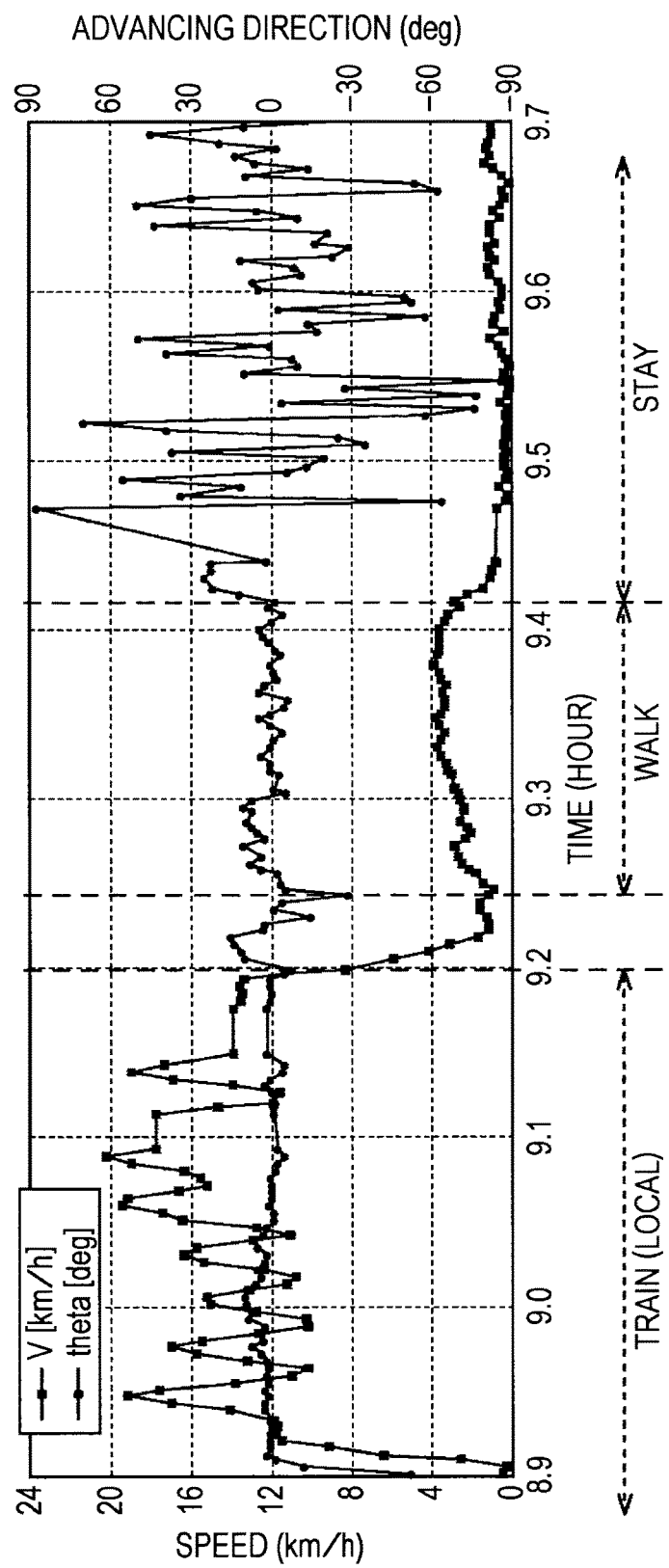
FIG. 13 is a diagram for describing a processing example of a behavioral state labeling unit.

FIG. 13 illustrates an example of time series data of moving speed to be supplied to the behavioral state labeling unit 102.

In FIG. 13, data of moving speed (v, θ) to be supplied from the behavioral state labeling unit 102 is indicated as a form of (t, v) and (t, θ). In FIG. 13, a square (■) plot represents moving speed v, and a circle (●) plot represents the advancing direction θ. Also, the horizontal axis represents time t, and the vertical axis on the right side represents the advancing direction θ, and the vertical axis on the left side represents moving speed v.

Characters of "train (local)", "walk", "stay" indicated downward in the time axis in FIG. 13 have been added for description. The first of the time series data in FIG. 13 is data of moving speed in the event that the user is moving by train (local), and the next is a case where the user is moving by "walk", and next thereof is data of moving speed in the event that the user is in "stay".

In the event that the user is moving by "train (local)", the train repeatedly stops at a station, accelerates when leaving the station, and decelerates again to stop at a station, and accordingly, a feature is represented wherein a plot with moving speed v repeatedly vertically undulates. Note that the reason why moving speed is not 0 even when the train is stopped is because filtering processing according to moving average is being performed.

Also, a case where the user is moving by "walk", and a case where the user is in "stay" are states to be most hardly distinguished, but according to the filtering processing by moving average, there can be seen explicit difference in the moving speed v. Also, with "stay", there can be seen a feature wherein the advancing direction θ is instantly greatly changed, and it is found that discrimination with "walk" is easy. In this manner, according to the filtering processing by moving average, and according to the user's movement being represented with the moving speed v and advancing direction θ, it is found that discrimination between "walk" and "stay" becomes easy.

Note that a portion between "train (local)" and "walk" is a portion where a behavioral switching point is vague for the filtering processing.

Figure 14:
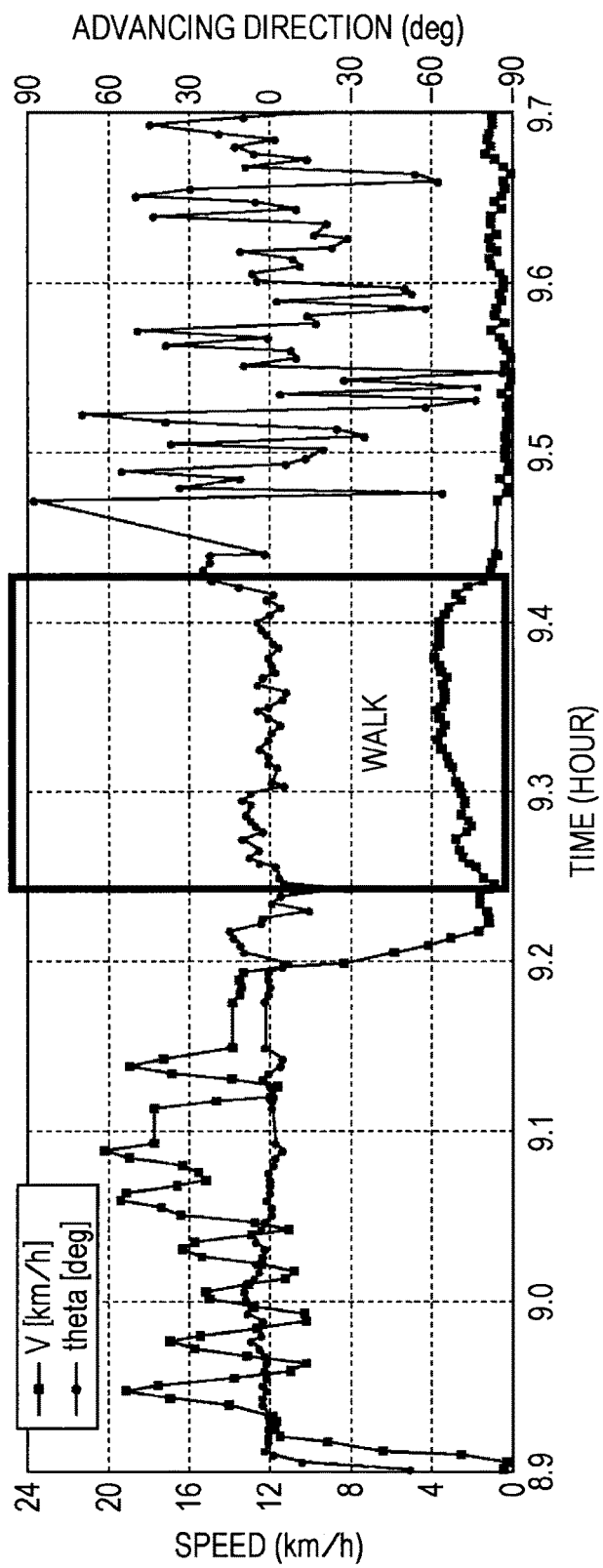
FIG. 14 is a diagram for describing a processing example of the behavioral state labeling unit.

FIG. 14 illustrates an example wherein labeling is performed on times series data illustrated in FIG. 13.

For example, the behavioral state labeling unit 102 displays the data of moving speed illustrated in FIG. 13 on a display. The user then performs operations for surrounding a portion to be labeled with a rectangular region of the data of moving speed displayed on the display using a mouse or the like. Also, the user inputs a label to be added to the specified data from a keyboard or the like. The behavioral state labeling unit 102 performs labeling by adding the input label to the data of moving speed included in the rectangular region specified by the user.

In FIG. 14, an example is illustrated wherein the data of moving speed of a portion equivalent to "walk" has been specified with a rectangular region. Note that, at this time, for the filtering processing, a portion where a behavioral switching point is vague can be prevented from being included in the region to be specified. The length of time series data is determined from length where behavioral difference explicitly appears in the time series data. For example, the length may be set to around 20 steps (15 sec.×20 steps=300 sec.).

[Configuration Example of Behavioral State Learning Unit 103]

Figure 15:
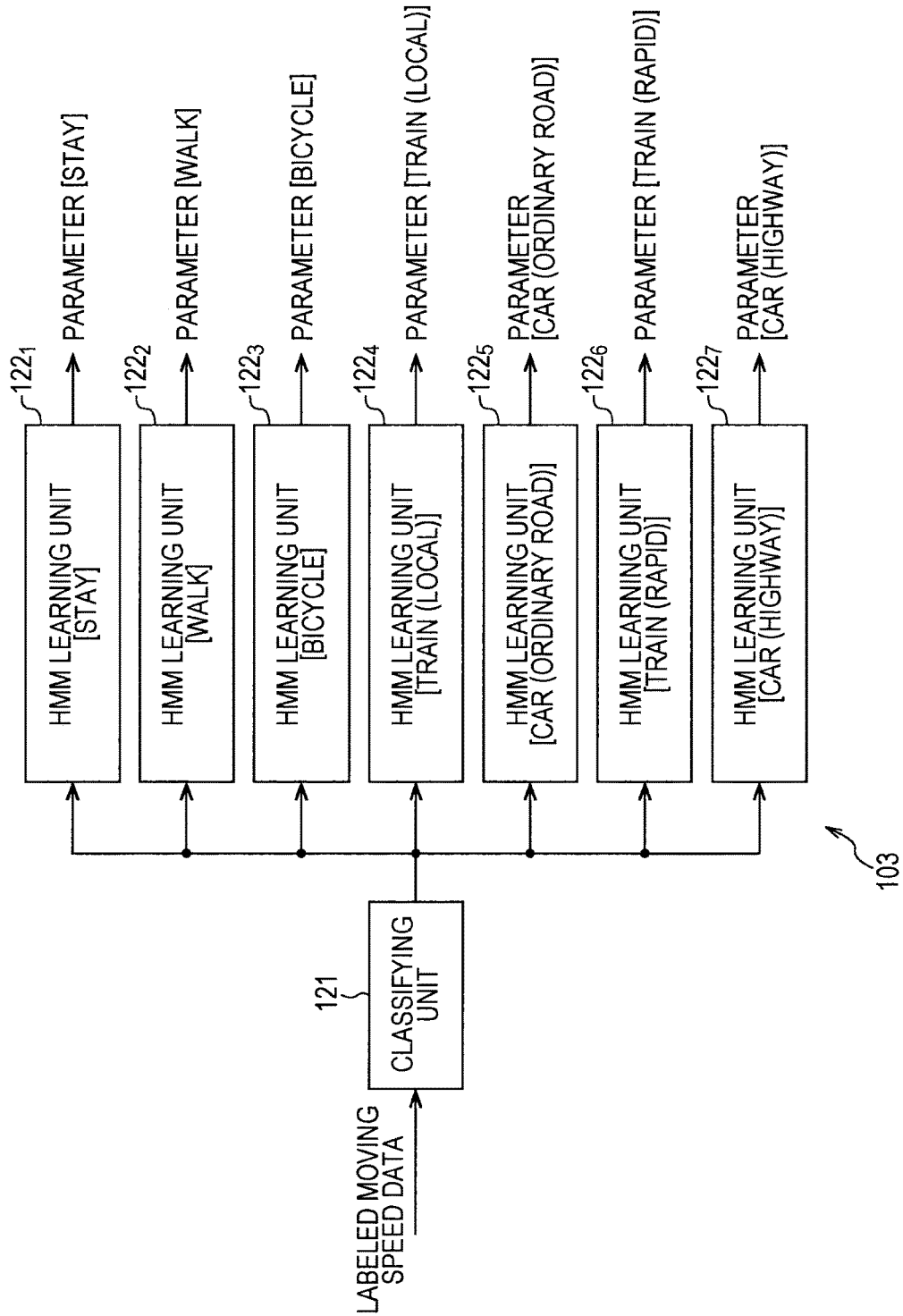
FIG. 15 is a block diagram illustrating a configuration example of a behavioral state labeling unit in FIG. 11.

FIG. 15 is a block diagram illustrating a configuration example of the behavioral state learning unit 103 in FIG. 11.

The behavioral state learning unit 103 is configured of a classifying unit 121, and HMM learning units $122_1$ to $122_7$.

The classifying unit 121 references the label of the labeled moving speed data supplied from the behavioral state labeling unit 102 to supply to one of the HMM learning units $122_1$ to $122_7$ corresponding to the label. Specifically, with the behavioral state learning unit 103, the HMM learning units 122 are prepared for each label (category), the labeled moving speed data to be supplied from the behavioral state labeling unit 102 is classified for each label and supplied.

Each of the HMM learning units $122_1$ to $122_7$ learns a learning model (HMM) using the supplied labeled moving speed data. Each of the HMM learning units $122_1$ to $122_7$ then supplies the parameter λ of the HMM obtained by learning to the movement attribute identifying unit 92 in FIG. 10.

The HMM learning unit $122_1$ learns a learning model (HMM) in the event that the label is "stay". The HMM learning unit $122_2$ learns a learning model (HMM) in the event that the label is "walk". The HMM learning unit $122_3$ learns a learning model (HMM) in the event that the label is "bicycle". The HMM learning unit $122_4$ learns a learning model (HMM) in the event that the label is "train (local)". The HMM learning unit $122_5$ learns a learning model (HMM) in the event that the label is "car (general road)". The HMM learning unit $122_6$ learns a learning model (HMM) in the event that the label is "train (rapid)". The HMM learning unit $122_7$ learns a learning model (HMM) in the event that the label is "car (highway)".

[First Configuration Example of Movement Attribute Identifying Unit 92]

Figure 16:
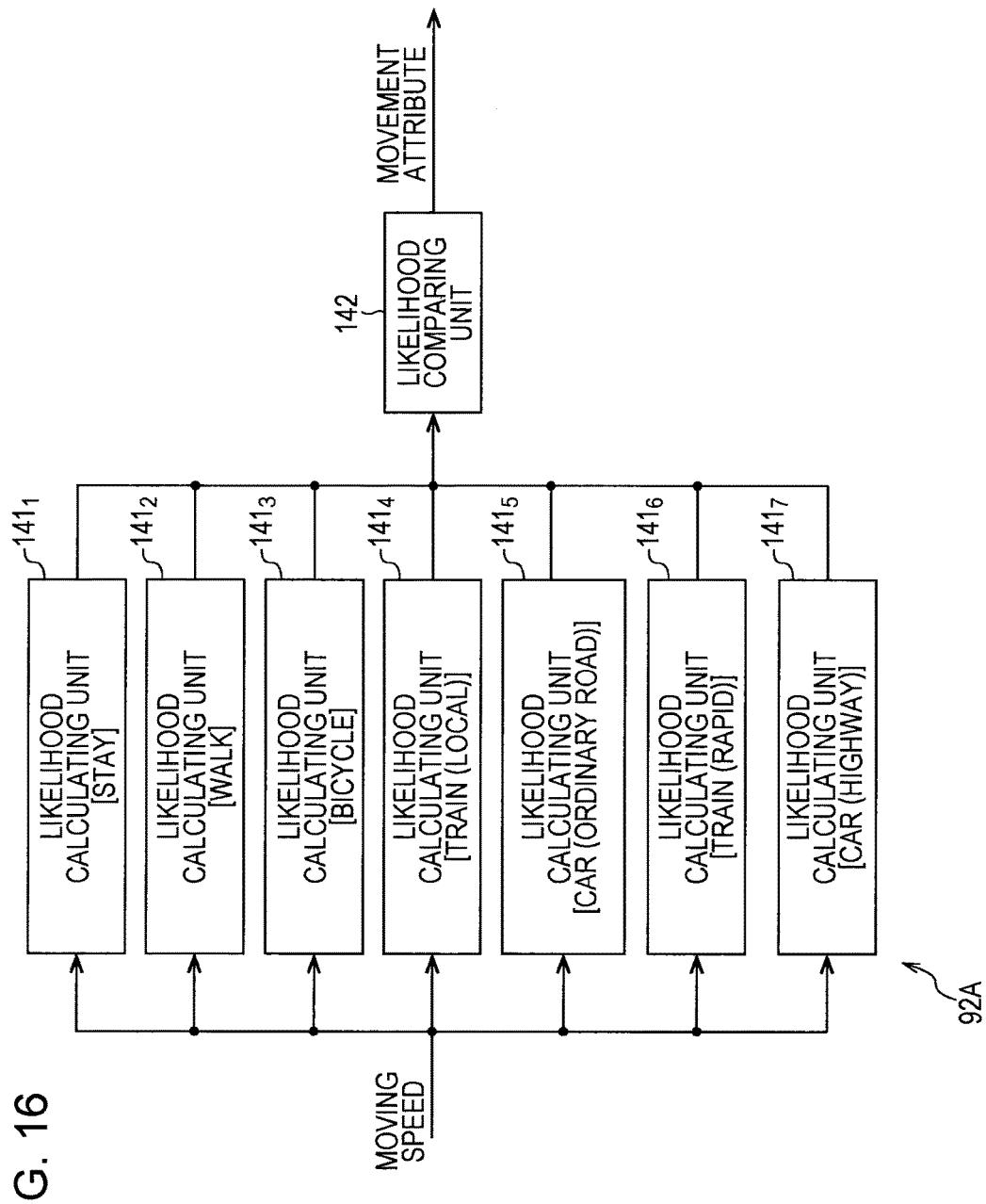
FIG. 16 is a block diagram illustrating a detailed configuration example of the movement attribute identifying unit.

FIG. 16 is a block diagram illustrating a configuration example of a movement attribute identifying unit 92A which is the movement attribute identifying unit 92 in the event of using the parameters leaned at the learning device 100A.

The movement attribute identifying unit 92A is configured of likelihood calculating units $141_1$ to $141_7$ and a likelihood comparing unit 142.

The likelihood calculating unit $141_1$ calculates likelihood corresponding to the time series data of moving speed supplied from the moving speed calculating unit 91 (FIG. 10) using the parameters obtained by learning of the HMM learning device $122_1$. Specifically, the likelihood calculating unit $141_1$ calculates likelihood with the behavioral state being "stay".

The likelihood calculating unit $141_2$ calculates likelihood corresponding to the time series data of moving speed supplied from the moving speed calculating unit 91 using the parameters obtained by learning of the HMM learning device $122_2$.

Specifically, the likelihood calculating unit $141_2$ calculates likelihood with the behavioral state being "walk".

The likelihood calculating unit $141_3$ calculates likelihood corresponding to the time series data of moving speed supplied from the moving speed calculating unit 91 using the parameters obtained by learning of the HMM learning device $122_3$.

Specifically, the likelihood calculating unit $141_3$ calculates likelihood with the behavioral state being "bicycle".

The likelihood calculating unit 141₄ calculates likelihood corresponding to the time series data of moving speed supplied from the moving speed calculating unit 91 using the parameters obtained by learning of the HMM learning device 122₄.

Specifically, the likelihood calculating unit 141₄ calculates likelihood with the behavioral state being "train (local)".

The likelihood calculating unit 141₅ calculates likelihood corresponding to the time series data of moving speed supplied from the moving speed calculating unit 91 using the parameters obtained by learning of the HMM learning device 122₅.

Specifically, the likelihood calculating unit 141₅ calculates likelihood with the behavioral state being "car (general road)".

The likelihood calculating unit 141₆ calculates likelihood corresponding to the time series data of moving speed supplied from the moving speed calculating unit 91 using the parameters obtained by learning of the HMM learning device 122₆.

Specifically, the likelihood calculating unit 141₆ calculates likelihood with the behavioral state being "train (rapid)".

The likelihood calculating unit 141₇ calculates likelihood corresponding to the time series data of moving speed supplied from the moving speed calculating unit 91 using the parameters obtained by learning of the HMM learning device 122₇.

Specifically, the likelihood calculating unit 141₇ calculates likelihood with the behavioral state being "car (highway)".

The likelihood comparing unit 142 compares the likelihood supplied from each of the likelihood calculating units 141₁ to 141₇, selects the behavioral state having the highest likelihood, and outputs this as a movement attribute.

[Second Configuration Example of Learning Device of Movement Attribute Identifying Unit 92]

Figure 17:
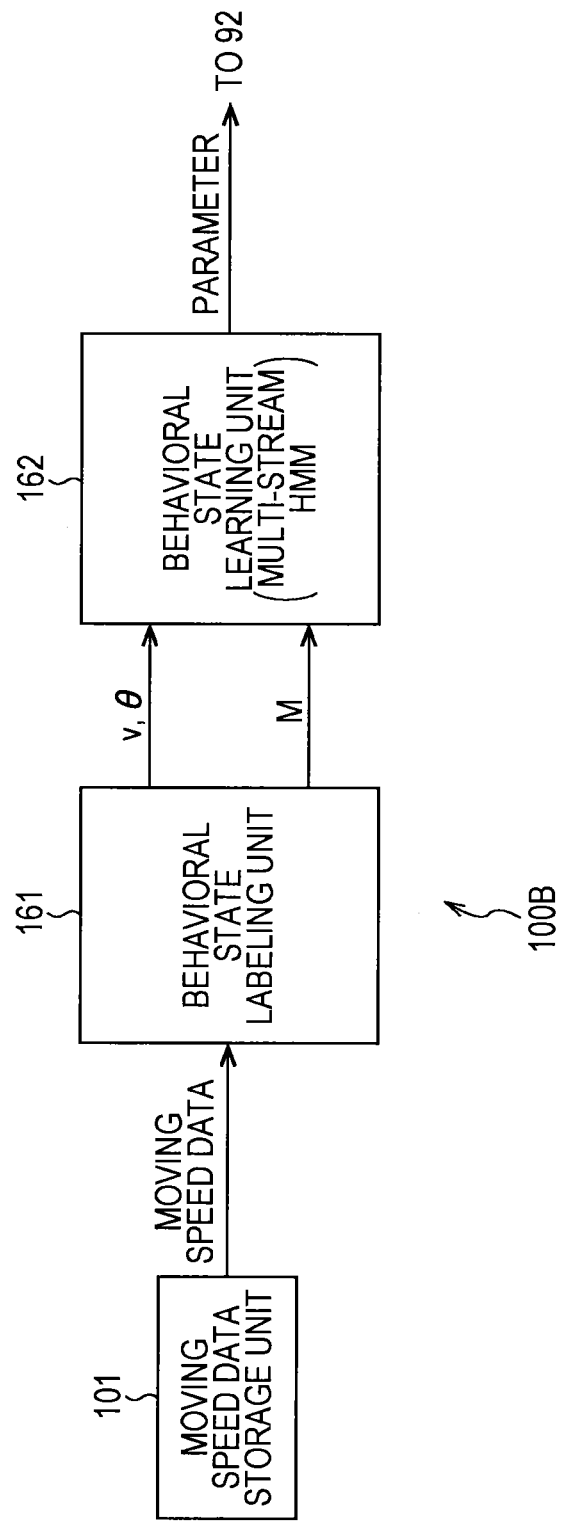
FIG. 17 is a block diagram illustrating another configuration example of the learning device of the movement attribute identifying unit.

FIG. 17 illustrates a configuration example of a learning device 100B configured to learn parameters of the user's activity model to be used at the movement attribute identifying unit 92 using a multi-stream HMM.

The learning device 100B is configured of a moving speed data storage unit 101, a behavioral state labeling unit 161, and a behavioral state learning unit 162.

The behavioral state labeling unit 161 adds the user's behavioral state to the data of moving speed to be sequentially supplied from the moving speed data storage unit 101 in a time-series manner as a label (behavioral mode). The behavioral state labeling unit 161 supplies times series data (v, θ) of moving speed, and time series data of a behavioral mode M correlated therewith to the behavioral state learning unit 162.

The behavioral state learning unit 162 learns the user's behavioral state using a multi-stream HMM.

The multi-stream HMM is an HMM wherein a state node having the same transition probability as an ordinary HMM outputs data following multiple different probability rules. With the multi-stream HMM, of the parameter λ, the output probability density function $b_j(x)$ is separately prepared for each time series data. With the multi-stream HMM, learning can be performed while correlating different types of time series data (stream).

Time series data with the moving speed v and advancing direction θ which is continuous amount, and time series data of the behavioral mode M which is distributed amount are supplied to the behavioral state learning unit 162. The behavioral state learning unit 162 learns the distribution parameter of moving speed to be output from each state node, and the probability of a behavioral mode. According to the multi-stream HMM obtained by learning, the current state node is obtained from the time series data of moving speed, for example. A behavioral mode can be recognized from the obtained state node.

With the first configuration example using the category HMM, seven HMMs have to be prepared for each category, but with the multi-stream HMM, one HMM is enough. However, the number of state nodes to be prepared has to agree with a total number of state nodes used for seven categories in the first configuration example.

[Second Configuration Example of Movement Attribute Identifying Unit 92]

Figure 18:
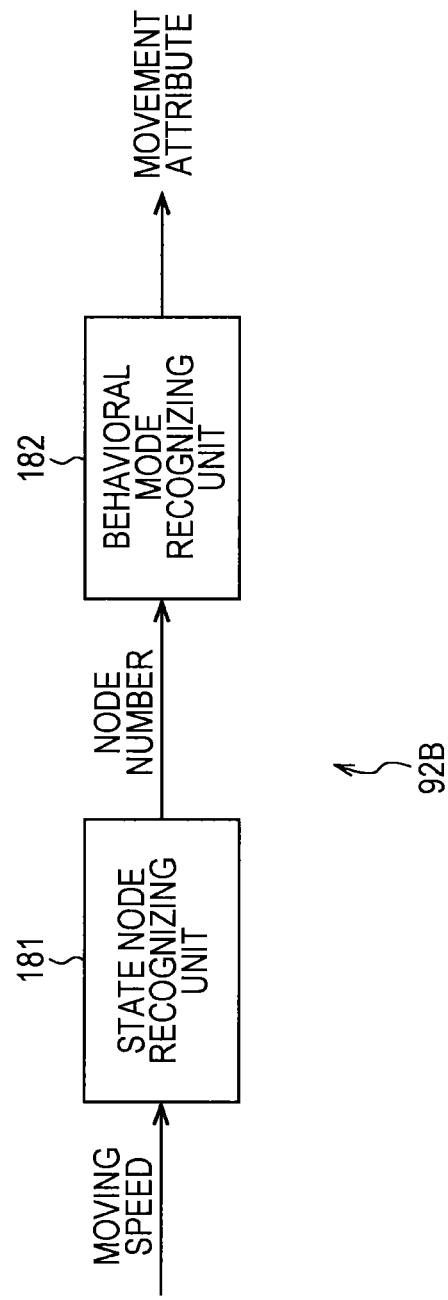
FIG. 18 is a block diagram illustrating another configuration example of the movement attribute identifying unit.

FIG. 18 is a block diagram illustrating a configuration example of a movement attribute identifying unit 92B which is the movement attribute identifying unit 92 in the event of using the parameters learned at the learning device 100B.

The movement attribute identifying unit 92B is configured of a state node recognizing unit 181 and a behavioral mode recognizing unit 182.

The state node recognizing unit 181 recognizes the state node of the multi-stream HMM from the times series data of moving speed supplied from the moving speed calculating unit 91 using the parameters of the multi-stream HMM learned at the learning device 100B. The state node recognizing unit 181 supplies the node number of the recognized current state node to the behavioral mode recognizing unit 182.

The behavioral mode recognizing unit 182 outputs a behavioral mode which is a state node recognized at the state node recognizing unit 181 and has the highest probability as a movement attribute.

[Processing of Learning Preprocessor 22]

Figure 19:
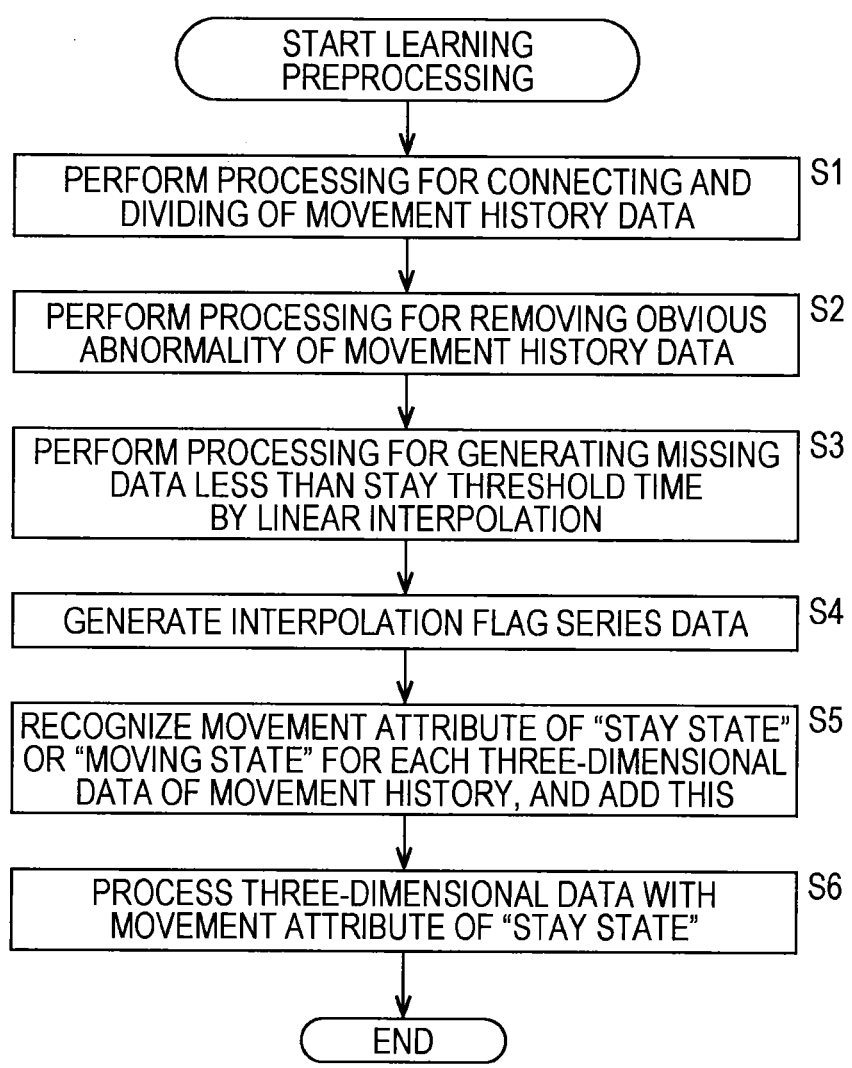
FIG. 19 is a flowchart for describing processing of the learning preprocessor.

FIG. 19 is a flowchart of learning preprocessing by the learning preprocessor 22.

With the learning preprocessing, first, in step S1, the data connecting/dividing unit 71 performs connecting and dividing processing of movement history data.

In step S2, the abnormal data removing unit 72 performs processing to remove explicit abnormal data from the movement history data.

In step S3, the resampling processing unit 73 performs processing to generate missing data with a time interval for obtaining time being less than the stay threshold time, using linear interpolation.

In step S4, the resampling processing unit 73 generates interpolation flag series data based on whether or not each three-dimensional data that makes up the movement history data is interpolated data generated by the linear interpolation.

In step S5, the movement attribute identification adding unit 74 identifies, regarding each three-dimensional data of the movement history, a movement attribute of "stay state" or "moving state" and adds this thereto. Note that a movement attribute of "LOST" is added to the three-dimensional data generated by the linear interpolation.

In step S6, the stay state processing unit 75 processes three-dimensional data of which the movement attribute is "stay state". The stay state processing unit 75 then outputs the movement history data after the processing process to the learning main processor 23 along with the interpolation flag series data, and the processing is ended.

As described above, with the learning preprocessor 22, after the movement history data is divided according to need, interpolated data is generated in a data missing portion, and a movement attribute is identified. Processing process (hold processing) is performed on the three-dimensional data in "stay state", and the movement history data after the processing process is supplied to the learning main processor 23 along with the interpolation flag series data.

Note that, with the above-mentioned learning preprocessing of the learning preprocessor 22, the movement attribute of "LOST" has been added to the interpolated data, but the interpolation processing has previously performed, and accordingly, a movement attribute may also be identified and added regarding the interpolated data.

[Detailed Configuration Example of Learning Main Processor 23]

Figure 20:
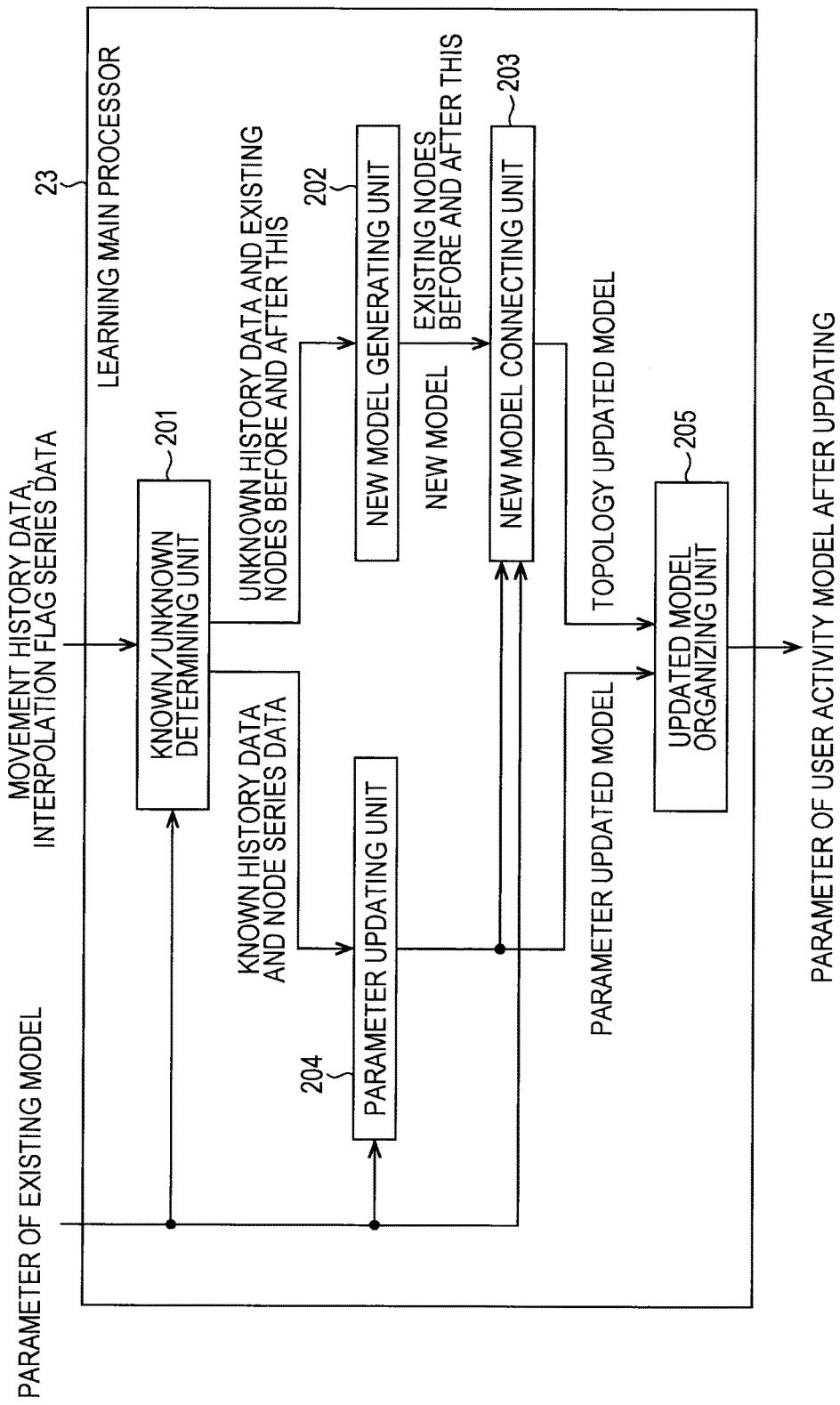
FIG. 20 is a block diagram illustrating a detailed configuration example of the learning main processor in FIG. 1.

FIG. 20 is a block diagram illustrating a detailed configuration example of the learning main processor 23 of the learning block 11.

The learning main processor 23 is configured of a known/unknown determining unit 201, a new model generating unit 202, a new model connecting unit 203, a parameter updating unit 204, and an updated model organizing unit 205.

The movement history data and interpolation flag series data from the learning preprocessor 22 (FIG. 1) are supplied to the known/unknown determining unit 201. Also, in the event that learning by the learning main processor 23 has already been performed at least once or more, the parameters of the user's activity model obtained by the previous learning are obtained from the model-parameter-by-user storage unit 12 (FIG. 1) as the parameters of an existing model. The parameters of the existing model are supplied to the known/unknown determining unit 201, new model connecting unit 203, and parameter updating unit 204.

The known/unknown determining unit 201 determines whether or not the movement history data supplied from the learning preprocessor 22 is movement history data in a known route. Note that, with learning at the second time and thereafter, there may be a case where a part of the supplied movement history data is movement history data in an unknown route, and a remaining part is movement history data in a known route. The known/unknown determining unit 201 estimates, regarding movement history data to have been determined as known, which state node of the existing model each three-dimensional data of the movement history data is equivalent to. The known/unknown determining unit 201 then supplies the known movement history data, and node series data corresponding thereto to the parameter updating unit 204.

On the other hand, in the event that determination is made that the supplied movement history data is movement history data in an unknown route, the known/unknown determining unit 201 supplies the movement history data in an unknown route to the new model generating unit 202. Also, in the event that the movement history data in an unknown route is connected to movement history data in a known route, the known/unknown determining unit 201 supplies the state nodes of the existing model corresponding to the movement history data before and after the movement history data in the known route serving as the connection destination of the movement history data in the unknown route to the new model generating unit 202. Note that, in the event that there is no state node of the existing model after the unknown movement history data, for example, in the event of arriving at an unknown destination from a known route via an unknown route, and returning, only the state nodes of the previous exiting model are supplied to the new model generating unit 202.

With the first learning, all of the movement history data supplied from the learning preprocessor 22 are supplied to the new model generating unit 202 as unknown movement history data. Also, with the first learning, there is no state node of the existing model ahead and behind, and accordingly, there is no supply for the new model generating unit 202.

The new model generating unit 202 learns the user's activity model using the unknown movement history data supplied from the known/unknown determining unit 201. That is to say, the new model generating unit 202 obtains parameters at the time of modeling the unknown movement history data with the stochastic state transition model, and supplies to the new model connecting unit 203. The user's activity model learned here becomes a new model different from the existing model obtained by the previous learning. Note that the first learning and the second learning and thereafter differ only in the data amount of the unknown movement history data to be learned, and the parameters of the user's activity model can be obtained by the same learning.

The new model generating unit 202 supplies the parameters of the new model obtained by learning to the new model connecting unit 203. Also, in the event that the state nodes of the existing model ahead and behind have been supplied from the known/unknown determining unit 201, the new model generating unit 202 also supplies the state nodes of the existing model ahead and behind thereof to the new model connecting unit 203.

With the second learning and thereafter, the new model connecting unit 203 updates the existing model obtained by the previous learning based on the unknown movement history data. Specifically, the new model connecting unit 203 connects the new model from the new model generating unit 202 to the existing model based on the state nodes before and after the unknown movement history data to generate the user's activity model after updating. The user's activity model updated by the new model connecting unit 203 is a topology updated model to which state nodes have been added according to the unknown movement history data.

Note that, with the new model connecting unit 203, in the event that movement history data in a known route is not included at all in the movement history data supplied to the learning main processor 23, the exiting model to be connected to the new model from the new model generating unit 202 becomes the existing model obtained from the model-parameter-by-user storage unit 12 (FIG. 1). On the other hand, in the event that movement history data in a known route is partially included in the movement history data supplied to the learning main processor 23, the exiting model to be connected to the new model becomes the existing model updated at the parameter updating unit 204.

The parameter updating unit 204 updates the existing model obtained by the previous learning based on the known movement history data and node series data corresponding thereto. The parameters of the updated existing model are output to the new model connecting unit 203 and updated model organizing unit 205. With updating by the parameter updating unit 204, as described above, there is no addition of state nodes.

The updated model organizing unit 205 deletes, of the topology updated model updated by the new model connecting unit 203 or the parameter updated model updated by the parameter updating unit 204, state nodes having no transition from another state node by self transition alone to organize the updated model. The parameters of the updated mode after organizing are supplied to the learning postprocessor 24 and model-parameter-by-user storage unit 12 as the parameters of the user's activity model obtained by learning (updating learning).

[Detailed Configuration Example of Known/unknown Determining Unit 201]

Next, details of the known/unknown determining unit 201 will further be described.

Figure 21:
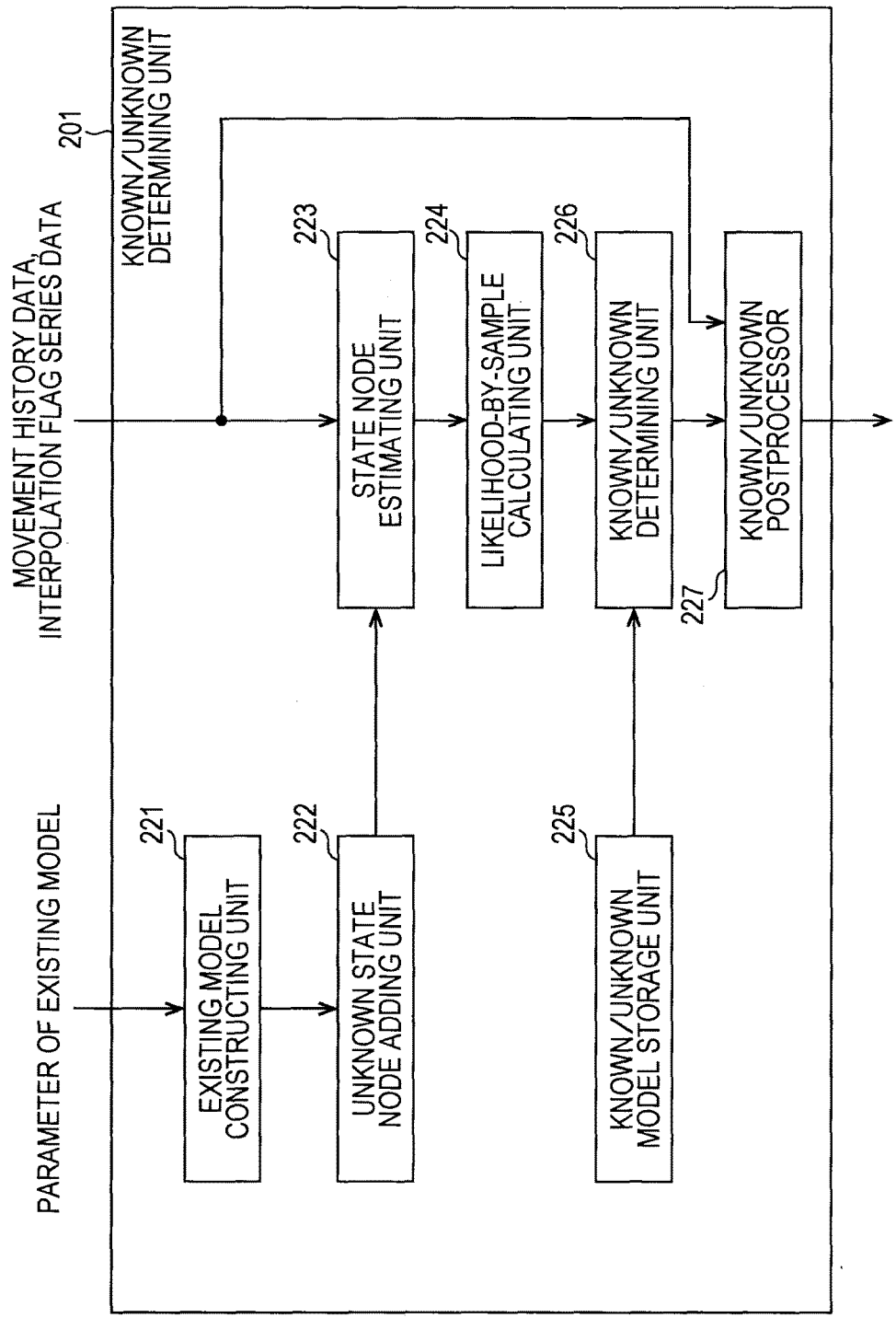
FIG. 21 is a block diagram illustrating a detailed configuration example of the known/unknown determining unit.

FIG. 21 is a block diagram illustrating a detailed configuration example of the known/unknown determining unit 201.

In the event that the learning processing has been executed at least once by the learning main processor 23, the parameters of the existing model are supplied from the model-parameter-by-user storage unit 12 (FIG. 1) to an existing model constructing unit 221. The existing model constructing unit 221 constructs, based on the obtained parameters of the existing model, the existing model, and supplies this to an unknown state node adding unit 222.

Note that, with a state in which the learning processing has not been executed at all, the initial parameters of the existing model are set to existing model constructing unit 221 beforehand. With the initial parameters of the existing model, the number of nodes is 1, the transition probability of the one state node thereof is only self transition, the center value is a value other than a range where three-dimensional data (point-in-time, longitude, latitude) can take, the distributed value is the minimum distributed value, and node frequency is 1. The learning processing has been executed at least once, and the parameters of the existing model have been supplied from the model-parameter-by-user storage unit 12 (FIG. 1), and accordingly, the initial parameters of the existing model are overwritten and deleted.

The unknown state node adding unit 222 adds one state node that accepts the unknown movement history data (hereinafter, referred to as unknown state node) to the existing model constructed at the existing model constructing unit 221. Thus, a learning model is constructed wherein one state node has been added to the existing model (hereinafter, referred to as unknown state addition model), and supplied to a state node estimating unit 223.

The state node estimating unit 223 estimates a state node of the unknown state addition model corresponding to each three-dimensional data of the supplied movement history data using the Viterbi algorithm in which the unknown state addition model supplied from the unknown state node adding unit 222 is employed. One node that which accepts unknown movement history data has been added to the unknown state addition model, and accordingly, Viterbi estimation is performed without collapse even when the input movement history data is unknown movement history data. In the event that one node that accepts movement history data has not been added, the corresponding state node will not be found regarding unknown movement history data, and Viterbi estimation will collapse.

A likelihood-by-sample calculating unit 224 calculates an observation likelihood expected value serving as an index to be used for known/unknown determination. An observation likelihood expected value at point-in-time t is obtained with L(t). In the event that the movement history data is data in a known route, the observation likelihood expected value L(t) increases, and in the event that the movement history data is data in an unknown route, the observation likelihood expected value L(t) decreases.

A known/unknown determining unit 226 performs known or unknown determination by performing Viterbi determination on time series data of the observation likelihood expected value L(t) (observation likelihood series data), which employs two state models of known and unknown states stored in a known/unknown model storage unit 225.

A known/unknown postprocessor 227 corrects the state node estimated to be unknown by the state node estimating unit 223 and determined to be known by the known/unknown determining unit 226 to be unknown. That is to say, with regard to unknown determination, the estimation result from the state node estimating unit 223 is prioritized.

Also, the known/unknown postprocessor 227 outputs the movement history data supplied from the learning preprocessor 22 (FIG. 1) to the new model generating unit 202 or parameter updating unit 204 with reference to the determination result after the correction. Specifically, the known/unknown postprocessor 227 supplies the movement history data of which the determination result is known to the parameter updating unit 204 (FIG. 19) along with node series data corresponding thereto. On the other hand, the known/unknown postprocessor 227 supplies the movement history data of which the determination result is unknown to the new model generating unit 202. In the event that the unknown movement history data is connected to known movement history data, the known/unknown postprocessor 227 also supplies state nodes of the existing model corresponding to known movement history data ahead and behind, serving as connection destination of the unknown movement history data, to the new model generating unit 202.

[Construction Processing of Unknown State Addition Model]

Figure 22:
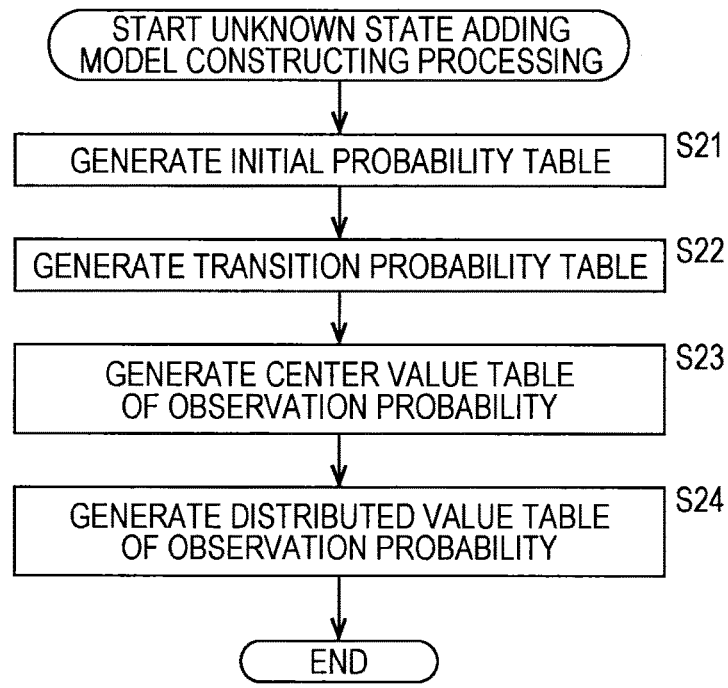
FIG. 22 is a flowchart for describing construction processing of an unknown state addition model by an unknown-state node adding unit.

Construction processing of an unknown state addition model by the unknown state node adding unit 222 will be described with reference to the flowchart in FIG. 22.

First, in step S21, the unknown state node adding unit 222 generates an initial probability table for an unknown state addition model in which the initial probability of each state node of an unknown state addition model is stored.

Figure 23:
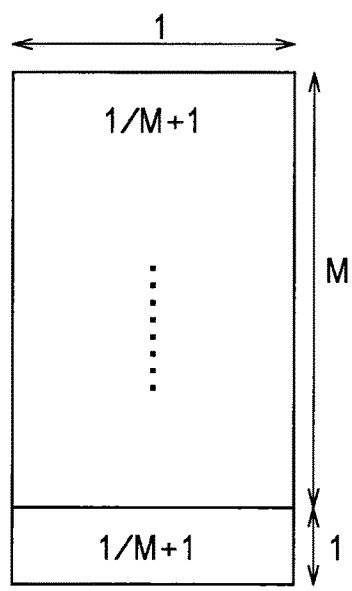
FIG. 23 is a diagram for describing an initial probability table for an unknown state addition model.

As illustrated in FIG. 23, the initial probability table is a table with (M+1) rows by one column wherein one state node that accepts unknown movement history data has been added to M state nodes of the existing model, and the initial probability of each state node is set to 1/(M+1) of an equally probability, for example.

In step S22, the unknown state node adding unit 222 generates a transition probability table for an unknown state addition model in which the transition probability of each state node of the unknown state addition model is stored.

Figure 24:
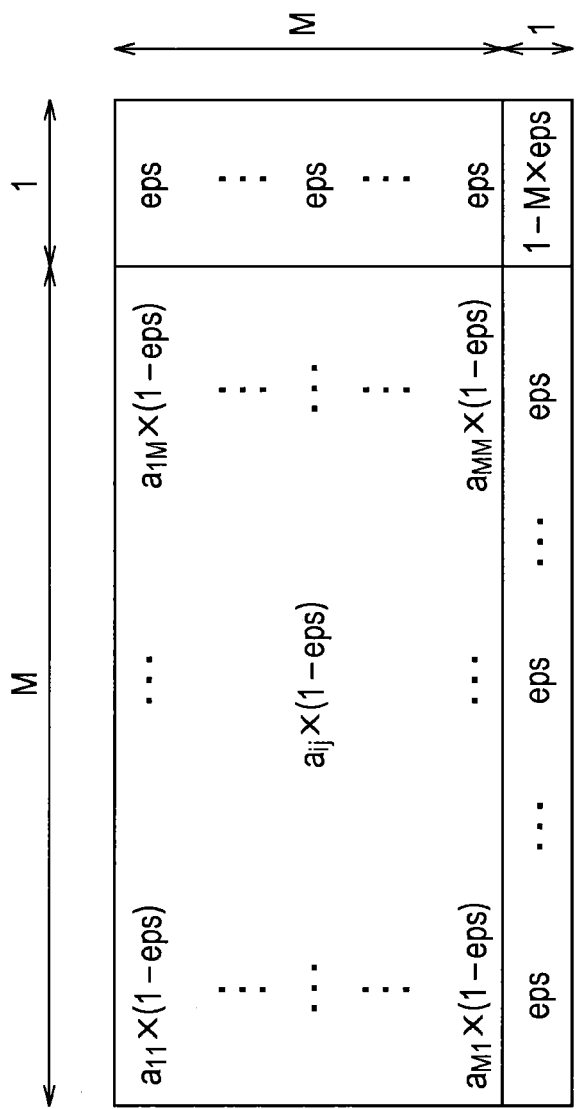
FIG. 24 is a diagram for describing a transition probability table for an unknown state addition model.

The transition probability table is configured of, as illustrated in FIG. 24, a table with (M+1) row by (M+1) columns. With the transition probability table, the state transition probability $a_{ij}$ between the states of the existing model of the first row and first column to the M-th row and M-th column is multiplied by (1-eps). Also, the eps is set to each element of the (M+1)-th column of the transition probability table excluding the lowest (M+1)-th row, and the eps is set to each element of the (M+1)-th row excluding the lowest (M+1)-th row. The eps mentioned here is, for example, around 1.0E-8, a sufficiently smaller predetermined value than 1, and is lower than any of the transition probabilities between state nodes of the existing model. With this unknown state addition model, it is represented that the eps is set to the transition probability of each state node of the existing model to an unknown state node, and the eps is also set to the transition probability from an unknown state node to each state node of the existing model. Also, the elements of the (M+1)-th row and (M+1)-th column represent the own transition probability of an unknown state node, and are (1−M×eps). With the unknown state addition model in FIG. 24, sum of the rows becomes 1.

In step S23, the unknown state node adding unit 222 generates a center value table for an unknown state addition model in which a center value $\mu_{si}(d)$ of the observation probability of each state node of the unknown state addition model is stored.

Figure 25:
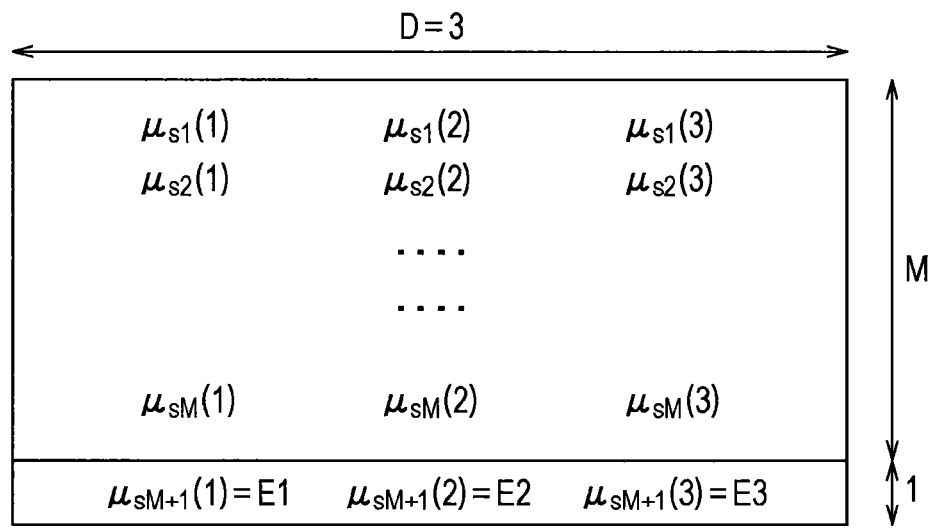
FIG. 25 is a diagram for describing a center-value table for an unknown state addition model.

FIG. 25 illustrates the center value table for an unknown state addition model to be generated in step S23. The number of columns of the center value table for an unknown state addition model corresponds to the number of dimensions D of movement history data, and the number of rows corresponds to the number of state nodes. Accordingly, with the present embodiment, the center value table for an unknown state addition model is configured of (M+1) rows and three columns. The center value table for an unknown state addition model has a form wherein one row of the center values $\mu_{sM+1}(1)=E1$, $\mu_{sM+1}(2)=E2$, and $\mu_{sM+1}(3)=E3$ of unknown state nodes is added to the center value table with M rows and D columns of the existing model as the (M+1)-th row.

Here, an optional value may be set to each of the E1, E2, and E3. For example, the E1 may be "12" that is the center value of values that point-in-time can take (0 hour to 24 hour), the E2 and E3 may be 0 that is the center value of values that the latitude and longitude can take (−180 to 180). Also, for example, each of the E1, E2, and E3 may be set to a mean value of the M center values $\mu_{s1}(d)$ to $\mu_{sM}(d)$ of the existing model.

In step S24, the unknown state node adding unit 222 generates a distributed value table for an unknown state addition model in which a distributed value $\sigma_{si}(d)'^2$ of the observation probability of each state node of the unknown state addition model is stored.

Figure 26:
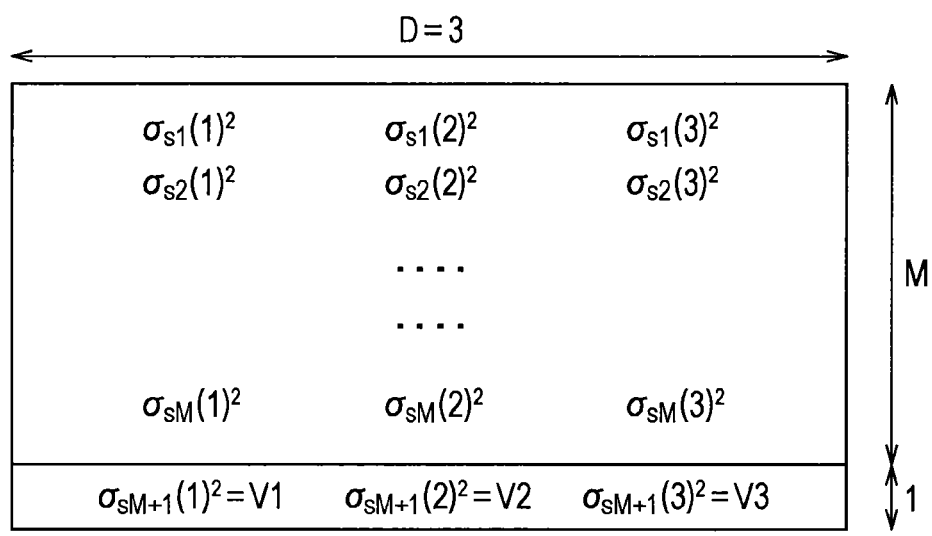
FIG. 26 is a diagram for describing a distributed-value table for an unknown state addition model.

FIG. 26 illustrates the distributed value table for an unknown state addition model to be generated in step S24. the number of columns of the distributed value table for an unknown state addition model corresponds to the number of dimensions D of movement history data, and the number of rows corresponds to the number of state nodes. Accordingly, with the present embodiment, the distributed value table for an unknown state addition model is configured of (M+1) rows three columns. The distributed value table for an unknown state addition model has a form wherein one row of the distributed values $\sigma_{sM+1}(1)^2=V1$, $\sigma_{sM+1}(2)^2=V2$, and $\sigma_{sM+1}(3)^2=V3$ of unknown state nodes is added to the distributed value table with M rows and D columns of the existing model as the (M+1)-th row.

Here, an optional value may be set to each of the V1, V2, and V3, but is preferably a greater value. For example, the V1 is set to a greater value than the square of "12" so as to cover a range that 0 hour to 24 hour can take. The V2 and V3 are set to a greater value than $180^2$ so as to cover a range that the latitude and longitude from −180 to 180 can take.

According to the above-mentioned processing, the parameters of an unknown state addition model are set and the unknown state addition model is constructed.

[Processing of State Node Estimating Unit 223]

Next, processing of the state node estimating unit 223 will be described.

The state node estimating unit 223 estimates a state node of the unknown state addition model corresponding to each three-dimensional data of the supplied movement history data using the Viterbi algorithm in which the unknown state addition model supplied from the unknown state node adding unit 222 is employed. In other words, the state node estimating unit 223 obtains the probability of the state node at each point-in-time using the Viterbi algorithm.

The Viterbi algorithm is an algorithm wherein the probability of the state node at each point-in-time is calculated using the observation probability at each point-in-time of time series data and the transition probability of the model, and also, series of state transition (state node series) is calculated so as to have the highest likelihood.

Probability $\delta(s_i, t)$ of state node $s_i$, at point-in-time t is successively obtained by the following Expressions (4) and (5).

$$\delta(s_j, o) = \frac{1}{(M+1)} \quad (4)$$

$$\delta(s_j, t) = \max[a_{ij} \cdot \delta(s_i, t-1) \cdot P(o_{t-1} | s_i)] \quad (5)$$

Expression (4) assumes that all states have appeared with a equally probability at point-in-time t=0. (M+1) is the number of all states after an unknown state node is added. $a_{ij}$ in Expression (5) is a transition probability from the state node $s_i$ to $s_j$. Also, $P(o_{t-1}|s_i)$ is a probability wherein three-dimensional data o is observed from the state node $s_i$ at point-in-time t−1. More specifically, this is probability density of a normal distribution wherein parameters $\mu_i$ and $\sigma_i$ determined for the state node $s_i$ are taken as the center and distribution respectively. In Expression (5), normalization regarding the state node $s_j$ is omitted.

With the Viterbi algorithm, in Expression (5), of the state node $s_i$ to the state node $S_i$, the state node $s_i$ whereby the value within the function in Expression (5) becomes the maximum, is selected. The state node $s_i$ ($s_{imax}$) thereof is stored to each state node $s_j$ at each point-in-time t.

After the state node $s_i$ that satisfying Expression (5) regarding the last point-in-time t in time series is selected, state node series having the highest likelihood is calculated by tracing the following Expression (6) in reverse time series.

$$\psi(s_j, t) = \operatorname{argmax}[a_{ij} \cdot \delta(s_i, t-1) \cdot P(o_{t-1}|s_i)] \quad (6)$$

For the above-mentioned common Viterbi algorithm, with the state node estimating unit 223, the following Expression (7) is employed for an observation probability at each point-in-time of times series data. In other words, the following Expression (7) is employed as $P(o_{t-1}|s_i)$ in Expression (5) and Expression (6).

$$P(o_t, e_t | s_i) = \frac{1}{\sqrt{2\pi(\sigma_i^2 + e_t^2)}} \exp\left(-\frac{(o_t - \mu_i)^2}{2(\sigma_i^2 + e_t^2)}\right) \quad (7)$$

Here, $e_t$ is error (virtual error) when the three-dimensional data $o_t$ observed at point-in-time t is interpolated data, and in Expression (7), if the prediction system 1 outputs an error range thereof, a value thereof is directly employed. The virtual error $e_t$ can be calculated by the following Expression (8), for example.

$$e_t = \min(|x_t^{virtual} - x_{T_1}^{real}|, |x_t^{virtual} - x_{T_2}^{real}|) \quad (8)$$

Expression (8) represents that the virtual error $e_t$ is set to any smaller one of distance between interpolated data $x_t$ and three-dimensional data $x^{real}_{T_1}$ at point-in-time T1 immediately before data missing, or distance between the interpolated data $x_t$ and three-dimensional data $x^{real}_{T_2}$ at point-in-time $T_2$ immediately after data restoration.

Figure 27:
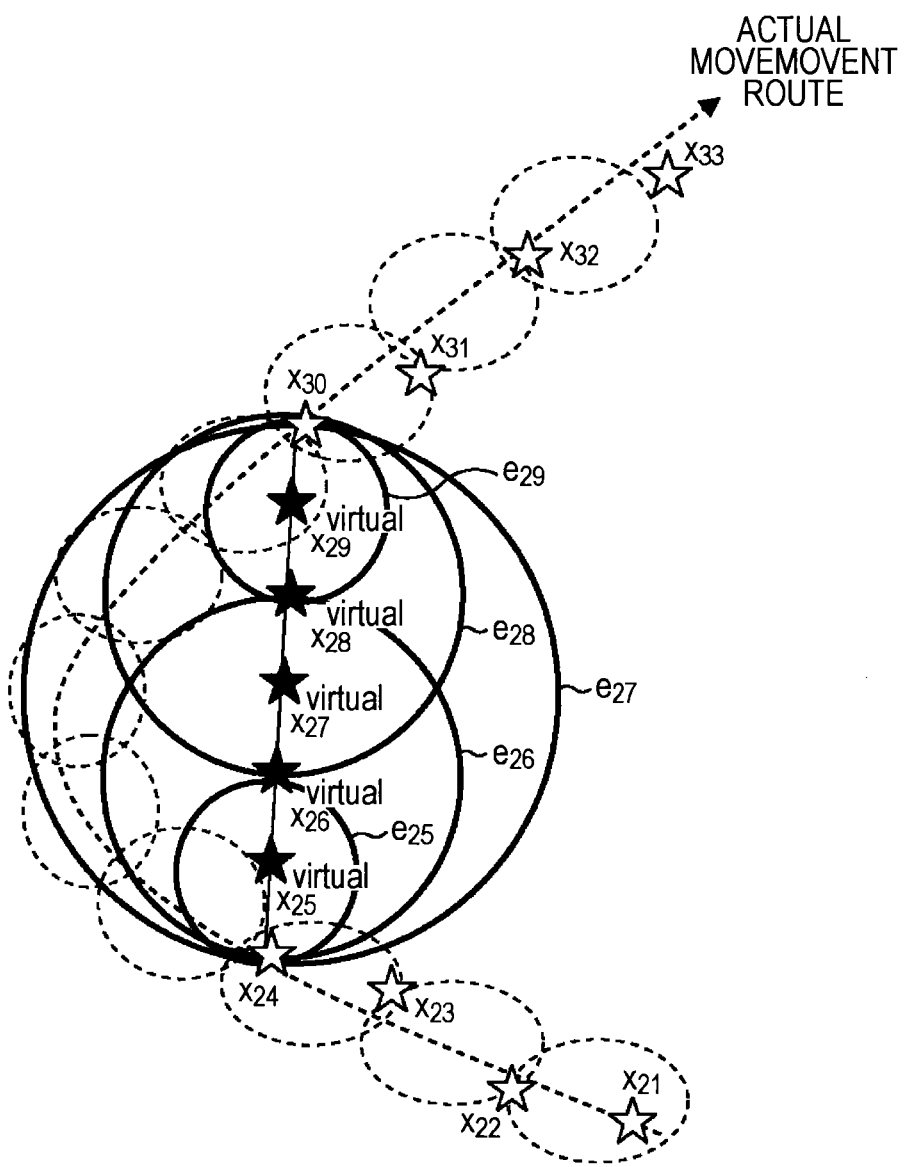
FIG. 27 is an image diagram of virtual error in linear interpolation processing.

FIG. 27 is an image diagram of the virtual error $e_t$ to be calculated by Expression (8).

In FIG. 27, a dashed line arrow indicates an actual movement route, and an elliptic dashed line indicates the state node $s_i$ to be represented with the parameters $\mu_i$ and $\sigma_i$.

Also, in FIG. 27, three-dimensional data (movement history data) $x_{21}$ to $x_{33}$ from point-in-time $t_{21}$ to point-in-time $t_{33}$ is illustrated. Of these, three-dimensional data $x_{21}$ to $x_{24}$ and $x_{30}$ to $x_{33}$ indicated with white star marks (☆) is actual data actually obtained by the sensor device.

On the other hand, three-dimensional data $X^{virtual}_{25}$ to $x^{virtual}_{29}$ indicated with black star marks (★) is a data mission portion, and is interpolated data generated by linear interpolation. For this interpolated data $x^{virtual}_{25}$ to $x^{virtual}_{29}$, the virtual errors $e_{25}$ to $e_{29}$ calculated by Expression (8) are indicated with heavy line circles.

In Expression (8), the further away from the actual data, the greater the virtual error $e_t$ set is.

In the event that time-series data to be obtained (three-dimensional data) is missing, the probability $\delta(s_i, t)$ of the state node $s_i$ at the missing point-in-time t cannot be generated, and accordingly, the Viterbi algorithm cannot be executed. However, the missing three-dimensional data is filled with the linear-interpolated data, whereby the problem itself that the probability $\delta(s_i, t)$ of the state node $s_i$ cannot be generated, can be solved.

However, there may be conceived a case where even when there is data itself in linear interpolation, the generated data thereof deviates from the correct route, and cannot be expressed with a probability model (learning model). Specifically, the data generated in the linear interpolation does not approximate to any state node $s_i$ in the probability model, and accordingly, there may be conceived a case where the observation probability $P(o_{t-1}|s_i)$ becomes a smaller (exponentially smaller) value with any state node. As a result thereof, the maximum likelihood state transition cannot be selected, and the Viterbi algorithm collapses, and the state node series itself cannot be output.

This, with the example in FIG. 27, may be understood from the interpolated data $x^{virtual}_{25}$ to $x^{virtual}_{29}$ deviating from not only the actual movement route but also the ellipse of a state node that represents the behavioral model.

Therefore, the state node estimating unit 223 calculates the virtual error $e_t$ for the interpolated three-dimensional data $x_t$, and employs the observation probability $P(o_t, e_t|s_i)$ using the virtual error $e_t$ in Expression (7). As a result thereof, even when the interpolated data $o_t$ according to linear interpolation greatly deviates from the center $\mu_i$ of the actually corresponding state node $s_i$, the virtual error $e_t$ at that time is great, and accordingly, the absolute value of the value within the exponential function in Expression (7) decreases. As a result thereof, even when the interpolated data $o_t$ according to linear interpolation greatly deviates from the center $\mu_i$ of the actual state node $s_i$, the value is not exponentially decreased, and accordingly, the maximum likelihood state transition regarding the data missing portion can be estimated.

With the example in FIG. 27, an advantage for employing the virtual error $e_t$ is represented with the circle that indicates the virtual error $e_t$ entering the ellipse of the state node corresponding to the actual movement route.

Note that, with the above-mentioned example, the virtual error $e_t$ has been obtained by Expression (8) based on the actual data before and after data missing, but the calculating method of the virtual error $e_t$ is not restricted to this.

[Calculation of Observation Likelihood of Likelihood-by-Sample Calculating Unit 224]

Next, calculation of observation likelihood that the likelihood-by-sample calculating unit 224 performs will be described.

The likelihood-by-sample calculating unit 224 calculates the observation likelihood expected value L(t) serving as an index to be used for known/unknown determination. The observation likelihood expected value L(t) can be calculated by the following Expression (9) that represents the likelihood of the Viterbi-estimated state node.

$$L(t) = \sum_{i=1}^{M+1} \{\delta(s_i, t) \cdot P(o_t, e_t | s_i)\} \quad (9)$$

Also, the observation likelihood expected value L(t) can be calculated by Expression (10) changed from Expression (9) so as to save computation resources such as computation speed, work memory, and so forth. Expression (10) may be referred to as the likelihood expected value of the Viterbi-estimated state node.

$$L(t) = P(o_t, e_t | s_i) \quad (10)$$

The observation probability $P(o_t, e_t|s_i)$ included in Expression (9) and Expression (10) is calculated by the above-mentioned Expression (7). However, the observation probability $P(o_t, e_t|s_i)$ in Expression (7) becomes rather greater than the normal value since in addition to the normal distribution $\sigma_i^2$, the virtual error $e_t^2$ is added to the denominator. In other words, the observation probability $P(o_t, e_t|s_i)$ of the data missing portion tends to decrease in the event that the three-dimensional data is included in the distribution range of the state node.

As a result thereof, a situation occurs wherein even when there is a state node that originally adapts to the three-dimensional data of the data missing portion, the observation likelihood expected value L(t) decreases, and is determined to be unknown.

Therefore, the likelihood-by-sample calculating unit 224 performs correction for preventing the observation likelihood expected value L(t) of the data missing portion which is known from being determined to be unknown. In other words, the likelihood-by-sample calculating unit 224 employs observation likelihood corrected so that the observation likelihood is greater than the actual data regarding the data missing portion.

For example, the likelihood-by-sample calculating unit 224 calculates the observation likelihood expected value L(t) represented by the following Expression (11) instead of Expression (10). The observation likelihood expected value L(t) in Expression (11) has a form wherein the virtual error $e_t^2$ in the denominator that the observation probability $P(o_t, e_t|s_i)$ affects little since the virtual error $e_t^2$ exists, is omitted.

$$L1(t) = P'(o_t, e_t | s_i) = \frac{1}{\sqrt{2\pi\sigma_i^2}} \exp\left(-\frac{(o_t - \mu_i)^2}{2(\sigma_i^2 + e_t^2)}\right) \quad (11)$$

Alternatively, the likelihood-by-sample calculating unit 224 employs an expression obtained by multiplying the above-mentioned Expression (9) or Expression (10) by a correction term in monotone increase for the virtual error $e_t$ $(a+b \cdot e_t)$. Specifically, the likelihood-by-sample calculating unit 224 employs an observation likelihood expected value L2(t) or L3(t) represented by Expression (12) or Expression (13).

$$L2(t) = (a + b \cdot e_t) \sum_{i=1}^{M+1} \{\delta(s_i, t) \cdot P(o_t, e_t | s_i)\} \quad (12)$$

$$L3(t) = (a + b \cdot e_t) P(o_t, e_t | s_i) \quad (13)$$

Even when the observation probability $P(o_t, e_t|s_i)$ deteriorates due to the virtual error $e_t$ by employing the observation likelihood expected value of one of Expression (11) to Expression (13) instead of Expression (9) or Expression (10), the expected value can be less readily determined to be unknown. Hereinafter, in the event of the observation likelihood expected values L1(t) to L3(t) being not particularly distinguished, these will be referred to as the observation likelihood expected value L(t)'.

The observation likelihood expected value L(t)' to be computed by one of Expression (11) to Expression (13) increases if observed data can be sufficiently explained by an unknown state addition model. On the other hand, in the event that observed data cannot be sufficiently explained by an unknown state addition model, and in the event that observed data is explained by an unknown state node, the observation likelihood expected value L(t)' decreases. Accordingly, known or unknown determination can be performed with the magnitude of the observation likelihood expected value L(t)'. Note that, hereinafter, the observation likelihood expected value L(t)' will simply be referred to as observation likelihood L(t)'.

[Observation Likelihood Calculation Processing of Likelihood-by-Sample Calculating Unit 224]

Figure 28:
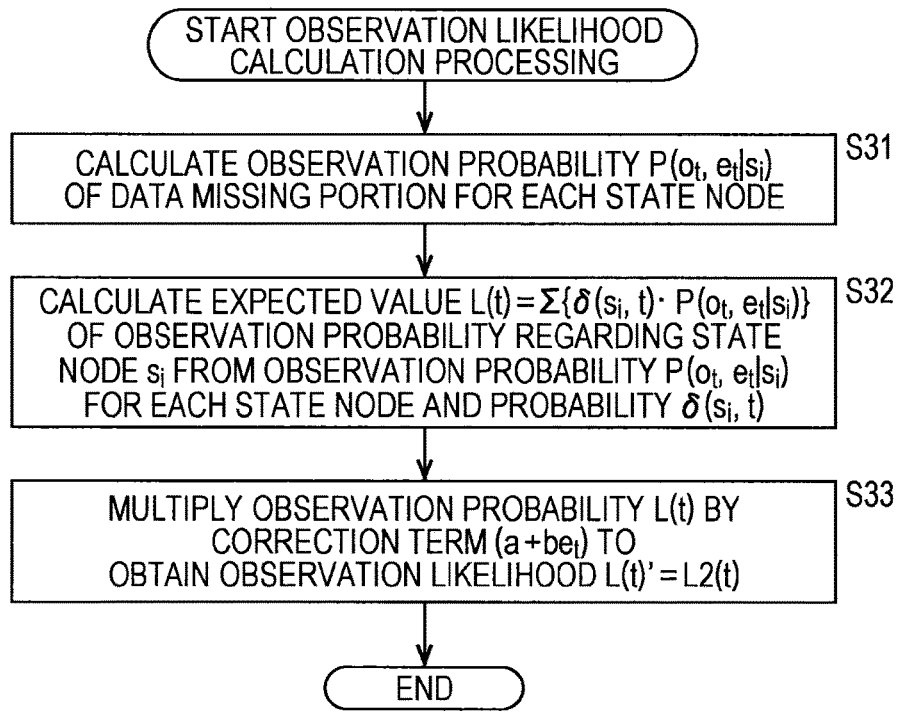
FIG. 28 is a flowchart for describing observation likelihood calculation processing.

FIG. 28 is a flowchart of the observation likelihood calculation processing by the likelihood-by-sample calculating unit 224.

First, in step S31, the likelihood-by-sample calculating unit 224 calculates the observation probability $P(o_t, e_t|s_i)$ of the data missing portion for each state node.

In step S32, the likelihood-by-sample calculating unit 224 obtains the observation likelihood L(t) regarding the state node $s_i$ from the observation probability $P(o_t, e_t|s_i)$ and probability $\delta(s_i, t)$ for each state node. Now, let us say that the observation likelihood L(t) represented by Expression (9) can be obtained as the observation likelihood L(t) regarding the state node $s_i$, for example.

In step S33, the likelihood-by-sample calculating unit 224 obtains the observation likelihood L(t)'=L2(t) by multiplying the observation likelihood L(t) represented by Expression (9) by a correction term (a+b $e_t$). The obtained observation likelihood L(t)' is supplied to the known/unknown determining unit 226 on the subsequent stage, and the processing is ended.

[Known/Unknown Determination Processing of Known/Unknown Determining Unit 226]

Figure 29:
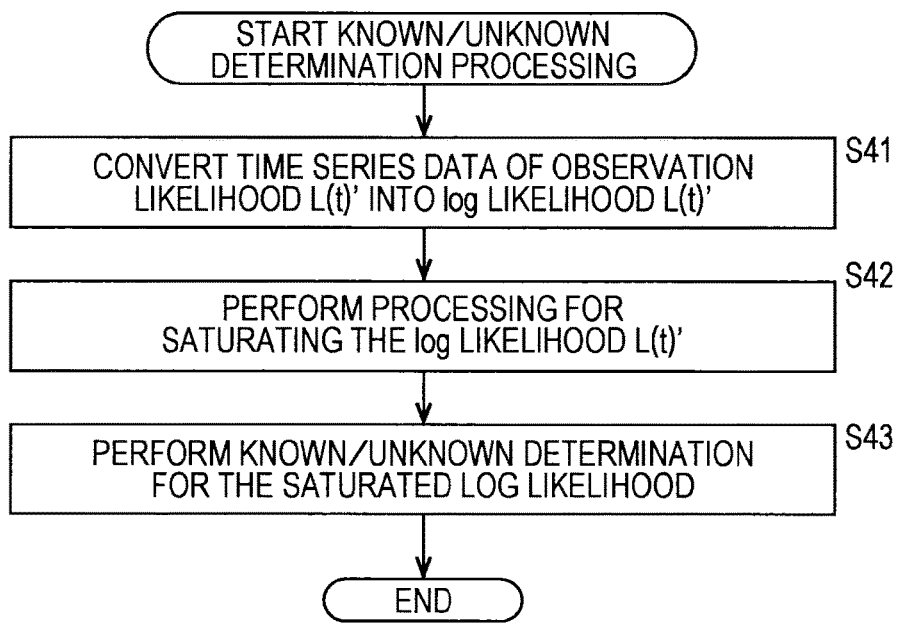
FIG. 29 is a flowchart for describing known/unknown determination processing.

Next, description will be made regarding the known/unknown determination processing of the known/unknown determining unit 226 wherein known or unknown determination is performed using the observation likelihood L(t)' calculated by the likelihood-by-sample calculating unit 224, with reference to the flowchart in FIG. 29.

First, in step S41, the known/unknown determining unit 226 obtains time series data of the observation likelihood L(t)' corresponding to node series data from the likelihood-by-sample calculating unit 224. The known/unknown determining unit 226 then converts each time series data of the observation likelihood L(t)' into logarithmic likelihood log L(t)'. Specifically, the known/unknown determining unit 226 calculates the logarithm of the observation likelihood L(t)' at each point-in-time t.

In step S42, the known/unknown determining unit 226 performs processing for obtaining saturation logarithmic likelihood saturated from the logarithmic likelihood log L(t)'. Specifically, the known/unknown determining unit 226 subtracts a predetermined offset (threshold) from the logarithmic likelihood log L(t)', divides this result by a predetermined value, and inputs this result to a tan h function, thereby saturating the logarithmic likelihood log L(t)'. According to the processing in steps S41 and S42, the observation likelihood L(t)' is converted into a parameter that takes a range of −1 to 1.

In step S43, the known/unknown determining unit 226 performs Viterbi determination using an HMM made up of two states of known and unknown states, thereby performing known/unknown determination on the saturation logarithmic likelihood.

The HMM made up of two states of known and unknown states are represented by the following Expression (14).

$$\pi = \frac{1}{2}\begin{pmatrix}1\\1\end{pmatrix}, A = \begin{pmatrix}1-\varepsilon & \varepsilon\\ \varepsilon & 1-\varepsilon\end{pmatrix}, \mu = \begin{pmatrix}1\\-1\end{pmatrix}, \sigma^2 = \begin{pmatrix}1\\1\end{pmatrix} \quad (14)$$

Specifically, the initial probabilities π of a known state and an unknown state are both the same probability (0.5). Also, in the event of considering the user's movement history, it is quite unlikely to conceive that a known state and an unknown state are frequently switched, and it is likely to conceive that in the event of moving in a known route, and also in the event of moving in an unknown route as well, the state after switching continues to some extent. Accordingly, the transition probability A is set so as to increase a self transition probability in each of a known state and an unknown state with a predetermined very smaller value than 1 as ε. As an observation probability, the known state is distributed with 1 as the center, and the known state is distributed with −1 as the center, and 1 is set as a distributed value.

[Detailed Configuration Example of New Model Generating Unit 202]

Next, details of the new model generating unit 202 will be described.

Figure 30:
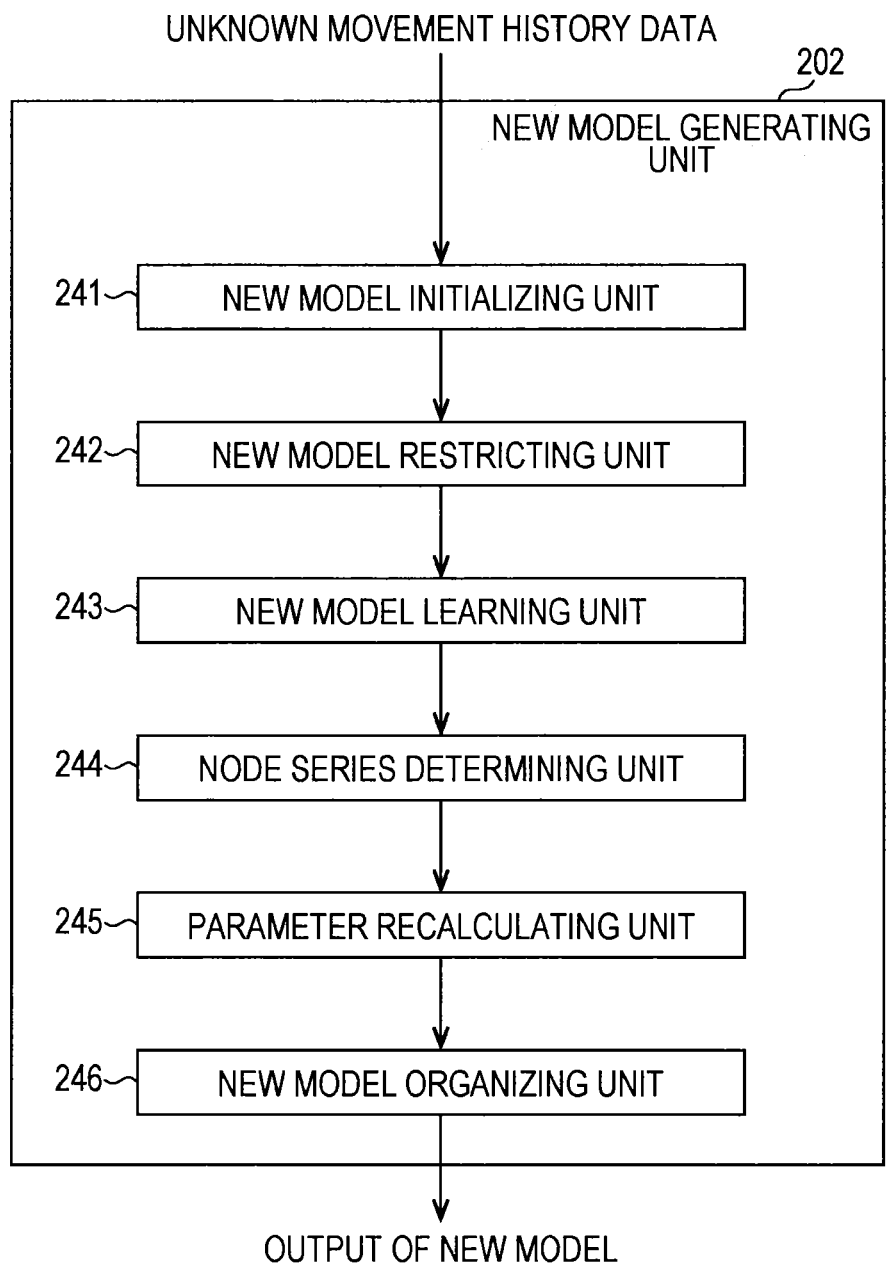
FIG. 30 is a block diagram illustrating a detailed configuration example of a new model generating unit.

FIG. 30 is a block diagram illustrating a detailed configuration example of the new model generating unit 202.

The new model generating unit 202 is configured of a new model initializing unit 241, a new model restricting unit 242, a new model learning unit 243, a node series determining unit 244, a parameter recalculating unit 245, and a new model organizing unit 246.

Unknown movement history data is supplied from the known/unknown determining unit 201 to the new model generating unit 202. Also, in the event that unknown movement history data is connected to known movement history data, state nodes of the existing model before and after the unknown movement history data are also supplied. The unknown movement history data and the state nodes of the existing model ahead and behind thereof to be supplied from the known/unknown determining unit 201 can be obtained by each unit of the new model generating unit 202 according to need.

The new model initializing unit 241 proclaims (secures memory to generate) HMMs of the same number of state nodes as the number of samples of the supplied unknown movement history data as new models.

The new model restricting unit 242 sets a Left-to-right restriction to the new models proclaimed at the new model initializing unit 241. This is because one-time moving behavior has a strong unidirectional restriction, and also, even if there is no unidirectional property in a moving direction, time constantly has a unidirectional property.

The new model learning unit 243 learns a new model using unknown movement history data. Specifically, the new model learning unit 243 obtains parameters of an HMM to which the left-to-right restriction that represents a new model has been applied, using the unknown movement history data supplied from the known/unknown determining unit 201.

The node series determining unit 244 uses a new model obtained by learning of the new model learning unit 243 to generate node series data in which each three-dimensional data of the unknown movement history data has been converted into the state node $s_i$ of the new model, and to supply this to the parameter recalculating unit 245. Specifically, the node series determining unit 244 repeats processing to recognize the user's current state node $s_i$ corresponding to the input user's point-in-time, latitude, and longitude from a new model based on the parameters supplied from the new model learning unit 243 from the first step to the last step of the unknown movement history data.

The parameter recalculating unit 245 calculates parameters of the node series data corresponding to the parameters of an HMM of movement history data based on the node series data supplied from the node series determining unit 244. Specifically, the parameter recalculating unit 245 calculates the initial probability $\langle \pi_i \rangle$, state transition probability $\langle a_{ij} \rangle$, and observation probability (center value $\langle \mu_i \rangle$ and distributed value $\langle \sigma_i^2 \rangle$) of node series data, corresponding to the initial probability $\pi_i$, state transition probability $a_{ij}$, and observation probability (center value $\mu_i$ and distributed value $\sigma_i^2$) of the HMM of the unknown movement history data. Hereinafter, the initial probability $\pi_i$, state transition probability $a_{ij}$, and observation probability (center value $\mu_i$ and distributed value $\sigma_i^2$) surrounded with "< >" represent recalculated parameters of the node series data.

Also, the parameter recalculating unit 245 calculates transition frequency $\langle \text{trans\_cnt}_{ij} \rangle$ of each state transition and state frequency $\langle \text{cnt\_all}_i \rangle$ and state initial frequency $\langle \text{cnt\_start}_i \rangle$ of each state node Si beforehand.

Here, the transition frequency $\langle \text{trans\_cnt}_{ij} \rangle$ represents frequency (count value) of transition from the state node $s_i$ to the state node $s_j$, and i=1 to N, j=1 to N (N is the last node number (=the number of nodes) of time series data). The state frequency $\langle \text{cnt\_all}_i \rangle$ is a total number of the state nodes $s_i$ in all of node series data, and the state initial frequency $\langle \text{cnt\_start}_i \rangle$ is the number of node series data of which the top is the state node $s_i$.

In general, the initial probability $\pi_{i\_update}$, state transition probability $a_{ij\_update}$, and the center value $\mu_{i\_update}$ and distributed value $\sigma_{i\_update}^2$ of the observation probability may be represented as follows.

$$\mu_{i\_update} = \frac{\mu_{i\_current} \cdot n_{i\_current} + \mu_{i\_new} \cdot n_{i\_new}}{n_{i\_current} + n_{i\_new}}$$

$$\sigma_{i\_update}^2 + \mu_{i\_update}^2 =$$

$$\frac{(\sigma_{i\_current}^2 + \mu_{i\_current}^2) \cdot n_{i\_current} + (\sigma_{i\_new}^2 + \mu_{i\_new}^2) \cdot n_{i\_new}}{n_{i\_current} + n_{i\_new}}$$

$$\pi_{i\_update} = \frac{\pi_{i\_current} \cdot n_{i\_current} + \pi_{i\_new} \cdot n_{i\_new}}{n_{i\_current} + n_{i\_new}}$$

$$a_{ij\_update} = \frac{a_{ij\_current} \cdot n_{i\_current} + a_{ij\_new} \cdot n_{i\_new}}{n_{i\_current} + n_{i\_new}}$$

The $\pi_{i\_current}$, $a_{ij\_current}$, and $\mu_{i\_current}$ and $\sigma_{i\_current}^2$ are initial probability, state transition probability, and center value and distributed value of the observation probability of the state node $s_i$ of existing node series data. Also, $\pi_{i\_new}$, $a_{ij\_new}$, and $\mu_{i\_new}$ and $\sigma_{i\_new}^2$ are initial probability, state transition probability, and center value and distributed value of the observation probability of the state node $s_i$ of additional node series data. $n_{i\_current}$ and $n_{i\_new}$ are the number of nodes of an existing portion and the number of nodes of an additional portion of the state node $s_i$ of node series data.

Accordingly, the parameter recalculating unit 245 calculates and stores the transition frequency $\langle \text{trans\_cnt}_{ij} \rangle$ of each state transition, and the state frequency $\langle \text{cnt\_all}_i \rangle$ and state initial frequency $\langle \text{cnt\_start}_i \rangle$ of each state node $s_i$, thereby facilitating next updating calculation.

Note that non-integer components can be handled by stochastically counting frequency instead of calculating and storing frequency. Further, a parameter such as frequency× mean value or frequency×distributed value may be stored instead of frequency.

The parameter recalculating unit 245 calculates node series data count $\langle \text{seq\_cnt} \rangle$ that is sum of node series data to be supplied from the node series determining unit 244 along with the state initial frequency $\langle \text{cnt\_start}_i \rangle$.

The new model organizing unit 246 deletes an unused state node of the state nodes $s_i$ of an HMM serving as a new model declared by the new model initializing unit 241, thereby organizing the new model. Specifically, the new model organizing unit 246 deletes the state nodes $s_i$ having the state frequency $\langle \text{cnt\_all}_i \rangle$ calculated by the parameter recalculating unit 245 of 0. (The parameters of) the new model organized by the new model organizing unit 246 are output to the new model connecting unit 203. Also, in the event that state nodes of the existing model before and after unknown movement history data have been supplied from the known/unknown determining unit 201, these are also output to the new model connecting unit 203 together.

[Learning Processing of New Model Learning Unit 243]

Next, learning processing of the new model learning unit 243 will be described with reference to FIG. 31 to FIG. 34.

First, description will be made regarding difference between a learning model by a common HMM and a learning model to be performed by the new model learning unit 243, with reference to FIG. 31 and FIG. 32.

In the event of modeling the user's movement history in a distributed state as with an HMM, data obtained by sampling a movement route with a certain time interval is usually modeled. At the time of obtaining the data of movement history, in the event of obtaining insufficient samples since the sampling interval cannot be shortened due to a request for power saving or the like, a situation may occur wherein the number of samples and the number of nodes are almost equal, or the number of samples is less than the number of nodes. In such a situation, in the event of assuming a state node where data to be observed is normally distributed around a predetermined location, one sample can be modeled by one node. In this case, the distributed value of the node converges on a very small value (or 0), and consequently, neighborhood of the sample is not modeled. Accordingly, a route between sampled samples is not modeled.

Figure 31:
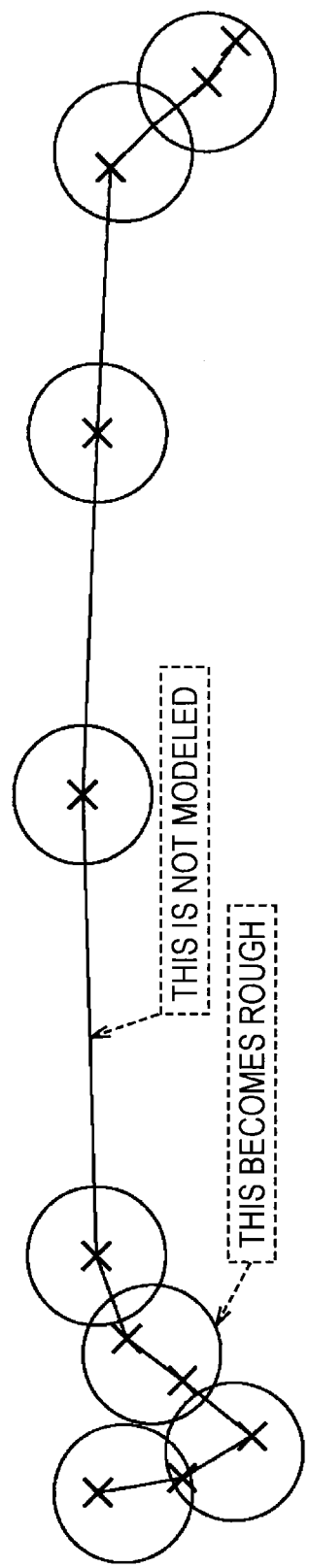
FIG. 31 is a diagram for describing difference between a learning model by an ordinary HMM, and a learning model by a new model learning unit.

FIG. 31 illustrates a conceptual diagram when modeling movement history using a common HMM. A straight line (line segment) in FIG. 31 indicates the user's actual movement route, an x-mark (x) indicates a sample obtained as movement history data, and a circle (○) surrounding a sample indicates a node.

As illustrated in FIG. 31, a location (region) where no sample has been obtained around is not modeled, and accordingly, in the event of moving at high speed such as a train, a route between samples is not modeled. On the other hand, in the event of moving at slow speed such as walk, multiple samples can be modeled by one node. In such a case, movement history may not suitably be expressed by the node.

Also, in the event of passing through the same movement route twice, when the distributed value of the node converges on a very small value (or 0), a position passed through at the second time may not be modeled by the node expressed at the time of the first passing, and may be assigned with a different node.

In order to avoid such a problem, it may be conceived to set a lower limit to the distributed value of the node, a route of a predetermined region from a sample is necessarily modeled.

However, when the distributed value is increased, a possibility that different routes will be regarded as the same route is increased. For example, different routes that advance in parallel might be regarded as the same route. Further, when the distributed value is increased, it becomes difficult to reproduce movement history data at the time of slow moving speed with high precision. Conversely, when the distributed value is too small, movement history data at the time of fast moving speed cannot be recognized as the same route. Samples of actual movement history data exhibit various distance senses due to difference of moving speed, and accordingly, it is difficult to determine a lower limit of the distributed value of a node adapted to all.

Figure 32:
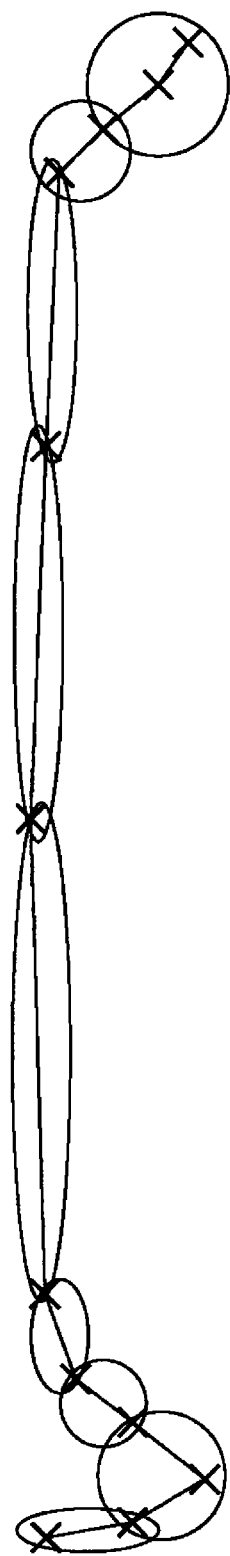
FIG. 32 is a diagram for describing difference between a learning model by an ordinary HMM, and a learning model by a new model learning unit.

Therefore, the new model learning unit 243 models a route between samples, as illustrated in FIG. 32, by assuming a model such that one state node necessarily reflects consecutive two samples worth. With the entire new model, the new model learning unit 243 performs modeling by each node sequentially connecting two consecutive samples. Thus, the regions of the entire route can be expressed with a new model without exception so as to be linked with a chain.

Also, even if an interval between samples is long, modeling is performed so as to include between two samples, and accordingly, the distributed value of a node can be set so as to be small. Conversely, modeling can be performed even when an interval between samples is short, and accordingly, scale-free modeling can be realized.

Note that, as will be described later, the new model learning unit 243 may perform modeling so that one state node reflects consecutive three or more samples, and accordingly, whether to perform modeling so that one state node reflects several samples can be determined as appropriate.

Figure 33:
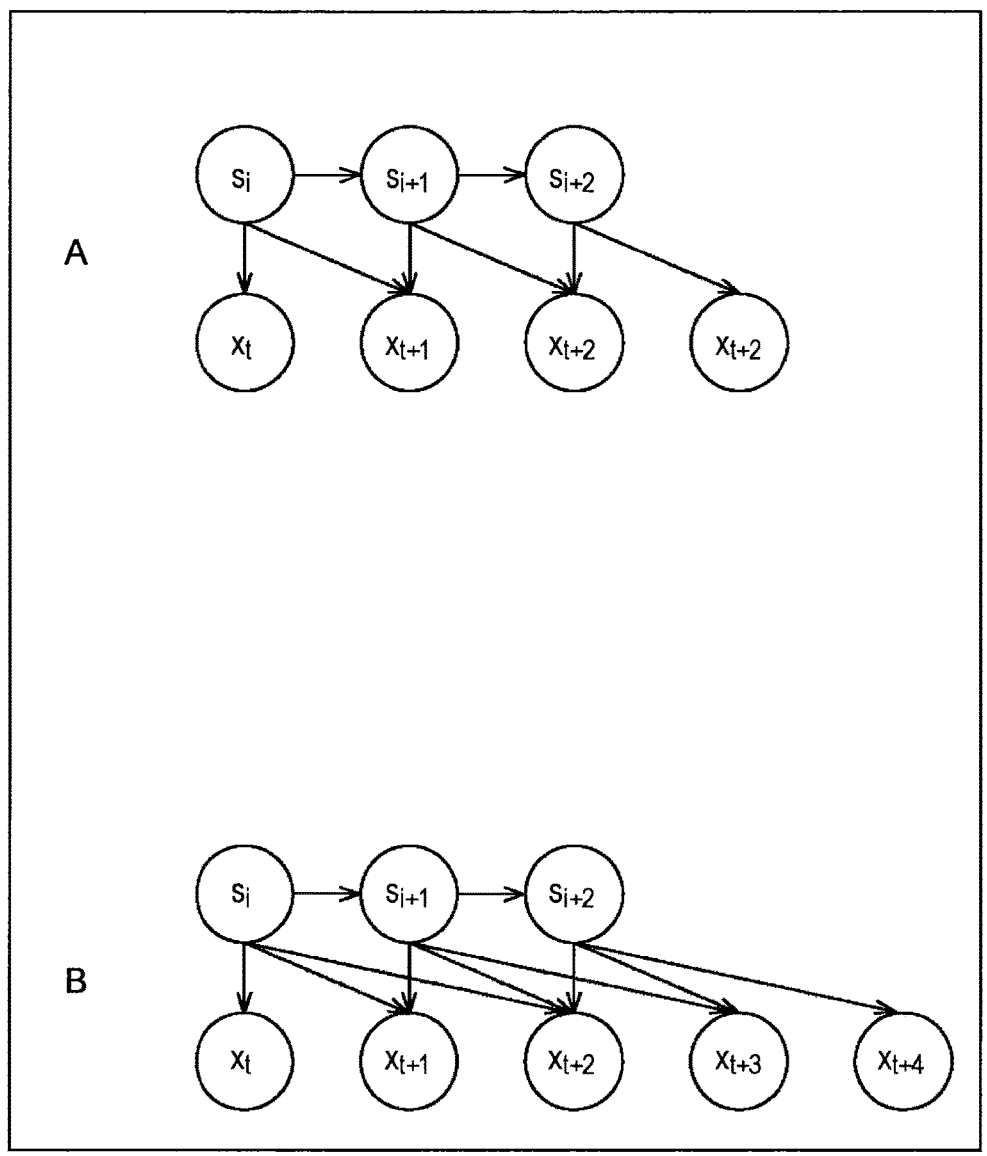
FIG. 33 is a diagram representing a learning model of the new model learning unit using a graphical model.

FIG. 33 represents a learning model of the new model learning unit 243 with a graphical model.

A learning model in A in FIG. 33 is a model for a certain state node in the present observing the current data, and two samples one ahead (one behind). With A in FIG. 33, an arrow from one state node exists in the bottom and lower right, but a model where there is an arrow directing downward and lower left can be employed.

Note that, with the present embodiment, a model is employed wherein one state node expresses two consecutive samples as illustrated in FIG. 32, but a model may also be employed wherein one state node expresses three or more consecutive samples. A model in B in FIG. 33 is a graphical model which is a model where one state node expresses three consecutive samples.

[New Model Learning Processing of New Model Learning Unit 243]

Figure 34:
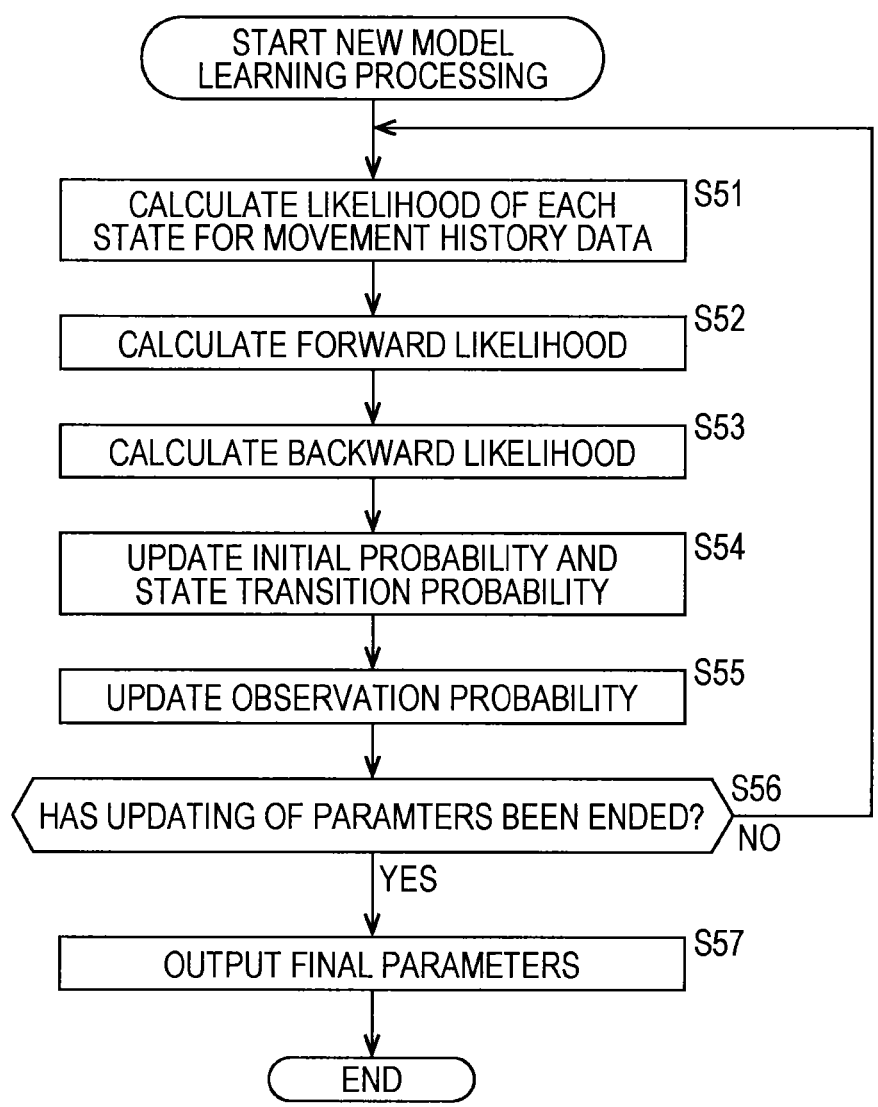
FIG. 34 is a flowchart for describing new model learning processing of the new model learning unit.

Next, new model learning processing of the new model learning unit 243 will be described with reference to the flowchart in FIG. 34.

First, in step S51, the new model learning unit 243 calculates likelihood of each state for unknown movement history data. Specifically, the new model learning unit 243 calculates observation likelihood $P(x_t, x_{t+1}|s_i)$ assuming that two samples of movement history data, and data $x_t$ in a position at point-in-time t and data $x_{t+1}$ in a position at point-in-time t+1 are output at the time of transition to the state $s_i$ of an HMM that represents the user's activity model, using the following Expression (15).

$$P(x_t, x_{t+1}|s_i) = N(x_t(1)|\mu_{si}(1), \sigma_{si}(1)^2) \cdot N(x_{t+1}(1)|\mu_{si}(1), \sigma_{si}(1)^2) \times \quad (15)$$
$$N(x_t(2)|\mu_{si}(2), \sigma_{si}(2)^2) \cdot N(x_{t+1}(2)|\mu_{si}(2), \sigma_{si}(2)^2) \times$$
$$N(x_t(3)|\mu_{si}(3), \sigma_{si}(3)^2) \cdot N(x_{t+1}(3)|\mu_{si}(3), \sigma_{si}(3)^2)$$

Note that the point-in-time t does not represent measurement point-in-time of time series data but the order of time series data (number of steps), and takes a value from 1 to T (number of samples of time series data). Also, let us say that $x_t(1)$, $x_t(2)$, and $x_t(3)$ in Expression (15) represent point-in-time, latitude, and longitude of movement history data $x_t$, respectively. Further, let us say that N( ) in Expression (5) represents a single normal distribution, and $\mu_{si}(1)$ and $\sigma_{si}(1)^2$ represent the center value and distributed value of the single normal distribution of point-in-time. Also, let us say that $\mu_{si}(2)$ and $\sigma_{si}(2)^2$ represent the center value and distributed value of the single normal distribution of latitude, and $\mu_{si}(3)$ and $\sigma_{si}(3)^2$ represent the center value and distributed value of the single normal distribution of longitude.

The observation likelihood $P(x_t, x_{t+1}|s_i)$ is a simultaneous distribution between the original time series data and time series data that deviates by one, and accordingly, this becomes product of each observation series distribution.

Note that observation likelihood $P(x_t, \ldots, x_{t+W}|s_i)$ of a model where one state node expresses W or more consecutive samples can be represented by the following Expression (16). It goes without saying that this can be generalized to a greater value than the number of dimensions D of time series data.

$$P(x_t, \ldots, x_{t+w}|s_i) = \quad (16)$$
$$\prod_{w=1}^{W} N(x_{t+w-1}(1)|\mu_{si}(1), \sigma_{si}(1)^2) \times \prod_{w=1}^{W} N(x_{t+w-1}(2)|\mu_{si}(2),$$
$$\sigma_{si}(2)^2) \times \prod_{w=1}^{W} N(x_{t+w-1}(3)|\mu_{si}(3), \sigma_{si}(3)^2)$$

In step S51, with regard to combinations of all of the states $s_i$ and three-dimensional data $x_t$, the observation likelihood $P(x_t, x_{t+1}|s_i)$ by Expression (15) is calculated by the new model learning unit 243.

Next, in step S52, the new model learning unit 243 calculates forward likelihood $\alpha_t(s_i)$ of all of the states $s_i$ at each point-in-time t. Specifically, the new model learning unit 243 sequentially calculates the forward likelihood $\alpha_t(s_i)$ of the states $s_i$ at point-in-time t from point-in-time 1 to the final point-in-time T using the following Expression (17) and Expression (18).

$$\alpha_1(s_i) = \pi_{si} \quad (17)$$

$$\alpha_t(s_i) = \sum_{j=1}^{M} \alpha_{t-1}(s_j) a_{ji} P(x_t, x_{t+1} | s_i) \quad (18)$$

Note that $\pi_{si}$ in Expression (17) represents the initial probability of the state $s_i$. Also, $a_{ji}$ in Expression (18) represents a state transition probability from the state $s_j$ to the state $s_i$. Note that the initial values of the initial probability $\pi_{si}$ and state transition probability $a_{ji}$ are externally provided, for example.

In step S53, the new model learning unit 243 calculates backward likelihood $\beta_t(s_i)$ of all of the states $s_i$ at each point-in-time t. Specifically, the new model learning unit 243 calculates the backward likelihood $\beta_t(s_i)$ of the states $s_i$ at point-in-time t from the final point-in-time T to the point-in-time 1 in a reverse order using the following Expression (19) and Expression (20).

$$\beta_T(s_i) = \frac{1}{M} \quad (19)$$

$$\beta_t(s_i) = \sum_{j=1}^{M} a_{ij} P(x_t, x_{t+1} | s_i) \beta_{t+1}(s_j) \quad (20)$$

In Expression (19), let us say that a probability that the state at point-in-time T will become each of the states $s_i$ has the same value.

In this manner, according to the processing in steps S51 to S53, various types of likelihood of a hidden Markov model for movement history data are calculated.

In step S54, the new model learning unit 243 updates the initial probability and state transition probability. Specifically, the new model learning unit 243 updates the initial probability $\pi_{si}$ and state transition probability $a_{ij}$ of each of the states $s_i$ to initial probability $\pi_{si}'$ and state transition probability $a_{ij}'$ to be obtained by the following Expression (21) and Expression (22), respectively.

$$\pi_{si}' = \frac{\alpha_1(s_i)\beta_1(s_i)}{\sum_{i=1}^{M} \alpha_t(s_i)} \quad (21)$$

$$a_{ij}' = \frac{\sum_{t=1}^{T-1} \alpha_t(s_i) a_{ij} P(x_t, x_{t+1} | s_i) \beta_{t+1}(s_j)}{\sum_{t=1}^{T-1} \alpha_t(s_i) \beta_t(s_i)} \quad (22)$$

Expression (21) and Expression (22) are expressions to be commonly employed at the Baum-Welch's maximum likelihood estimating method to which the observation likelihood $P(x_t, x_{t+1}|s_i)$ has been applied.

In step S55, the new model learning unit 243 updates the observation probability. Specifically, the new model learning unit 243 updates the center value $\mu_{si}(d)$ and distributed value $\sigma_{si}(d)^2$ of the observation probability (probability distribution) of each of the states $s_i$ to a center value $\mu_{si}(d)'$ and a distributed value $\sigma_{si}(d)'^2$ to be obtained by the following Expression (23) and Expression (24), respectively.

$$\mu_{si}(d)' = \frac{1}{\sum_{t=1}^{T-1} \alpha_t(s_i)\beta_t(s_i)} \cdot \sum_{t=1}^{T-1} \alpha_t(s_i)\beta_t(s_i) \left( \frac{x_t(d) + x_{t+1}(d)}{2} \right) \quad (23)$$

$$d = 1, 2, 3$$

$$\sigma_{si}(d)'^2 = \quad (24)$$

$$\frac{1}{\sum_{t=1}^{T-1} \alpha_t(s_i)\beta_t(s_i)} \cdot \sum_{t=1}^{T-1} \alpha_t(s_i)\beta_t(s_i) \left( \frac{x_t(d)^2 + x_{t+1}(d)^2}{2} \right) - \mu_{si}(d)'^2$$

$$d = 1, 2, 3$$

d in Expression (23) and Expression (24) corresponds to the dimension D of data, and becomes one of 1, 2, or 3.

The center value $\mu_{si}(d)'$ and distributed value $\sigma_{si}(d)'^2$ in observation probability in the event of a model where one state node expresses W or more consecutive samples, and the number of dimensions is D can be obtained by the following Expression (25) and Expression (26).

$$\mu_{si}(d)' = \frac{1}{\sum_{t=1}^{T-W+1} \alpha_t(s_i)\beta_t(s_i)} \cdot \sum_{t=1}^{T-W+1} \alpha_t(s_i)\beta_t(s_i) \left( \sum_{w=1}^{W} \frac{x_{t+w-1}(d)}{W} \right) \quad (25)$$

$$d = 1, 2, 3 \ldots D$$

$$\sigma_{si}(d)'^2 = \quad (26)$$

$$\frac{1}{\sum_{t=1}^{T-W+1} \alpha_t(s_i)\beta_t(s_i)} \cdot \sum_{t=1}^{T-1} \alpha_t(s_i)\beta_t(s_i) \left( \sum_{w=1}^{W} \frac{x_{t+w-1}(d)^2}{W} \right) - \mu_{si}(d)'^2$$

$$d = 1, 2, 3 \ldots D$$

The center value $\mu_{si}(d)'$ in Expression (23) and Expression (25), and the distributed value $\sigma_{si}(d)'^2$ in Expression (24) and Expression (26) may readily be calculated by solving an expression to minimize likelihood.

In step S56, the new model learning unit 243 determines whether or not updating of the parameters is ended. For example, in the event that increase in each likelihood becomes equal to or lower than a predetermined value, and a convergence condition for updating of the parameters is satisfied, the new model learning unit 243 determines that updating of the parameters is ended. Alternatively, an arrangement may be made wherein, in the event that the processing in steps S51 to S55 has repeatedly been executed a specified number of times, the new model learning unit 243 determines that updating of the parameters is ended.

In the event that determination is made in step S56 that updating of the parameters is not ended, the processing returns to step S51.

In step S51, with the new model learning unit 243, the likelihood in each state is calculated based on the updated parameters. Specifically, the likelihood of each state is calculated based on data that indicates the initial probability $\pi_{si}'$, center value $\mu_{si}(d)'$, and distributed value $\sigma_{si}(d)'^2$ of each state $s_i$, and the state transition probability $a_{ij}'$ between the states, updated by the processing in steps S54 and S55.

Thereafter, the processing in steps S52 to S55 is similarly executed. Thus, updating of the parameters of an HMM is performed so that the various types of likelihood of series of the state $s_i$, i.e., the observation likelihood $P(x_t, x_{t+1}|s_i)$, forward likelihood $\alpha_t(s_i)$, and backward likelihood $\beta_t(s_i)$ gradually increase, and finally becomes the maximum. In step S56, determination is made in step S56 again whether or not updating of the parameters is ended.

In the event that determination is made in step S56 that updating of the parameters is ended, the processing proceeds to step S57.

In step S57, the new model learning unit 243 outputs the final parameters to the node series determining unit 244. Specifically, the new model learning unit 243 outputs the finally obtained data that indicates the initial probability $\pi_{si}'$, center value $\mu_{si}(d)'$, and distributed value $\sigma_{si}(d)'^2$ of each state $s_i$, and state transition probability $a_{ij}'$ between the states, to the node series determining unit 244, and the processing is ended.

[Parameter Recalculation Processing of Parameter Recalculating Unit 245]

Figure 35:
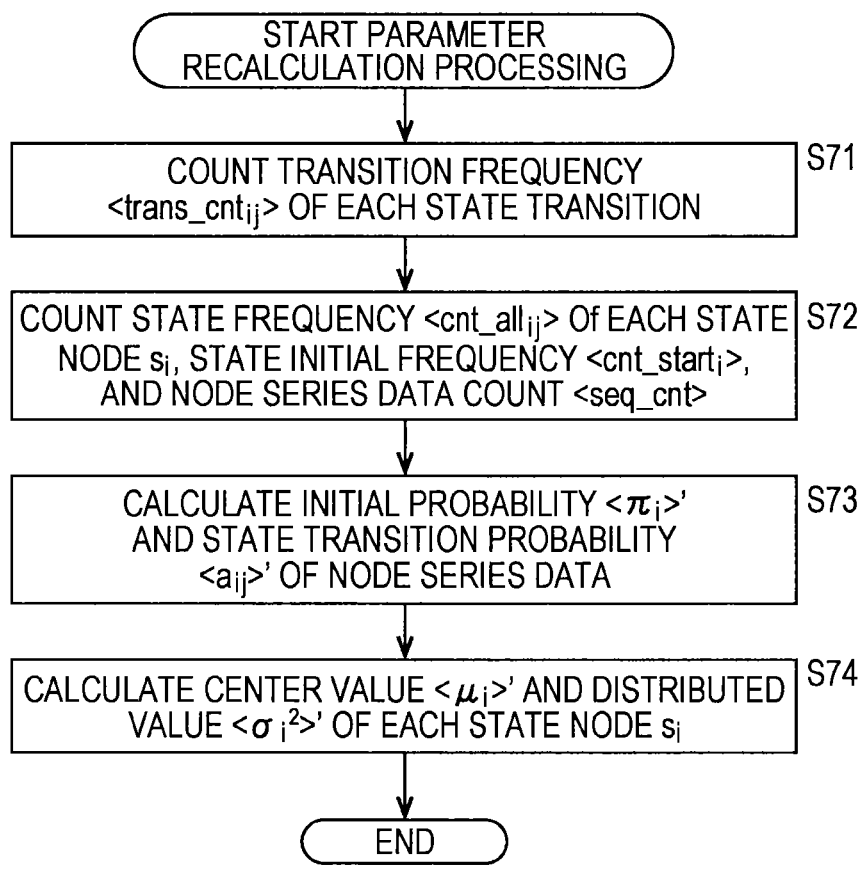
FIG. 35 is a flowchart for describing parameter recalculation processing of a parameter recalculating unit.

Next, parameter recalculation processing of the parameter recalculating unit 245 will be described with reference to the flowchart in FIG. 35.

First, in step S71, the parameter recalculating unit 245 counts the transition frequency <trans_cnt$_{ij}$> of each state transition (i=1 to N, j=1 to N, N is the final node number (=the number of nodes) of times series data) with all of the node series data to be supplied from the node series determining unit 244 as an object.

In step S72, the parameter recalculating unit 245 counts the state frequency <cnt_all$_i$>, state initial frequency <cnt_start$_i$> of each state node $s_i$, and the node series data count <seq_cnt> with all of the node series data to be supplied from the node series determining unit 244 as an object.

In step S73, the parameter recalculating unit 245 calculates (updates) the initial probability <$\pi_i$>' and state transition probability <$a_{ij}$>' of the node series data. The initial probability <$\pi_i$>' and state transition probability <$a_{ij}$>' of the node series data can be calculated by the following Expression (27) and Expression (28).

[Math. 21]

$$\langle \pi_i \rangle' = \frac{\langle \text{cnt\_start}_i \rangle}{\langle \text{seq\_cnt} \rangle} \quad (27)$$

$$\langle a_{ij} \rangle' = \frac{\langle \text{trans\_cnt}_{ij} \rangle}{\langle \text{cnt\_all}_i \rangle} \quad (28)$$

In step S74, the parameter recalculating unit 245 calculates (updates) the observation probability of the node series data, i.e., the center value <$\mu_i$>' and distributed value <$\sigma_i^2$>' of each state node $s_i$. The center value <$\mu_i$>' and distributed value <$\sigma_i^2$>' of each state node $s_i$ can be calculated by the following Expression (29) and Expression (30).

$$\langle \mu_{si} \rangle' = \frac{1}{\langle \text{cnt\_all}_i \rangle} \sum_{k=1}^{\langle \text{cnt\_all}_i \rangle} \left( \frac{x_{t\_k} + x_{t\_k+1}}{2} \right) \quad (29)$$

$$\langle \sigma_{si}^2 \rangle' = \frac{1}{\langle \text{cnt\_all}_i \rangle} \sum_{k=1}^{\langle \text{cnt\_all}_i \rangle} \left( \frac{(x_{t\_k})^2 + (x_{t\_k+1})^2}{2} \right) - \langle \mu_{si} \rangle'^2 \quad (30)$$

In Expression (29) and Expression (30), $x_{t\_k}$ represents, of three-dimensional data $x_t$ of movement history data, three-dimensional data corresponding to the state node $s_i$. Accordingly, the number of $x_{t\_k}$ is equal to the state frequency <cnt_all$_i$> of the state node $s_i$.

Note that, with a model wherein one state node expresses W or more consecutive samples, the center value <$\mu_i$>' and distributed value <$\sigma_j^2$>' of each state $s_i$ can be calculated by the following Expression (31) and Expression (32).

$$\langle \mu_{si} \rangle' = \frac{1}{\langle \text{cnt\_all}_i \rangle} \sum_{k=1}^{\langle \text{cnt\_all}_i \rangle} \left( \frac{\sum_{w=1}^{W} x_{t\_k+w-1}}{W} \right) \quad (31)$$

$$\langle \sigma_{si}^2 \rangle' = \frac{1}{\langle \text{cnt\_all}_i \rangle} \sum_{k=1}^{\langle \text{cnt\_all}_i \rangle} \left( \frac{\sum_{w=1}^{W} (x_{t\_k+w-1})^2}{W} \right) - \langle \mu_{si} \rangle'^2 \quad (32)$$

With that, the parameter recalculation processing by the parameter recalculating unit 245 is ended.

Note that a graphical model in FIG. 33 being employed is reflected in the new model learning unit 243 (Expression (15), Expression (16), and Expression (23) to Expression (26)) and parameter recalculating unit 245 (Expression (29) to Expression (32)) in FIG. 30. Accordingly, for example, if there is a request for simplifying the processing, an embodiment may be made wherein the graphical model in FIG. 33 is reflected in the parameter recalculating unit 245 in FIG. 30 alone. In this case, learning by the ordinary Baum-Welch algorithm can be applied to the new model learning unit 243 in FIG. 30. Also, in order to further simply the processing, the ordinary Baum-Welch algorithm can be changed to processing wherein a number is sequentially assigned to the obtained movement history data from the front thereof, and this is taken as the number of a state node. In this case, in the event that the movement attribute provided by the movement attribute identification adding unit 74 in FIG. 7 is referenced, and the movement attribute of the three-dimensional data of the current movement history is not a stay state, a number obtained by increasing the number assigned to the last three-dimensional data by one is assigned as the number of a state node. On the other hand, in the event that the movement attribute of the three-dimensional data of the current movement history is a stay state, the same number as a number assigned to the last three-dimensional data is assigned as the number of a state node.

[New Model Generation Processing of New Model Generating Unit 202]

Figure 36:
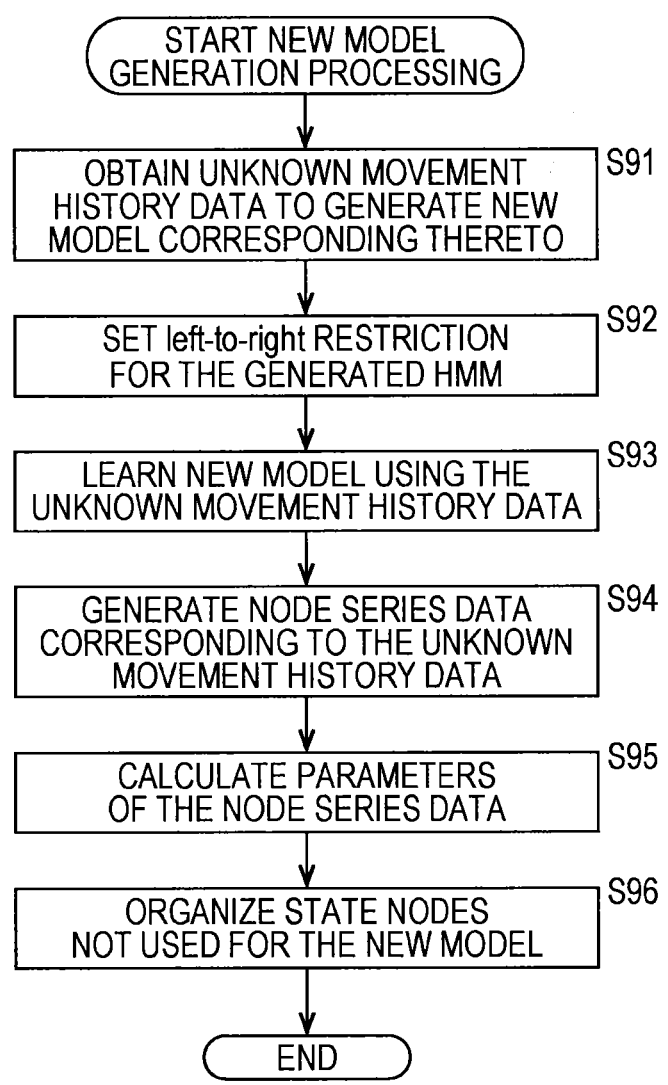
FIG. 36 is a flowchart of the entire new model generation processing to be performed by the new model generating unit.

FIG. 36 is a flowchart of the entire new model generation processing to be performed by the new model generating unit 202.

First, in step S91, the new model initializing unit 241 obtains unknown movement history data supplied from the known/unknown determining unit 201, and generates a new model corresponding thereto. Specifically, the new model initializing unit 241 generates an HMM having the same number of state nodes as the number of samples of the obtained unknown movement history data.

In step S92, the new model restricting unit 242 sets a Left-to-right restriction to the HMM generated at the new model initializing unit 241.

In step S93, the new model learning unit 243 learns a new model using the unknown movement history data. Specifically, in step S93, the new model learning processing described with reference to FIG. 34 is executed with a new model being a model where one state node necessarily reflects two consecutive samples worth, as illustrated in FIG. 32.

In step S94, the node series determining unit 244 uses the new model obtained by the new model learning processing in step S93 to generate node series data corresponding to the unknown movement history data, and supplies this to the parameter recalculating unit 245.

In step S95, the parameter recalculating unit 245 calculates the parameters of the node series data corresponding to the HMM parameters of the movement history data based on the node series data supplied from the node series determining unit 244. More specifically, the parameter recalculating unit 245 calculates the initial probability $<\pi_i>'$ and state transition probability $<a_{ij}>'$ of the node series data, and the center value $<\mu_i>'$ and distributed value $<\sigma_i^2>'$ of each state node $s_i$. Also, the parameter recalculating unit 245 also calculates the state frequency $<cnt\_all_i>$ and state initial frequency $<cnt\_start_i>$ of each state node $s_i$.

In step S96, the new model organizing unit 246 deletes an unused state node out of the state nodes $s_i$ of the HMM serving as the generated new model, thereby organizing new models. In the event that state nodes of the existing model before and after the unknown movement history data have also been supplied from the known/unknown determining unit 201, the new model organizing unit 246 also outputs these to the new model connecting unit 203 along with the parameters of the new model after organizing, and the processing is ended.

[Topology Updated Model Generation Processing of New Model Connecting Unit 203]

Next, description will be made regarding topology updated model generation processing of the new model connecting unit 203 which connects the existing model obtained by the previous learning, and the new model generated from the unknown movement history data to generate a topology updated model.

First, as premises for description, the following variables will be defined.

Existing model: xhmm
New model: yhmm
Topology updated model: zhmm

The existing model xhmm, new model yhmm, and topology updated model zhmm each have the following variables. Note that the following hmm is notation common to a learning model (HMM), and this will be read as xhmm at the time of an existing model, and will be read as yhmm at the time of anew model, and will be read as zhmm at the time of a topology updated model.

Number of state nodes: hmm.node
Number of state nodes of the existing model xhmm:
   xhmm.node=M
Number of state nodes of the new model yhmm:
yhmm.node=N
Number of state nodes of the topology updated model zhmm:
   zhmm.node=M+N
Number of dimensions D of time series data to be learned: hmm.D
Initial probability $\pi_i$ each state node: hmm.pi(i)

The initial probability hmm.pi of the entire hmm becomes a table with hmm.node rows and one column (initial probability table).

Transition probability $a_{ij}$ of each state node: hmm.a(i, j)

The transition probability hmm.a of the entire hmm becomes a table with hmm.node rows and hmm.node columns (transition probability table).

Center value $\mu_i$ of probability distribution of each state node: hmm.mu(i)

The center value hmm.mu of the probability distribution of the entire hmm becomes a table with hmm.node rows and hmm.D columns (center value table).

Distributed value $\sigma_i^2$ of probability distribution of each state node: hmm.sigma2 (i)

The distributed value hmm.sigma2 of the probability distribution of the entire hmm becomes a table with hmm.node rows and hmm.D columns (distributed value table). Number seq_cnt of learned time series data: hmm.seq_cnt State frequency $cnt\_all_i$ of each state node: hmm.cnt_all(i)

The state frequency hmm.cnt_all of the entire hmm becomes a table with hmm.node rows and one column (state frequency table).

Figure 37:
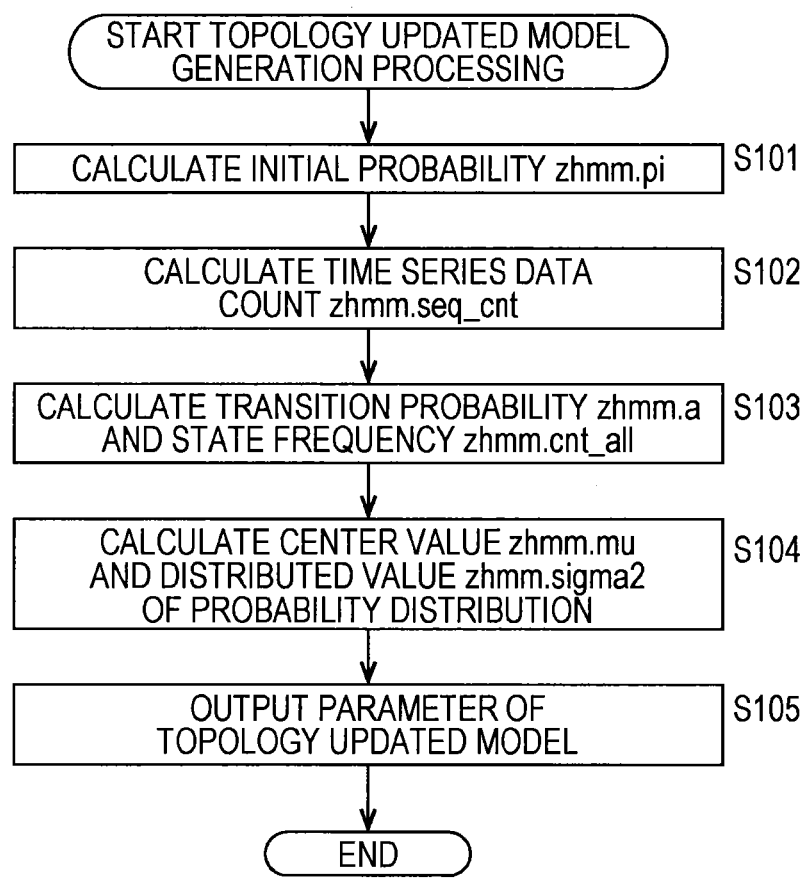
FIG. 37 is a flowchart for describing topology updated model generation processing by a new model connecting unit.

Topology updated model generation processing by the new model connecting unit 203 will be described with reference to the flowchart in FIG. 37.

First, in step S101, the new model connecting unit 203 calculates the initial probability zhmm.pi of a topology updated model.

Figure 38:
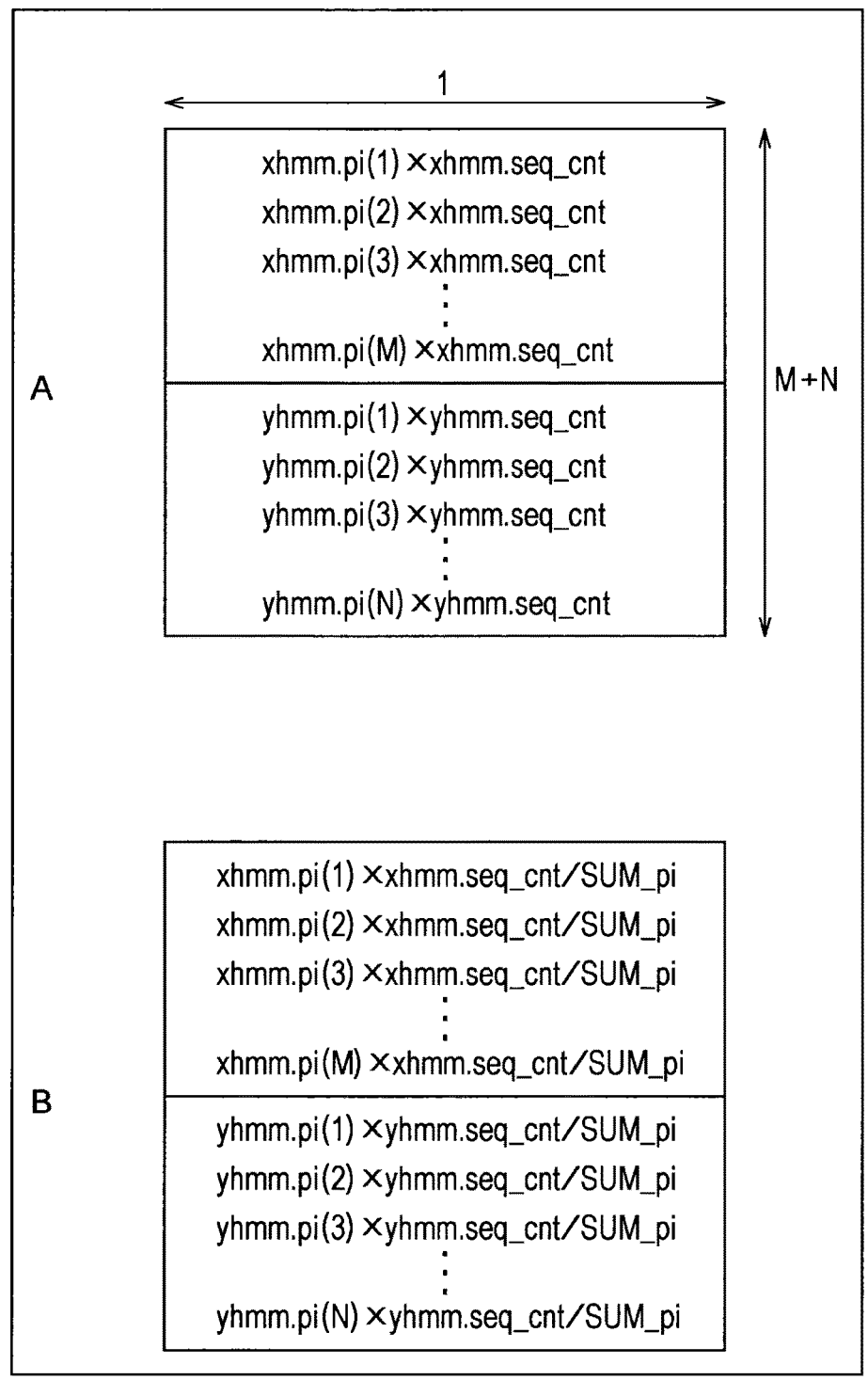
FIG. 38 is a diagram for describing an initial probability table for a topology updated model.

In step S101, first, the new model connecting unit 203 generates, as illustrated in A in FIG. 38, an initial probability table with (M+N) rows and one column serving as the initial probability zhmm.pi since the existing model is made up of M state nodes, and the new model is made up of N state nodes.

The new model connecting unit 203 sets, in the m-th row (m=1, 2, . . . , M) of the first row to the M-th row of the initial probability table of the topology updated model, as illustrated in A in FIG. 38, a value obtained by multiplying the initial probability xhmm.pi(m) of the existing model by the time series data count xhmm.seq_cnt of the exiting model. Also, the new model connecting unit 203 sets, in the (M+n)-th row (n=1, 2, . . . , N) of the (M+1)-th row to the (M+N)-th row of the initial probability table of the topology updated model, a value obtained by multiplying the initial probability yhmm.pi(n) of the new model by the time series data count yhmm.seq_cnt of the new model.

As illustrated in B in FIG. 38, normalization is performed by dividing each row of the initial probability table of the topology updated model by summation SUM_pi of all elements of the initial probability table, and generation of the initial probability table zhmm.pi of the topology updated model is ended.

Next, in step S102, the new model connecting unit 203 calculates the times series data count zhmm.seq_cnt of the topology updated model. Specifically, the new model connecting unit 203 calculates summation between the time series data count xhmm.seq_cnt of the existing model and the time series data count yhmm.seq_cnt of the new model, and takes this as the time series data count zhmm.seq_cnt of the topology updated model.

In step S103, the new model connecting unit 203 calculates the transition probability zhmm.a and state frequency zhmm.cnt_all of the topology updated model.

Figure 39:
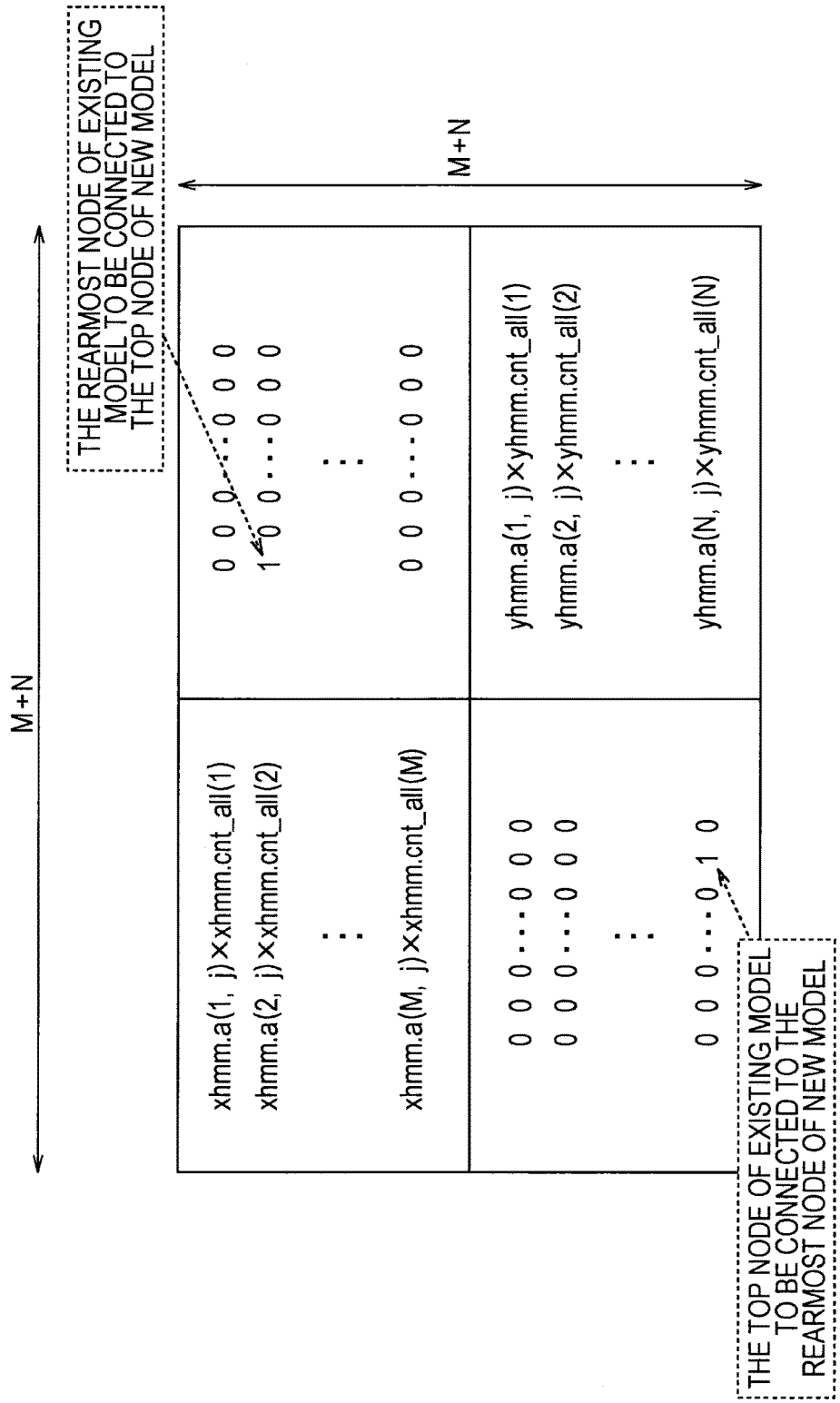
FIG. 39 is a diagram for describing a transition probability table for a topology updated model.

In step S103, first, the new model connecting unit 203 generates, as illustrated in FIG. 39, the transition probability table with the (M+N) rows and (M+N) columns since the existing model is made up of M state nodes, and the new model is made up of N state nodes. Now, let us say that from the first row and first column to the M-th row and M-th column of the transition probability table will be referred to as an upper left region, from the (M+1)-th row and (M+1)-th column to the (M+N)-th row and (M+N)-th column will be referred to as a lower right region, from the first row and (M+1)-th column to the M-th row and (M+N)-th column will be referred to as an upper right region, and from the (M+1)-th row and first column to the (M+N)-th row and M-th column will be referred to as a lower left region.

The new model connecting unit 203 sets a value obtained by multiplying the transition probability xhmm.a(m, j) of the state node $s_m$ of the existing model by the state frequency xhmm.cnt_all(m) of the state node $s_m$ of the existing model (j=1, . . . , M) in each element of the upper left region of the generated transition probability table.

Also, the new model connecting unit 203 sets a value obtained by multiplying the transition probability yhmm.a (m, j) of the state node $s_m$ of the new model by the state frequency yhmm.cnt_all(m) of the state node $s_m$ of the new model (j=1, . . . , M) in each element of the lower right region of the generated transition probability table.

Note that, in FIG. 39, the same rows as with the xhmm.a (m, j)×xhmm.cnt_all(m), yhmm.a(m, j)×yhmm.cnt_all (m) are collectively illustrated.

Further, the new model connecting unit 203 basically substitutes "0" for each element of the upper right region of the generated transition probability table. However, in the event that the state node of the existing model before the unknown movement history data is supplied from the new model generating unit 202, and the new model is connected to behind the node series data of the existing model, "1" is substituted for only the element corresponding to the state node of the connection destination thereof. Specifically, in the event that the state node of the connection destination is $s_i$, "1" is set to the element in the i-th row and (M+1)-th column.

Similarly, the new model connecting unit 203 basically substitutes "0" for each element of the lower left region of the generated transition probability table. However, in the event that the state node of the existing model after the unknown movement history data is supplied from the new model generating unit 202, and the node series data of the existing model is connected to behind the new model, "1" is substituted for only the element corresponding to the state node of the connection destination thereof. Specifically, in the event that the state node of the connection destination is $s_j$, "1" is set to the element in the (M+N)-th row and j-th column.

Figure 40:
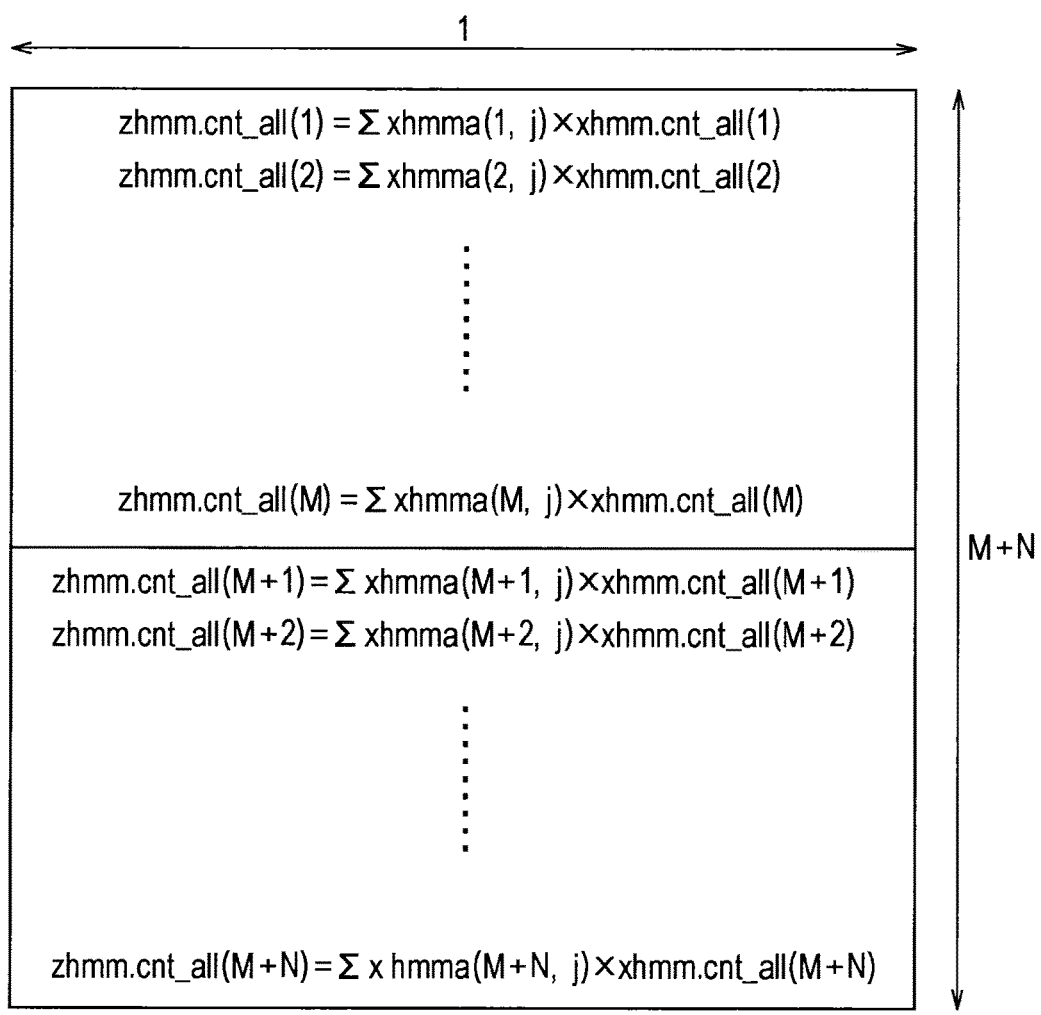
FIG. 40 is a diagram for describing a transition probability table for a topology updated model.

Next, the new model connecting unit 203 calculates, as illustrated in FIG. 40, summation in the row direction regarding the upper left region and lower right region of the generated transition probability table, thereby calculating the state frequency zhmm.cnt_all of the topology updated model. The state frequency table in FIG. 40 is made up of a table with (M+N) rows and one column.

Figure 41:
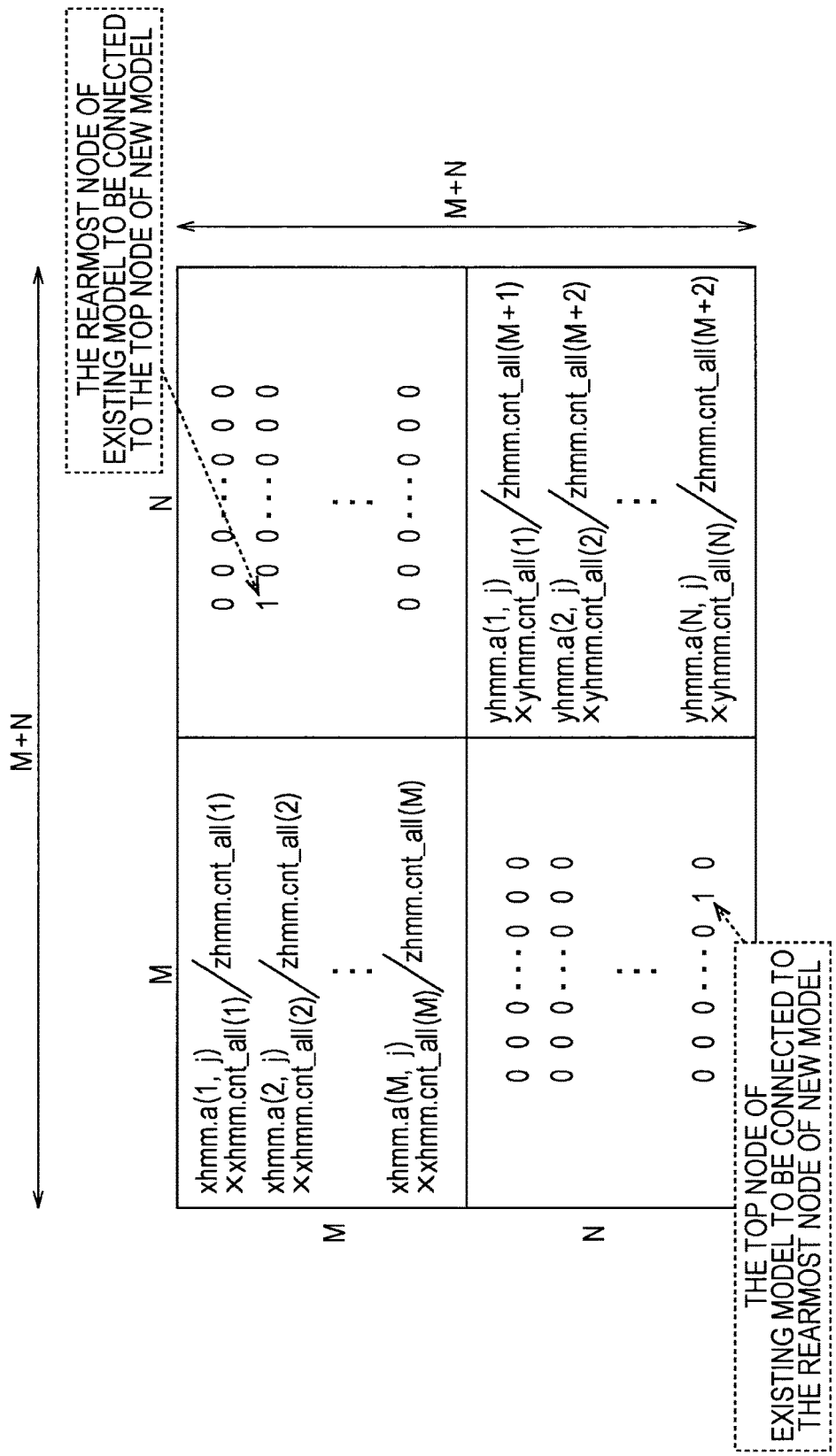
FIG. 41 is a diagram for describing a transition probability table for a topology updated model.

Lastly, as illustrated in FIG. 41, the new model connecting unit 203 performs normalization by dividing each row of the upper left region and lower right region of the transition probability table in FIG. 39 by each row zhmm.cnt_all(i) of the state frequency table of the topology updated model. With that, generation of the transition probability table of the topology updated model is ended.

The processing then proceeds to step S104, where the new model connecting unit 203 calculates the center value zhmm.mu and distributed value zhmm.sigma2 of the probability distribution of the topology updated model.

In step S104, the existing model is made up of M state nodes, and the new model is made up of N state nodes, and accordingly, the center value table corresponding to the center value zhmm.mu of the topology updated model is configured of (M+N) rows and D columns.

Figure 42:
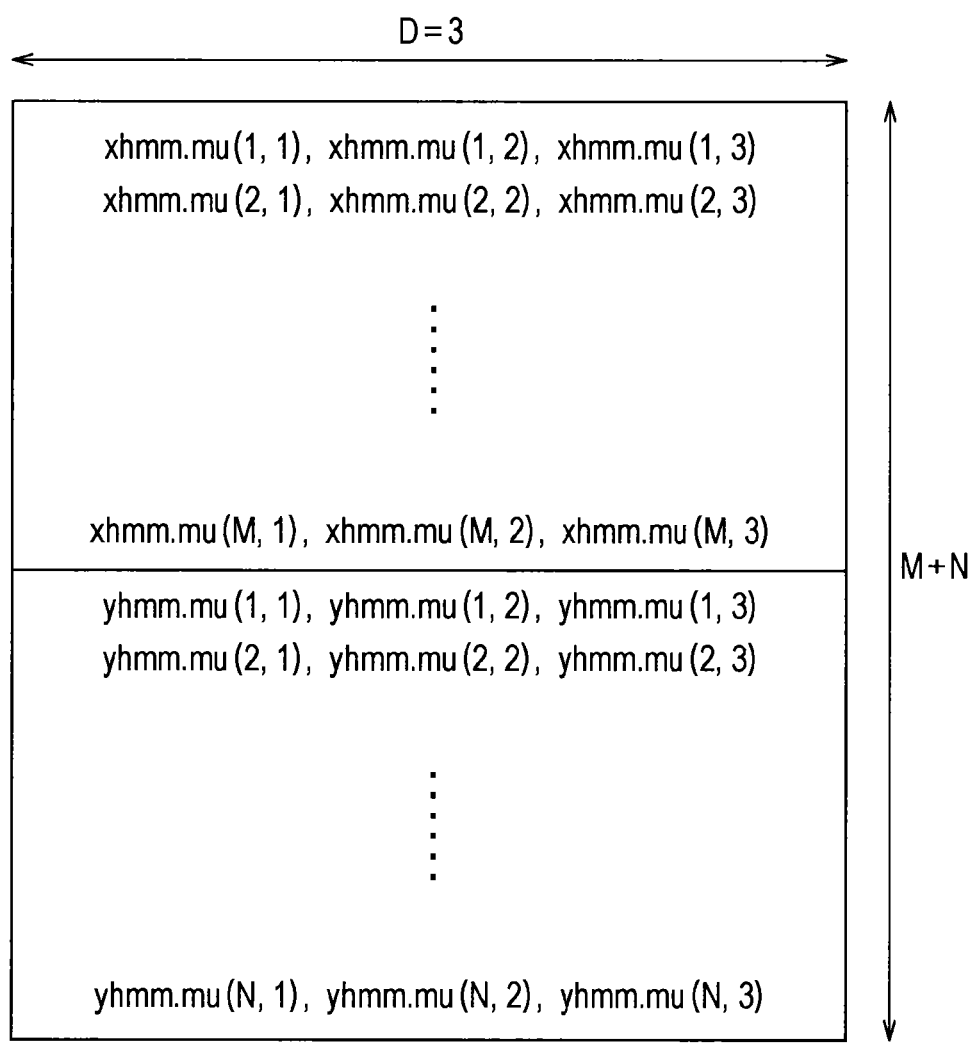
FIG. 42 is a diagram for describing a center-value table for a topology updated model.

As illustrated in FIG. 42, the center value xhmm.mu(i, 1), xhmm.mu(i, 2), and xhmm.mu(i, 3) of the exiting model are substituted for each row of the first row to the M-th row of the center value table with (M+N) rows and D columns (i= 1, . . . , M). Also, the center value yhmm.mu(i, 1), yhmm.mu (i, 2), and yhmm.mu(i, 3) of the new model are substituted for each row of the (M+1)-th row to the (M+N)-th row of the center value table with (M+N) rows and D columns (i= 1, . . . , N). Here, the xhmm.mu(i, 1) and yhmm.mu(i, 1) are the center values of point-in-time of the movement history data, the xhmm.mu(i, 2) and yhmm.mu(i, 2) are the center values of latitude of the movement history data, and the xhmm.mu(i, 3) and yhmm.mu(i, 3) are the center values of longitude of the movement history data.

Similarly, the distributed value table corresponding to the distributed value zhmm.sigma2 of the probability distribution of the topology updated model is also configured of (M+N) rows and D columns.

Figure 43:
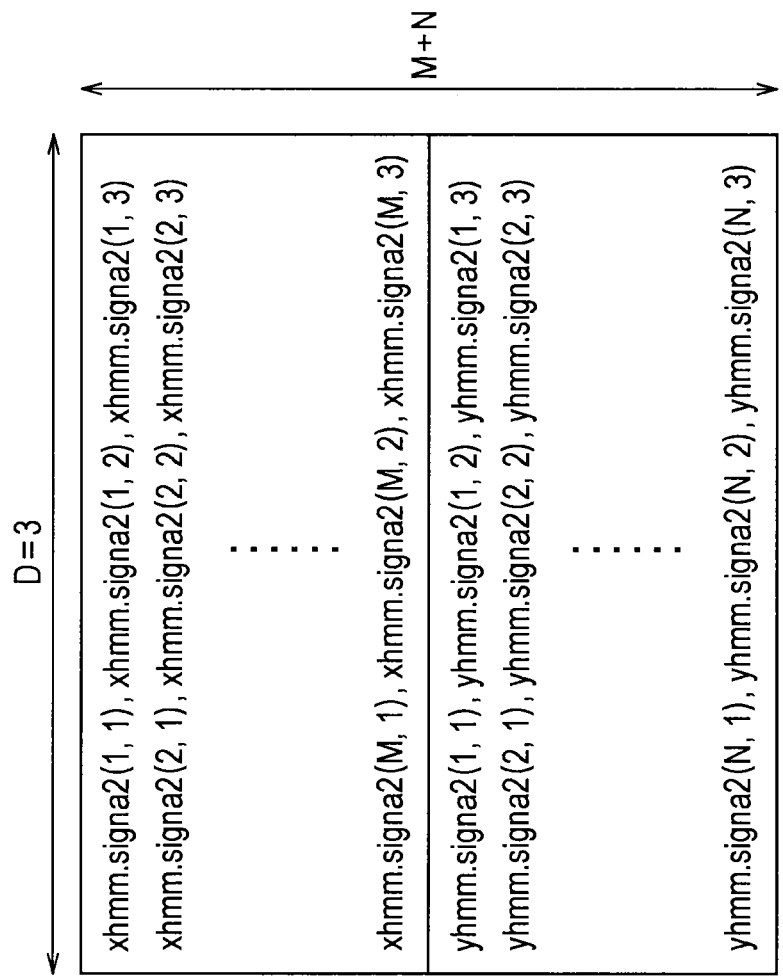
FIG. 43 is a diagram for describing a distributed-value table for a topology updated model.

As illustrated in FIG. 43, the distributed value xhmm.sigma2(i, 1), xhmm.sigma2(i, 2), and xhmm.sigma2(i, 3) of the exiting model are substituted for each row of the first row to the M-th row of the distributed value table with (M+N) rows and D columns (i=1, . . . , M). Also, the distributed value yhmm.sigma2(i, 1), yhmm.sigma2(i, 2), and yhmm.sigma2(i, 3) of the new model are substituted for each row of the (M+1)-th row to the (M+N)-th row of the distributed value table with (M+N) rows and D columns (i=1, . . . , N). Here, the xhmm.sigma2(i, 1) and yhmm.sigma2(i, 1) are the distributed values of point-in-time of the movement history data, the xhmm.sigma2(i, 2) and yhmm.sigma2(i, 2) are the distributed values of latitude of the movement history data, and the xhmm.sigma2(i, 3) and yhmm.sigma2(i, 3) are the distributed values of longitude of the movement history data.

The processing then proceeds to step S105, where the new model connecting unit 203 outputs the parameters of the topology updated model to the updated model organizing unit 205. Specifically, the initial probability zhmm.pi, time series data count zhmm.seq_cnt, transition probability zhmm.a, state frequency zhmm.cnt_all, and of the topology updated model, and the center value zhmm.mu and distributed value zhmm.sigma2 of the probability distribution are output to the updated model organizing unit 205. With that, the topology updated model generation processing is ended.

[Parameter Updating Processing of Parameter Updating unit 204]

Next, parameter updating processing by the parameter updating unit 204 will be described.

Figure 44:
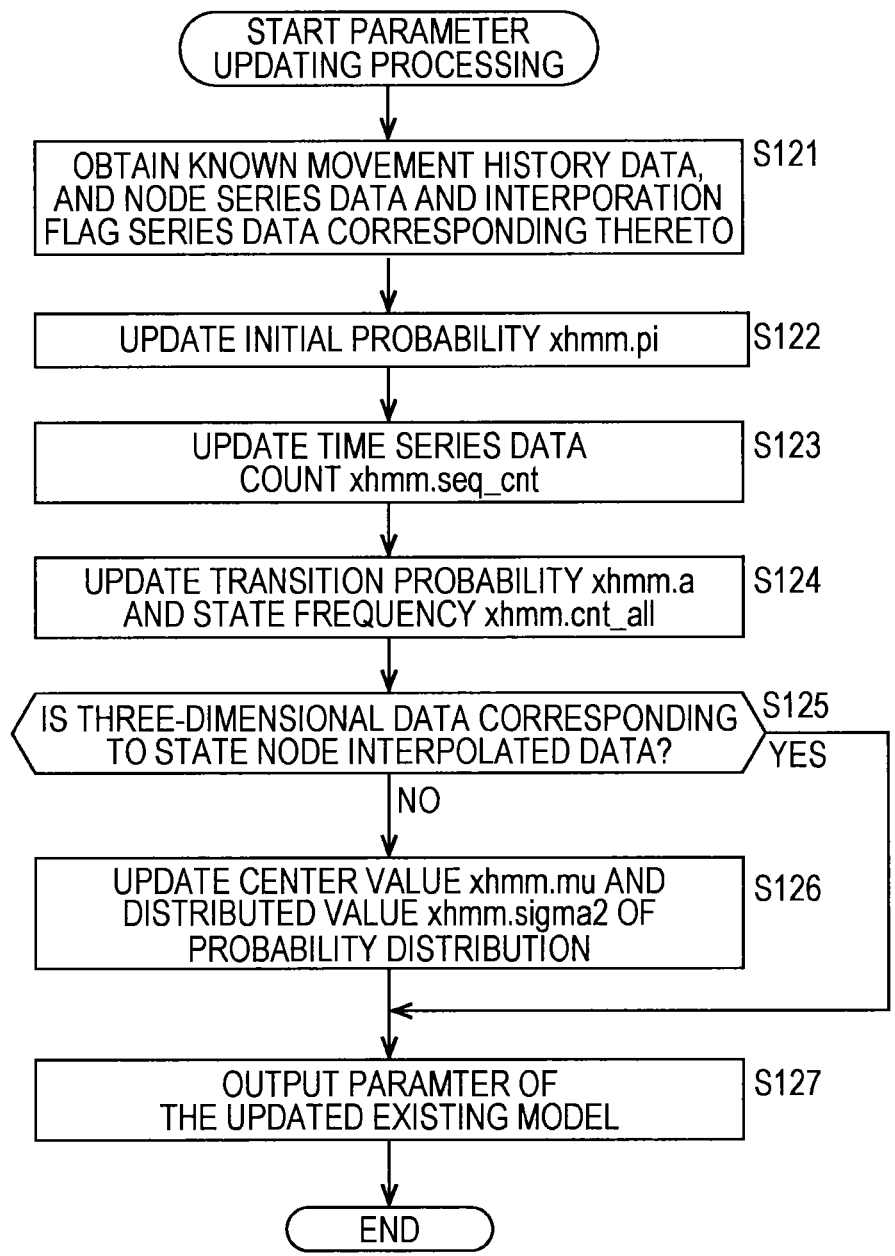
FIG. 44 is a flowchart of the entire parameter updating processing to be performed by a parameter updating unit.

FIG. 44 is a flowchart of the entire parameter updating processing to be performed by the parameter updating unit 204.

First, in step S121, the parameter updating unit 204 obtains the known movement history data and node series data and interpolation flag series data corresponding thereto, supplied from the known/unknown determining unit 201. Hereinafter, in order to simplify description, description will be made assuming that one known movement history data, and node series data and interpolation flag series data corresponding thereto have been obtained.

In step S122, the parameter updating unit 204 updates the initial probability xhmm.pi of the existing model.

In step S122, first, 1 is added to the initial probability xhmm.pi(i) corresponding to the top node of the obtained state node series of the initial probability table with M rows and one column serving as the initial probability xhmm.pi.

Figure 45:
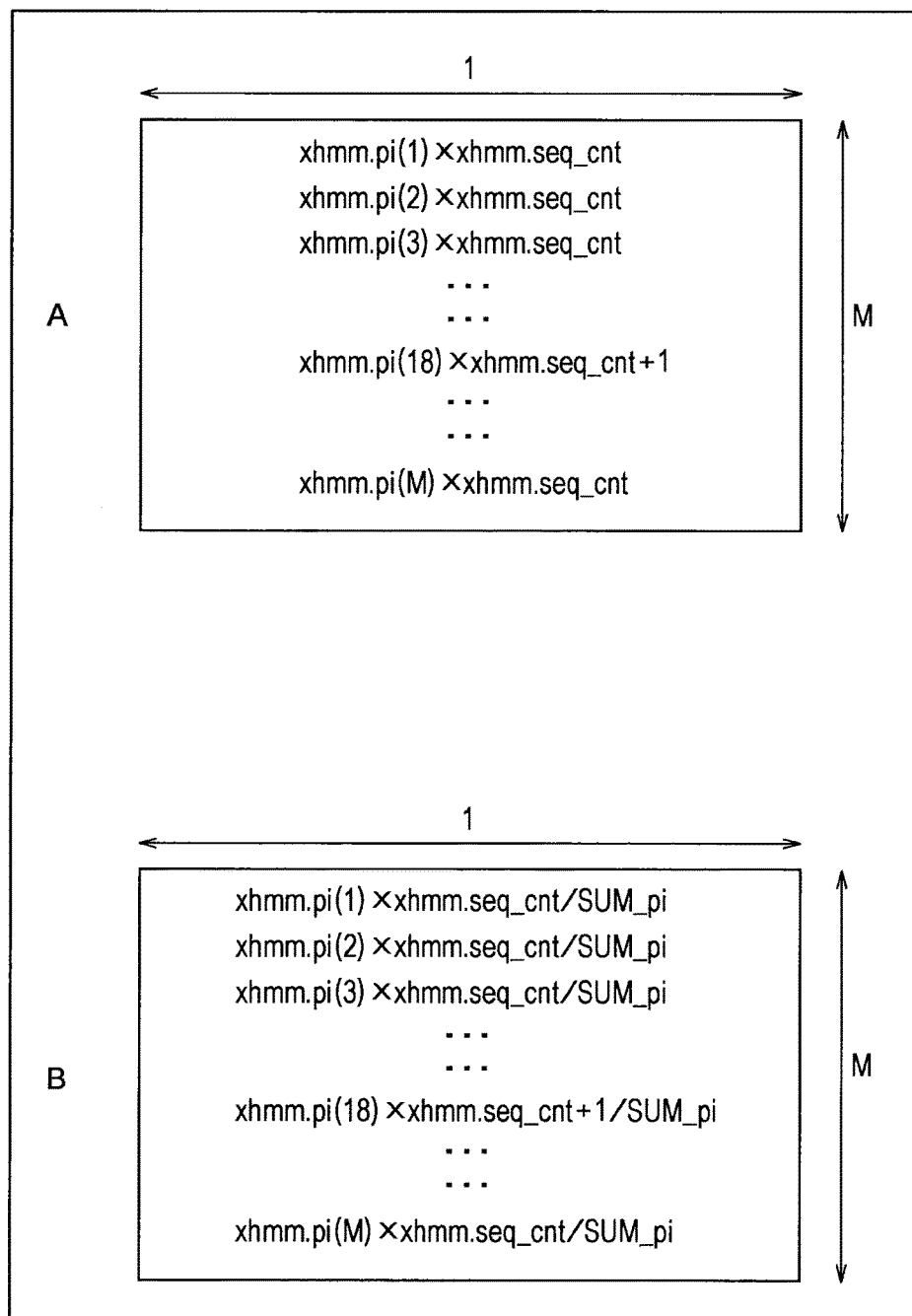
FIG. 45 is a diagram for describing an initial probability table for an existing model.

With A in FIG. 45, 1 is added to the xhmm.pi(18) as an example wherein the top node of the state node series is the state node $s_{19}$.

In order to satisfy conditions for probability, as illustrated in B in FIG. 45, normalization is performed by dividing each row of the initial probability table by summation SUM_pi of all elements, and updating of the initial probability xhmm.pi of the existing model is ended.

Next, in step S123, the parameter updating unit 204 updates the time series data count xhmm.seq_cnt of the existing model. The time series data count is increased by only one, and accordingly, a value obtained by adding 1 to the current xhmm.seq_cnt is taken as the time series data count xhmm.seq_cnt of the existing model after updating.

In step S124, the parameter updating unit 204 updates the transition probability xhmm.a and state frequency xhmm.cnt_all of the existing model.

Figure 46:
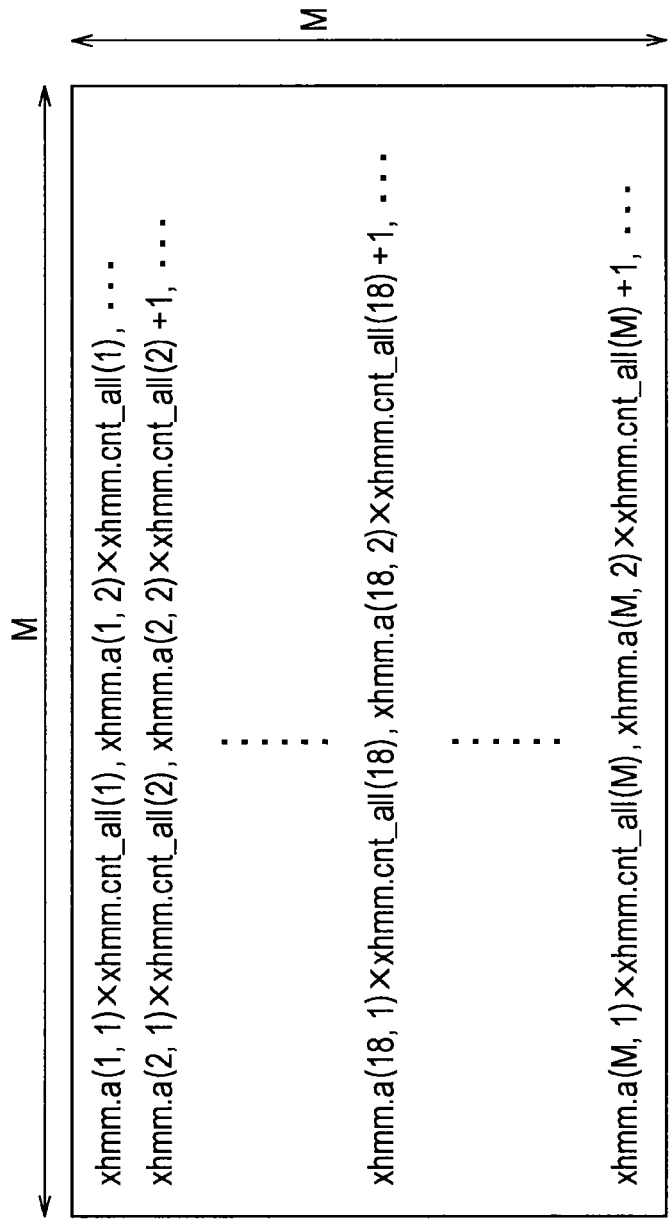
FIG. 46 is a diagram for describing a transition probability table for an existing model.

In step S124, first, 1 is added to each element of the transition probability table corresponding to the state transition occurring in the obtained state node series. For example, with the example in FIG. 46, at least transition from the state node $s_{18}$ to the state node $s_2$, and transition from the state node $s_m$ to the state node $s_2$ occur, and 1 is added to each of the xhmm.a(18, 2)×xhmm.cnt_all(18) and the xhmm.a(M, 2)×xhmm.cnt_all(M).

Also, with regard to the rearmost state node of the obtained state node series, 1 is added to an element of the transition probability table corresponding to self transition. For example, in FIG. 46, as an example wherein the rearmost state node of the state node series is $s_2$, 1 is added to the xhmm.a(2, 2)×xhmm.cnt_all(2).

Figure 47:
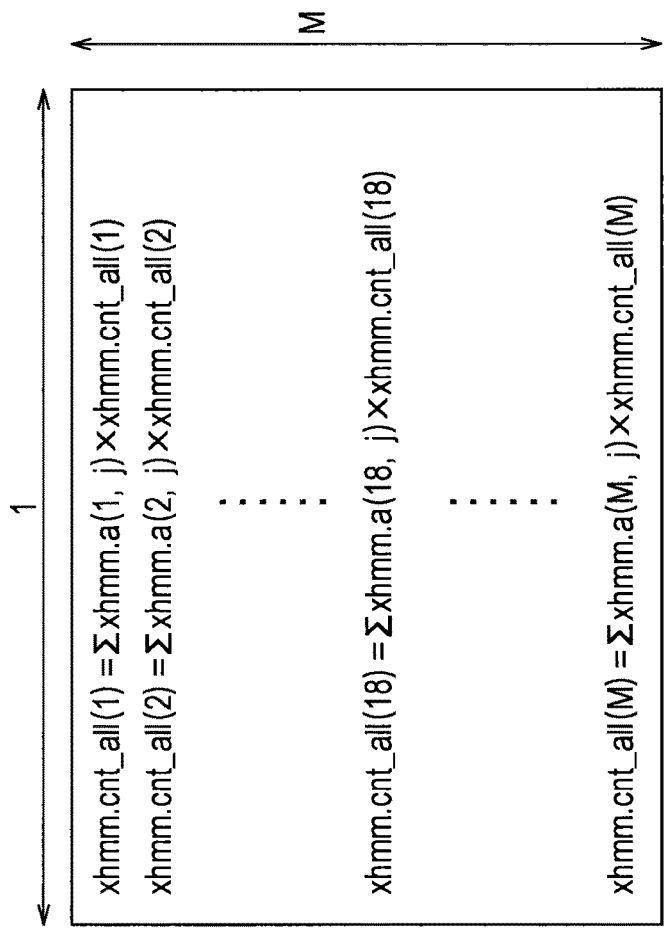
FIG. 47 is a diagram for describing a transition probability table for an existing model.

Next, the parameter updating unit 204 calculates, as illustrated in FIG. 47, summation in the row direction of the transition probability table after adding 1 thereto, thereby calculating (updating) the state frequency xhmm.cnt_all of the existing model.

Figure 48:
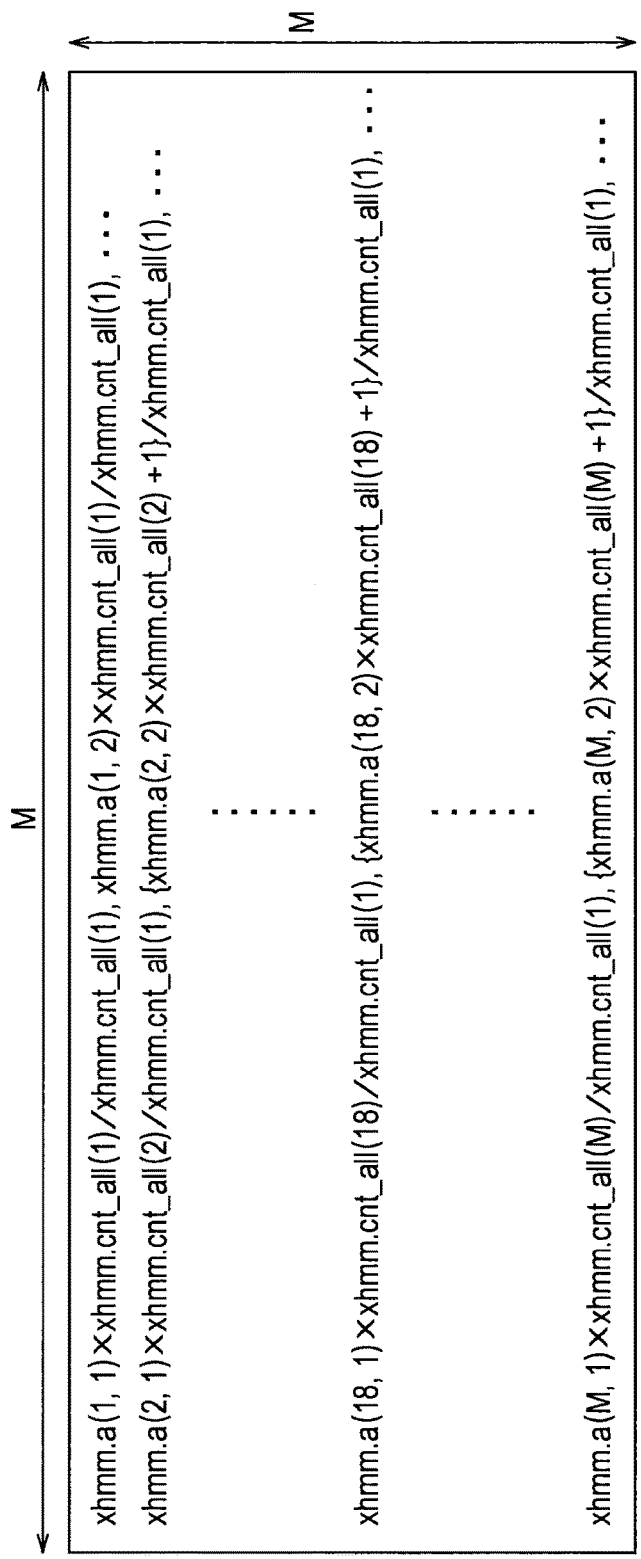
FIG. 48 is a diagram for describing a transition probability table for an existing model.

Lastly, the parameter updating unit 204 perform normalization by dividing, as illustrated in FIG. 48, each row of the transition probability table after adding 1 thereto by the state frequency xhmm.cnt_all(i) of the existing model after updating. According to the above-mentioned calculation, the transition probability table of the existing model has been updated.

The processing then proceeds to step S125, where the parameter updating unit 204 determines, regarding each of the state nodes, whether or not three-dimensional data correspond to the state node is interpolated data, based on the interpolation flag series data.

In the event that determination is made in step S125 that three-dimensional data corresponding to the state node is not interpolated data (actual data), processing in the next step S126 is executed on the state node thereof. On the other hand, in the event that determination is made in step S125 that three-dimensional data corresponding to the state node is interpolated data, the processing in step S126 is skipped.

In step S126, the parameter updating unit 204 updates the center value xhmm.mu and distributed value xhmm.sigma2 of the probability distribution of the existing model.

In general, in the event that, with the existing model, M state nodes $s_i$ have appeared, and a mean value thereof is $\mu_{si}$, there is relationship between the mean value $\mu_{si}^{(M)}$ before updating and the mean value $\mu_{si}^{(M+1)}$ after updating when a new sample $x_{M+1}$ recognized as the (M+1)-th state node $s_i$ is added.

$$\mu_{si}^{(M)} = \frac{1}{M}\sum_{i=1}^{M} x_i \quad (33)$$

$$\mu_{si}^{(M+1)} = \frac{1}{M+1}\sum_{i=1}^{M+1} x_i \quad (34)$$

$$= \frac{1}{M+1}(M \times \mu_{si}^{(M)} + x_{M+1})$$

In Expression (33) and Expression (34), a letter with parentheses on the right shoulder represents the number of times of appearance of the state node $s_i$.

Figure 49:
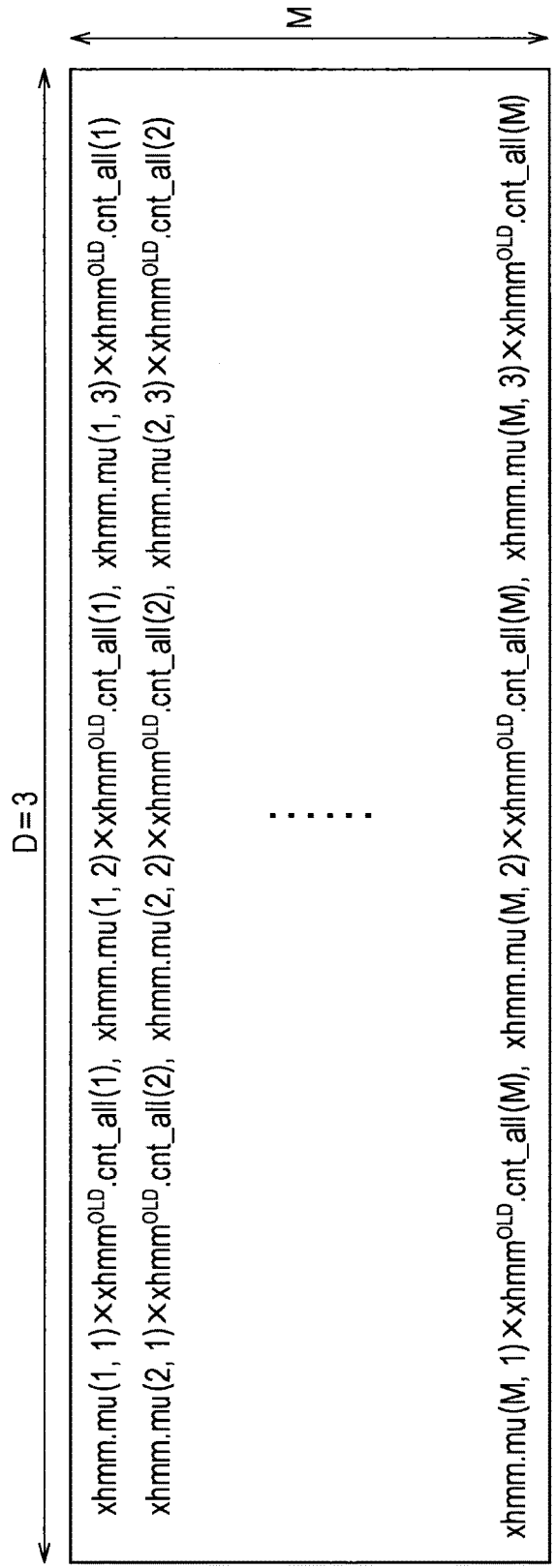
FIG. 49 is a diagram for describing a center-value table for an existing model.

Therefore, as illustrated in FIG. 49, the parameter updating unit 204 multiplies elements in each row of the center value table with M rows and D columns by the last state frequency xhmm$^{OLD}$.cnt_all(i) before updating the state frequency xhmm.cnt_all(i) in the above-mentioned step S124 (i=1, . . . , M). Accordingly, the last state frequency xhmm$^{OLD}$.cnt_all(i) has to be stored in a predetermined location before performing the processing in step S124.

Next, the parameter updating unit 204 adds known movement history data (each of three-dimensional data other than interpolated data) serving as the new sample $x_{M+1}$ to a row of the center value table corresponding to the state node corresponding to the new sample $x_{M+1}$.

Further, the parameter updating unit 204 divides elements in each row of the center value table with M rows and D columns by the state frequency xhmm.cnt_all(i) updated in the above-mentioned step S124. With that, updating of the center value xhmm.mu of the probability distribution of the exiting model is ended.

On the other hand, in the event that, with the existing model, M state nodes $s_i$ have appeared, a mean value thereof is $\mu_{si}$, and a distributed value thereof is $\sigma_{si}^2$, there is relationship between the mean value $\sigma_{si}^{2(M)}$ before updating and the $\sigma_{si}^{2(M+1)}$ after updating when a new sample $x_{M+1}$ recognized as the (M+1)-th state node $s_i$ is added.

$$\sigma_{si}^{2(M)} = \frac{1}{M}\sum_{i=1}^{M} x_i^2 - (\mu_{si}^{(M)})^2 \quad (35)$$

$$\sigma_{si}^{2(M+1)} = \frac{1}{M+1}\sum_{i=1}^{M+1} x_i^2 - (\mu_{si}^{(M+1)})^2 \quad (36)$$

$$= \frac{M \times \{\sigma_{si}^{2(M)} + (\mu_{si}^{(M)})^2\} + X_{M+1}^2}{M+1} - (\mu_{si}^{(M+1)})^2$$

In Expression (35) and Expression (36), a letter with parentheses on the right shoulder represents the number of times of appearance of the state node $s_i$.

Therefore, the parameter updating unit 204 adds the square of the last center value xhmm$^{OLD}$.mu before updating the center value xhmm.mu of the probability distribution of the existing model to elements in each row of the distributed value table with M rows and D columns (i=1, . . . , M). Accordingly, the last center value xhmm$^{OLD}$.mu also has to be stored in a predetermined location before performing the above-mentioned updating.

Next, the parameter updating unit 204 multiplies elements in each row of the distributed value table with M rows and D columns after adding the square of the last center value xhmm$^{OLD}$.mu by the last state frequency xhmm$^{OLD}$.cnt_all (i).

Figure 50:
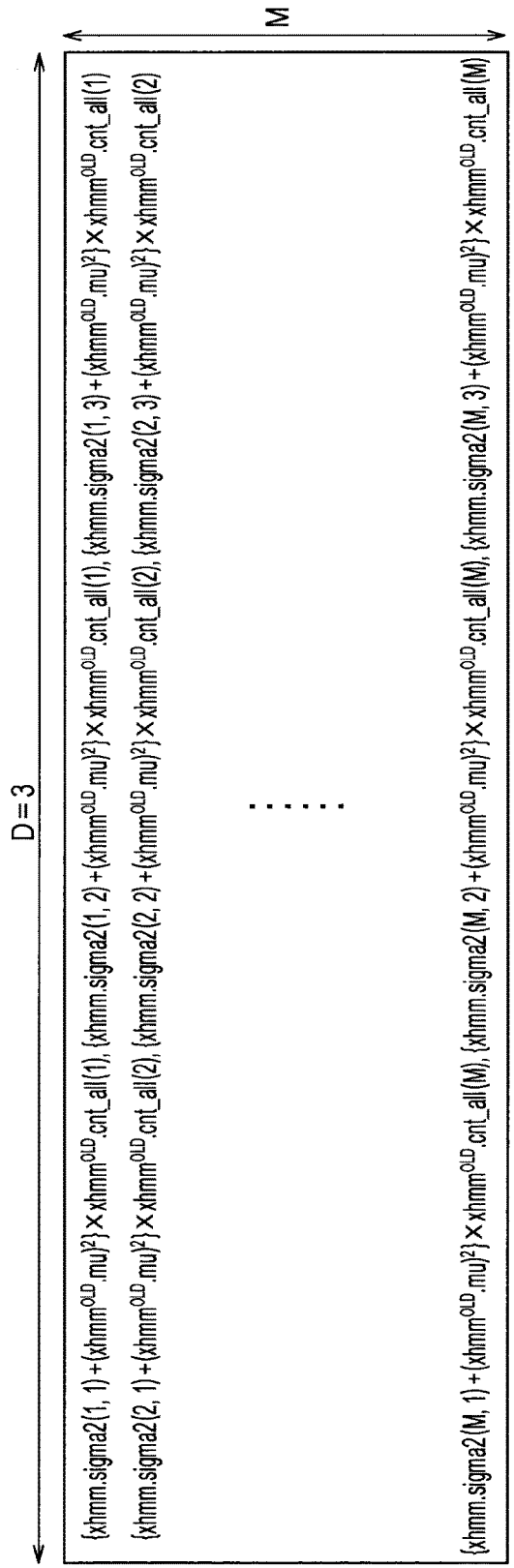
FIG. 50 is a diagram for describing a distributed-value table for an existing model.

FIG. 50 illustrates the distributed value table after multiplication of the state frequency $xhmm^{OLD}.cnt\_all(i)$.

Further, the parameter updating unit 204 adds the square of known movement history data (each of three-dimensional data other than interpolated data) serving as the new sample $x_{M+1}$ to a row of the center value table corresponding to the state node corresponding to the new sample $x_{M+1}$.

Lastly, the parameter updating unit 204 divides elements in each row of the center value table with M rows and D columns by the state frequency xhmm.cnt_all(i) updated in the above-mentioned step S124, and also subtracts the square of the center value xhmm.mu(i) after updating therefrom. With that, updating of the distributed value xhmm.sigma2 of the probability distribution of the existing model is ended.

The processing then proceeds to step S127, where the parameter updating unit 204 outputs the parameters of the existing model after updating to the new model connecting unit 203 and updated model organizing unit 205. Specifically, the initial probability xhmm.pi, time series data count xhmm.seq_cnt, transition probability xhmm.a, state frequency xhmm.cnt_all, and the center value xhmm.mu and distributed value xhmm.sigma2 of the probability distribution of the updated existing model are output. With that, the parameter updating processing is ended.

As described above, with the parameter updating processing, with regard to a data missing portion (interpolated data) of known movement history data, only a fact that a route thereof has been passed through (the time series data count xhmm.seq_cnt of the existing model), and the transition parameters (transition probability xhmm.a, state frequency xhmm.cnt_all) of state nodes are updated. In other words, with regard to a data missing portion (interpolated data) of known movement history data, the probability distribution parameters (center value xhmm.mu and distributed value xhmm.sigma2) of state nodes are not updated. This is because the interpolated data has a high possibility to deviate from the actual route. Thus, there can be prevented deterioration in reliability of the probability distribution parameters of state nodes regarding movement history data such that the actual data has been obtained at least once, but not obtained this time on some conditions.

[Whole Processing of Learning Main Processor 23]

Figure 51:
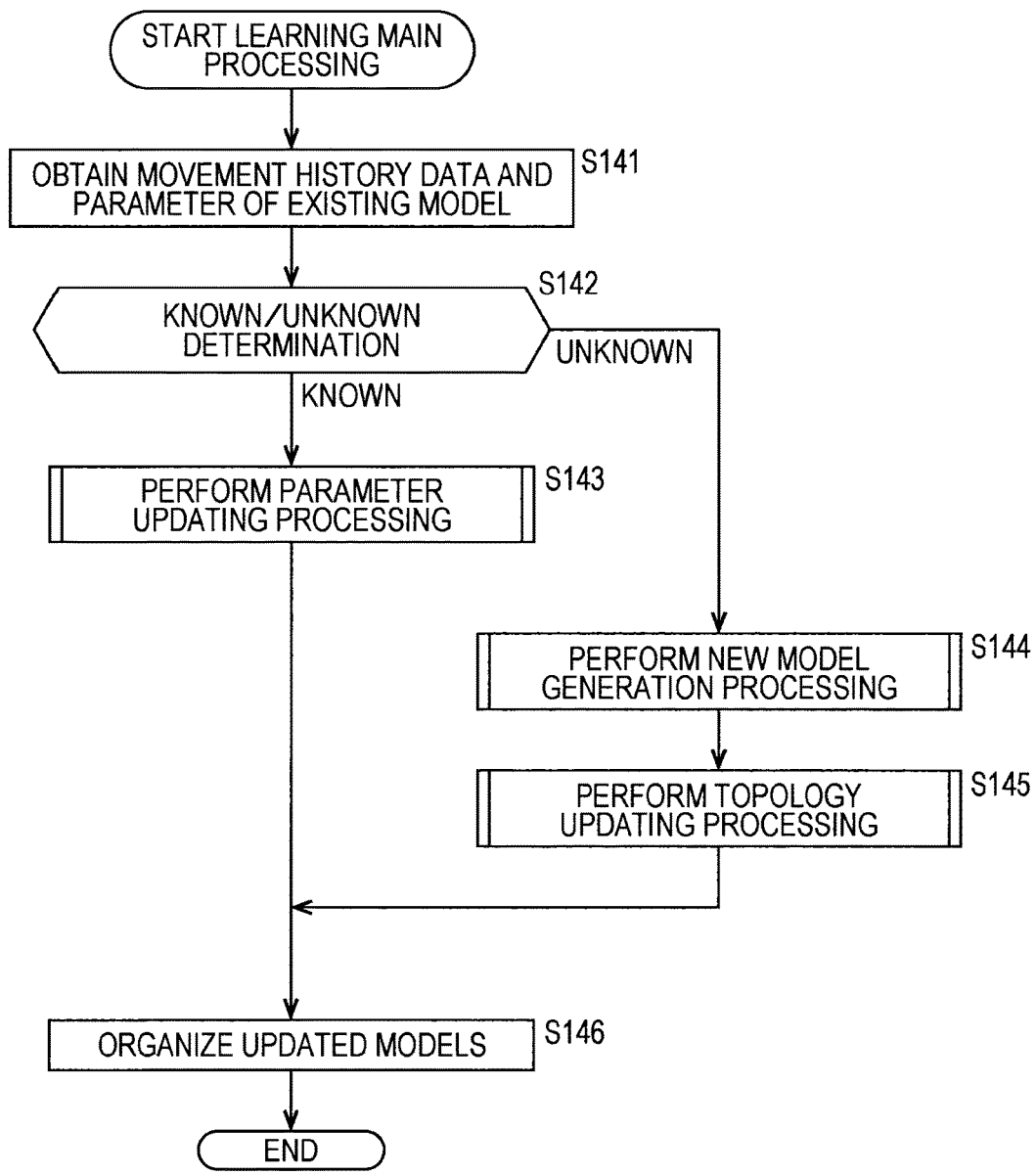
FIG. 51 is a flowchart of the entire learning main process processing of the learning main processor.

Next, the whole learning main processing of the learning main processor 23 will be descried with reference to the flowchart in FIG. 51.

First, in step S141, the learning main processor 23 obtains movement history data supplied from the learning preprocessor 22 (FIG. 1), and the parameters of the existing model supplied from the model-parameter-by-user storage unit 12 (FIG. 1). The movement history data is obtained by the known/unknown determining unit 201, and the parameters of the existing model is obtained by the known/unknown determining unit 201, new model connecting unit 203, and parameter updating unit 204.

In step S142, the known/unknown determining unit 201 performs known/unknown determination processing to determine whether the supplied movement history data is movement history data in a known route.

As described with reference to FIG. 21 to FIG. 29, with the known/unknown determination processing, known or unknown determination is performed by performing Viterbi estimation using an unknown state addition model wherein an unknown state node has been added to state nodes of an existing model, and performing Viterbi determination using an known and unknown two-state model.

With the known/unknown determination processing, in the event that the supplied movement history data has been determined to be known, the supplied movement history data and interpolation flag series data, and node series data which is time series data of a state node corresponding thereto are supplied to the parameter updating unit 204. On the other hand, with the known/unknown determination processing, in the event that the supplied movement history data has been determined to be unknown, the supplied movement history data is supplied to the new model generating unit 202. Also, in the event that the unknown movement history data is connected to a known state node (route), the state node of the connection destination is also supplied to the new model generating unit 202.

In the event that the supplied movement history data has been determined to be known in step S142, the processing proceeds to step S143, where the parameter updating unit 204 performs parameter updating processing to update the parameters of the existing model based on the known movement history data, and node series data and interpolation flag series data corresponding thereto. Specifically, the processing described with reference to FIG. 44 to FIG. 50 is performed.

On the other hand, in the event that the supplied movement history data has been determined to be unknown in step S142, the processing proceeds to step S144, where the new model generating unit 202 performs new model generation processing to generate a new model corresponding to the unknown movement history data. In other words, the new model generating unit 202 obtains the parameters of a new model which expresses the unknown movement history data. The new model generation processing is specifically the processing described with reference to FIG. 30 to FIG. 36.

In step S145, the new model connecting unit 203 connects the exiting model and the new model, and performs topology updating processing to generate a topology updated model matured by incorporating the unknown movement history data into a learned existing model. Specifically, the new model connecting unit 203 performs the processing descried with reference to FIG. 37 to FIG. 43.

After the processing in step S143 or S145, in step S146 the updated model organizing unit 205 deletes a state node having no transition from another state node and just self transition, thereby organizing the parameter updated models or topology updated models. The updated model organizing unit 205 supplies the parameters of the updated model after organization to the learning postprocessor 24 and model-parameter-by-user storage unit 12, and the processing is ended.

[Processing of Destination and Route Point Detector 25]

Next, processing of the destination and route point detector 25 of the learning block 11 (FIG. 1) will be described with reference to FIG. 52.

As described above, the learning main processor 23 takes movement history data after processing for dividing movement history data, processing for linear interpolation, movement attribute identifying processing, or the like as data for learning to learn parameters of the user's activity model. The learning postprocessor 24 then generates state series data corresponding to the movement history data using the parameters obtained by learning.

Figure 52:
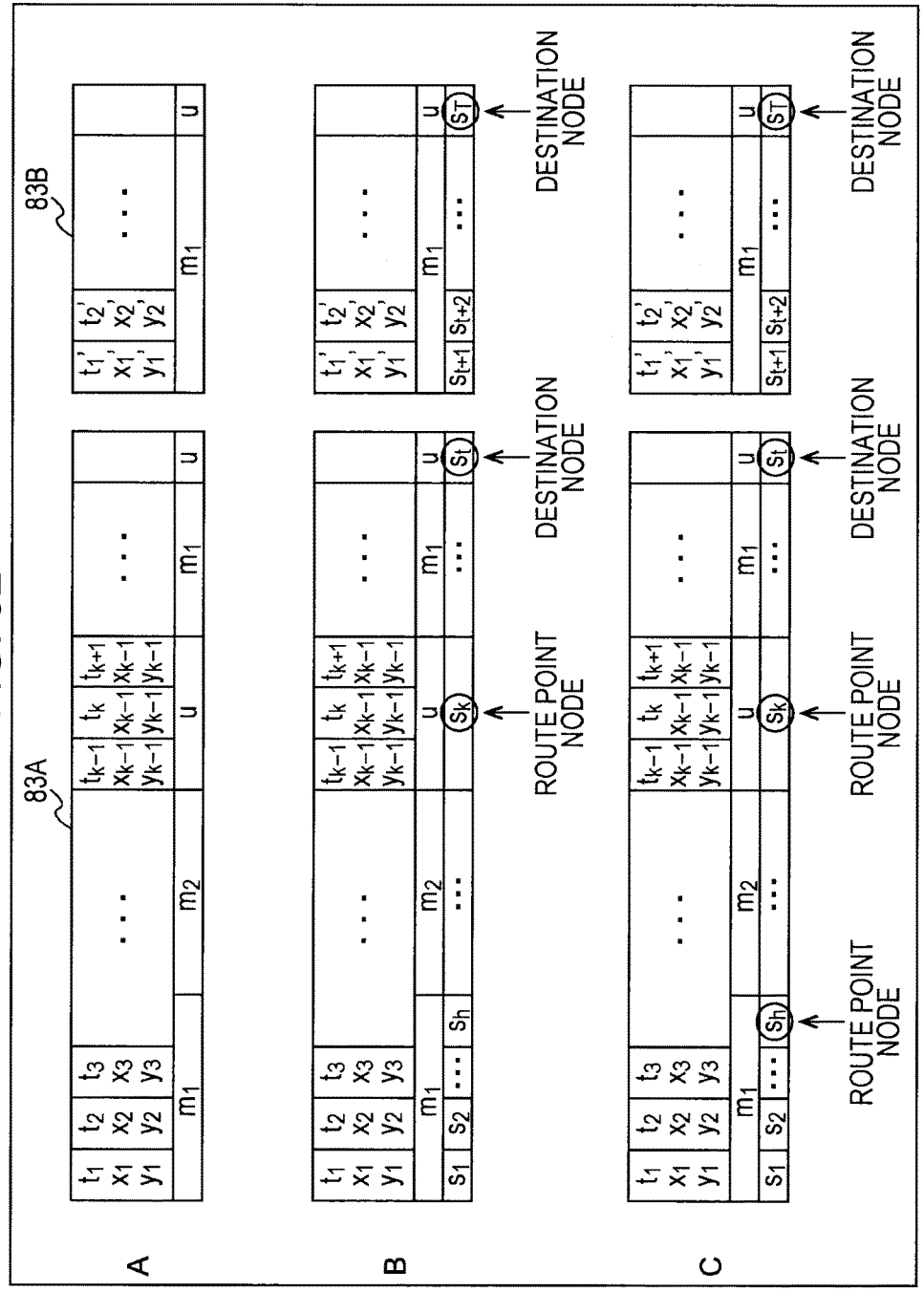
FIG. 52 is a diagram for describing processing of a destination and route point detector.

A in FIG. 52 illustrates the movement history data 83A and 83B with a movement attribute illustrated in the lower tier in FIG. 8 after dividing and hold of movement history data are performed by the learning preprocessor 22.

B in FIG. 52 is a diagram illustrating the movement history data 83A and 83B with a movement attribute illustrated in the lower tier in FIG. 8, and the corresponding state series data together.

State series nodes of $s_1, s_2, \ldots, s_k, \ldots, s_t$ correspond to the movement history data 83A with a movement attribute. State series nodes of $s_{t+1}, s_{t+2}, \ldots, s_T$ correspond to the movement history data 83B with a movement attribute.

The destination and route point detector 25 detects a state node corresponding to three-dimensional data in the last "stay state (u)" of a batch of movement history data with a movement attribute, and adds a destination attribute thereto. With the example in B in FIG. 52, a destination attribute is added to the state node $s_t$ of the movement history data 83A with a movement attribute, and the state node $s_T$ of the movement history data 83B with a movement attribute. Both of the state node $s_t$ of and state node $s_T$ are state nodes where the stay state has continued for the stay threshold time or longer. In this manner, the state nodes corresponding to movement history data where the stay state has continued for the stay threshold time or longer is estimated as destinations by the destination and route point detector 25.

Note that, with the dividing processing described with reference to FIG. 8, multiple "moving states" equal to or longer than the last stay threshold time of the divided movement history data has been reduced to one "stay state". However, with the dividing processing, all of the multiple "moving states" equal to or longer than the last stay threshold time of the movement history data may also be deleted. When describing this using the example in A in FIG. 52, three-dimensional data of the last "stay state (u)" of each of the movement history data 83A and 83B with a movement attribute may be omitted. In this case, the destination and route point detector 25 adds a destination attribute to a state node corresponding to the last three-dimensional data of a batch of movement history data with a movement attribute. When describing this using the example in B in FIG. 52, the state node $s_{t-1}$ one ahead of the state node $s_t$ of the movement history data 83A with a movement attribute, and the state node $S_{T-1}$ one ahead of the state node $s_T$ of the movement history data 83B with a movement attribute have to be taken as destinations.

The destination and route point detector 25 also detects a state node corresponding to three-dimensional data in "stay state (u)" in the middle of a batch of movement history data with a movement attribute, and adds a route point attribute thereto. Specifically, a state node corresponding to movement history data of which the duration time in the stay state is shorter than the stay threshold time is estimated as a route point. When describing this using the example in B in FIG. 52, the state node $s_k$ of the movement history data 83A with a movement attribute is determined to be a route point.

Note that the destination and route point detector 25 may also add a route point attribute to the last state node $s_h$ before change when the moving means is changed as illustrated in C in FIG. 52.

[Processing of Learning Block 11]

Figure 53:
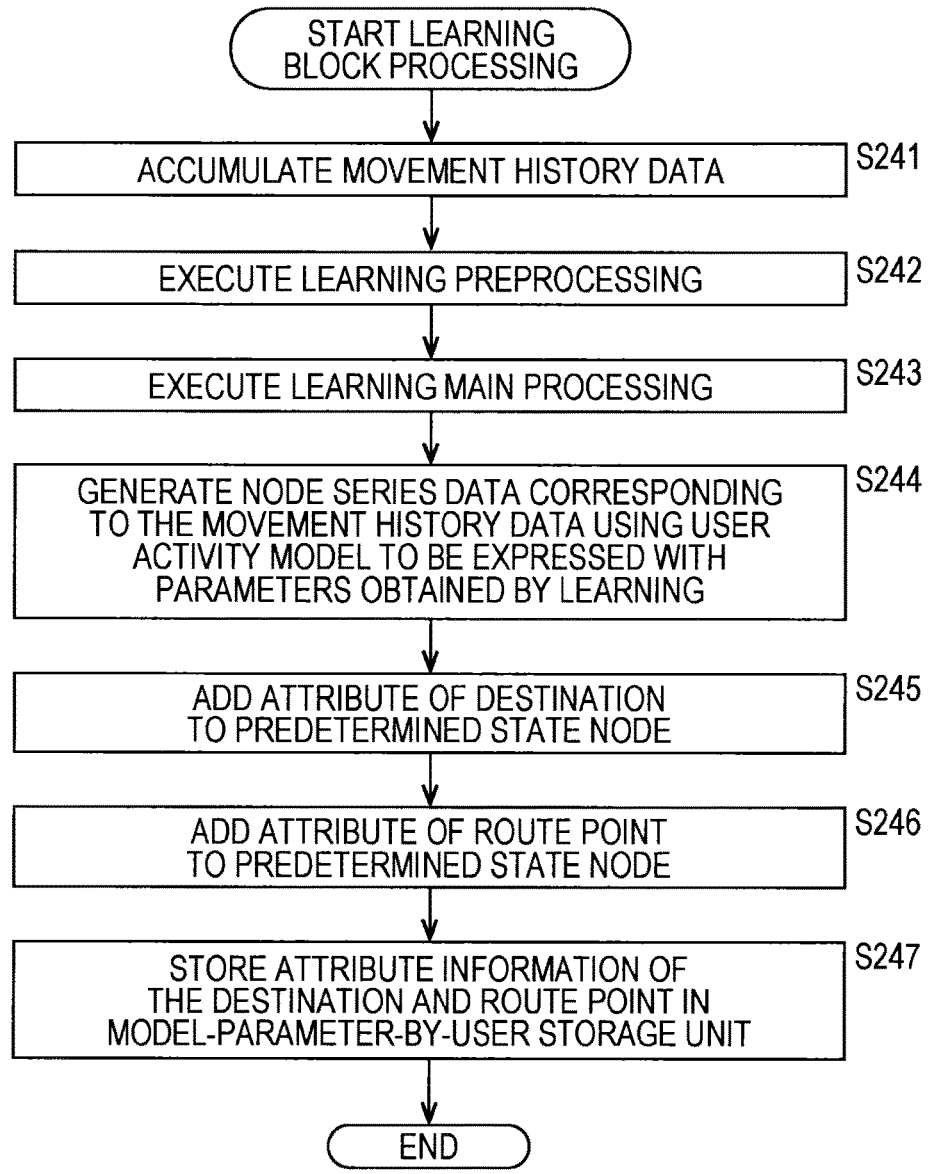
FIG. 53 is a flowchart for describing the entire processing of the learning block.

The whole processing of the learning block 11 will be described with reference to the flowchart in FIG. 53.

First, in step S241, the history data accumulating unit 21 accumulates movement history data supplied from the sensor device as data for learning.

In step S242, the learning preprocessor 22 executes the learning preprocessing described with reference to FIG. 19. Specifically, the learning preprocessor 22 performs processing to connect and divide movement history data accumulated in the history data accumulating unit 21, linear interpolation processing of a data missing portion, adding of a movement attribute such as "stay state" or "moving state", or the like.

In step S243, the learning main processor 23 executes the learning main processing described with reference to FIG. 51. Specifically, the learning main processor 23 determines the supplied user's movement history data to be known or unknown, and updates the parameters of the HMM serving as the user's activity model according to the determination result. In the event of unknown movement history data having been supplied, there are obtained the parameters of an HMM of which the topology has been matured in accordance with expansion of the moving range. The parameters of the user's activity model obtained by the learning main processing are supplied to the learning postprocessor 24 and model-parameter-by-user storage unit 12, and stored in the model-parameter-by-user storage unit 12.

In step S244, the learning postprocessor 24 generates a node series data corresponding to the movement history data using the user's activity model that are expressed by the parameters obtained by learning.

In step S245, the destination and rout point detector 25 adds a destination attribute to a predetermined state node of state series nodes corresponding to the movement history data with a movement attribute. More specifically, the destination and route point detector 25 adds a destination attribute to a state node corresponding to movement history data of which the stay state continues for the stay threshold time or longer.

In step S246, the destination and route point detector 25 adds a route point attribute to a predetermined state node of state series nodes corresponding to the movement history data with a movement attribute. More specifically, the destination and route point detector 25 adds a route point attribute to a state node corresponding to movement history data of which the duration time of the stay state is shorter than the stay threshold time.

In step S247, the destination and route point detector 25 stores information regarding a destination or route point attribute added to a state node in the model-parameter-by-user storage unit 12, and the processing is ended.

[Configuration Example of Prediction Preprocessor 32]

Next, processing to be performed by the prediction block 13 will be described.

Figure 54:
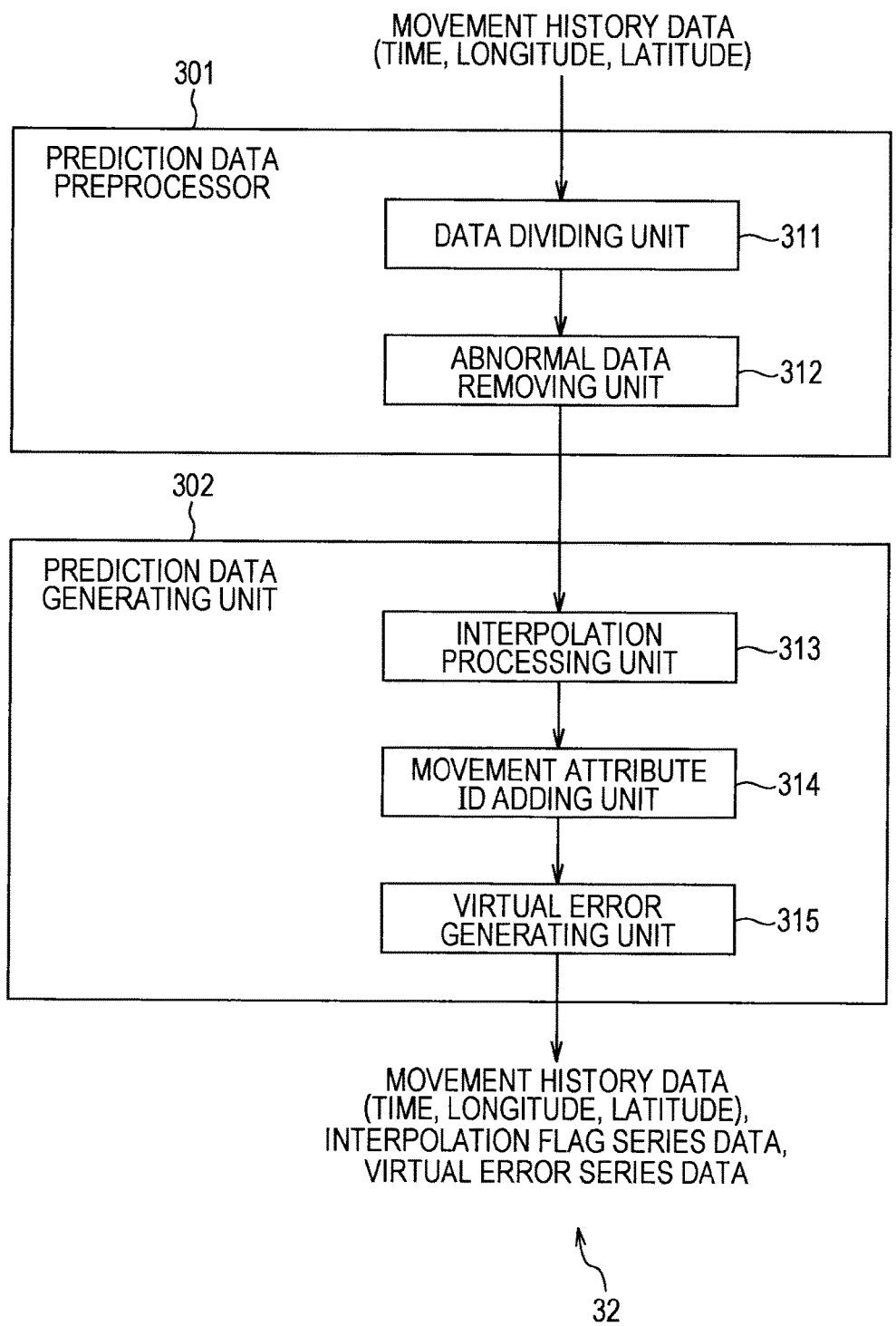
FIG. 54 is a block diagram illustrating a detailed configuration example of a prediction preprocessor.

FIG. 54 is a block diagram illustrating a detailed configuration example of the prediction preprocessor 32.

The prediction preprocessor 32 is configured of a prediction data preprocessor 301 and a prediction data generating unit 302. The prediction data preprocessor 301 is made up of a data dividing unit 311 and an abnormal data removing unit 312, and the prediction data generating unit 302 is made up of an interpolation processing unit 313, a movement attribute identification adding unit 314, and a virtual error generating unit 315.

The data dividing unit 311 divides, as with the dividing processing to be performed by the data connecting/dividing unit 71 of the learning preprocessor 22, in the event that there is data missing equal to or longer than missing threshold time, obtained movement history data ahead or behind thereof. Note that the missing threshold time does not have to be the same as the missing threshold time to be set at the data connecting/dividing unit 71.

The abnormal data removing unit 312 performs, as with the abnormal data removing unit 72 of the learning preprocessor 22, processing to remove explicit abnormal data of the obtained movement history data.

The interpolation processing unit 313 performs, as with the resampling processing unit 73 of the learning preprocessor 22, resampling of movement history data with a certain time interval adapted to processing units (prediction main processor 33 and so forth) on the subsequent stages.

Also, in the event that a data missing portion is included in the obtained movement history data, the interpolation processing unit 313 performs interpolation processing to interpolate the portion thereof. Here, there are two kinds of data missing portions of (1) in the event that data can normally be obtained at present, and there was missing of data for the past predetermined period of time, and (2) in the event that no data at present can be obtained, and un-acquiring of data has been continued for a predetermined period of time including the present time.

(1) in the event that data at present can normally be obtained, the interpolation processing unit 313 performs, as with the resampling processing unit 73 of the learning preprocessor 22, interpolation processing according to the linear interpolation in Expression (1) on a data missing portion for the past predetermined period of time.

On the other hand, (2) in the event that data at present cannot be obtained, the interpolation processing unit 313 performs processing to interpolate a data missing portion including the present time assuming that (the obtained last) three-dimensional data immediately before missing continues. Specifically, in the event that three-dimensional data at point-in-time $T_1$ immediately before data missing is $x^{real}_{T_1}$, the interpolation processing unit 313 generates each three-dimensional data from the next point-in-time $T_1+1$ to the point-in-time t at present by the following Expression (37).

$$x^{virtual}_t = x^{virtual}_{T_1+1} = x^{real}_{T_1} \quad (37)$$

Note that, as the interpolation processing for a data missing portion including the present time, it goes without saying that in addition to the above-mentioned hold interpolation, there may be obtained interpolated data by other processing such as extrapolation wherein tracing of data obtained by the sensor device is employed, filtering (Kalman filter) or the like.

The interpolation processing unit 313 also generates, as with the resampling processing unit 73 of the learning preprocessor 22, interpolation flag series data which is time series data of an interpolation flag that indicates whether or not each three-dimensional data that makes up movement history data is interpolated data generated by the interpolation processing.

The movement attribute identification adding unit 314 performs the same processing as with the movement attribute identification adding unit 74 of the learning preprocessor 22. Specifically, the movement attribute identification adding unit 314 identifies, regarding each three-dimensional data of the obtained movement history data, a movement attribute of "stay state" or "moving state", and adds this thereto. With regard to a movement attribute of "moving state", moving means (car, bus, train, walk, or the like) may further be identified.

The virtual error generating unit 315 calculates virtual error $e_t$ for interpolated data generated by the interpolation processing at the interpolation processing unit 313.

More specifically, with regard to (1) a data mission portion of the past predetermined period of time not including data at present, the virtual error generating unit 315 calculates the virtual error $e_t$ by the above-mentioned Expression (8).

On the other hand, with regard to (2) a data missing portion including data at present, there is no three-dimensional data $X^{real}_{T_2}$ at point-in-time $T_2$ immediately after data restoration in Expression (8), and accordingly, the virtual error $e_t$ cannot be obtained by Expression (8).

Therefore, the virtual error generating unit 315 calculates the virtual error $e_t$ using a predetermined function according to elapsed time since data was missing. As for the predetermined function according to elapsed time, for example, there may be employed a function to increase with certain magnitude per unit time, or a function to increase with a fixed magnitude per unit time until a predetermined time since interpolated data was obtained, and thereafter to become a fixed value.

The virtual error $e_t$ to increase with a fixed magnitude until a predetermined period of time since interpolated data was obtained, and thereafter to become a fixed value can be obtained by the following Expression (38), for example.

$$e_t = \begin{cases} \gamma(t - T_1) & T_1 < t < T_1 + TB \\ \gamma \cdot TB & T_1 + TB \leq t \end{cases} \quad (38)$$

TB in Expression (38) is a predetermined constant (fixed value) that represents elapsed time since interpolated data was obtained, and γ is a coefficient equivalent to increase amount per unit time.

Note that the virtual error $e_t$ may also have a fixed magnitude regardless of elapsed time since data was missing.

The virtual error unit 315 outputs the movement history data after the interpolation processing, interpolation flag series data (time series data of an interpolation flag) and virtual error series data (time series data of virtual error) corresponding thereto to the prediction main processor 33 on the subsequent stage.

Figure 55:
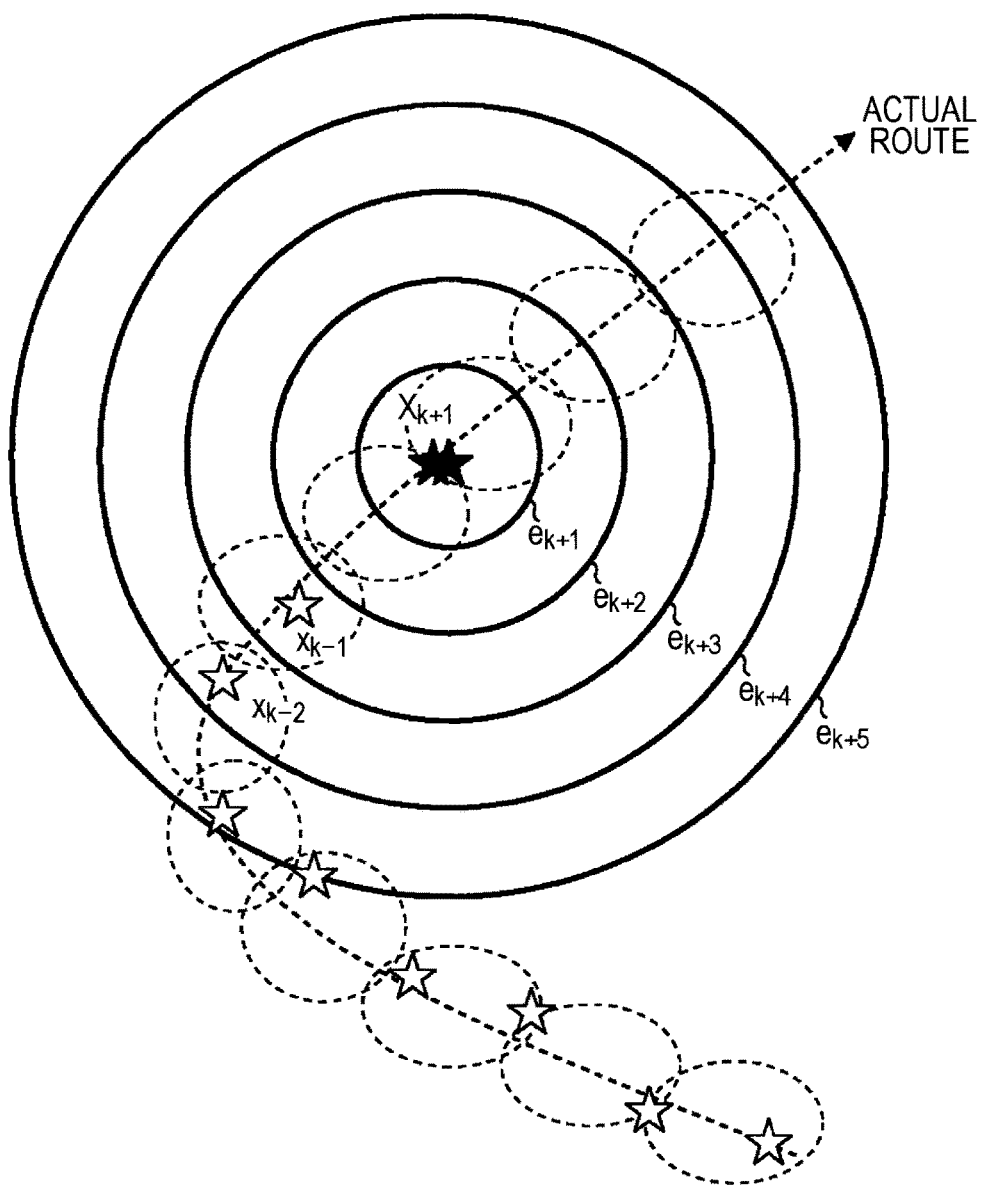
FIG. 55 is an image diagram of virtual error in hold interpolation processing.

FIG. 55 is an image diagram of the virtual error $e_t$ when three-dimensional data is generated by the hold interpolation processing.

FIG. 55 is an example of a case wherein the sensor device was able to actually obtain data until point-in-time $t_k$, and data was missing at point-in-time $t_{k+1}$ and thereafter.

In this case, three-dimensional data $x_{k+1}$, $x_{k+2}$, $X_{k+3}$, $X_{k+4}$, . . . at the point-in-time $t_{k+1}$ and thereafter are generated as the same value as the three-dimensional data $x_k$ at the point-in-time $t_k$, and virtual error $e_{k+1}$, $e_{k+2}$, $e_{k+3}$, $e_{k+4}$, . . . increase with a fixed magnitude over elapsed time. Thus, the user's movement history at the time of data missing and thereafter can be included in the range of the virtual error.

FIG. 56 conceptually illustrates movement history data after the interpolation processing and virtual error corresponding thereto.

In FIG. 56, of two columns arrayed in both sides, the left-side column indicates movement history data after the prediction data generating unit 302 performed the interpolation processing, and the right-side column indicates virtual error series data calculated for the movement history data thereof.

Of two dashed-line frames illustrated in FIG. 56, movement history data from point-in-time $t_6$ to point-in-time $t_8$ surrounded by the upper-side dashed-line frame indicates interpolated data generated by the linear interpolation. Specifically, the three-dimensional data from the point-in-time $t_6$ to point-in-time $t_8$ is data calculated by Expression (1) using three-dimensional data at point-in-time $t_5$ and point-in-time $t_9$ before and after data missing. Virtual error corresponding to the three-dimensional data from the point-in-time $t_6$ to point-in-time $t_8$ is calculated by Expression (8).

On the other hand, of the two dashed-line frames, movement history data from point-in-time $t_{k+1}$ to point-in-time $t_T$ surrounded by the lower-side dashed-line frame indicates interpolated data generated by the hold interpolation. Accordingly, the longitude and latitude of the three-dimensional data from the point-in-time $t_{k+1}$ to point-in-time $t_T$ (x, y in FIG. 56) have the same values as with the longitude and latitude of the three-dimensional data at the point-in-time $t_k$ immediately before data missing. Virtual error corresponding to the three-dimensional data from the point-in-time $t_{k+1}$ to point-in-time $t_T$ is calculated by Expression (38) or the like, for example.

Note that, of the three-dimensional data generated by the interpolation processing, the point-in-time is the same as with the actual data (after resampling), and accordingly, virtual error thereof is 0.

Incidentally, with the example in FIG. 56, virtual error of three-dimensional data other than interpolated data is set to 0. This is because it is assumed that three-dimensional data obtained by the sensor device has no error.

However, it may also be assumed that the sensor device itself has error. For example, precision (accuracy of position) of the GPS sensor frequently differs depending on moving means (car, bus, train, walk, or the like). Specifically, in the event that the user is moving by "walk" or by "bicycle", the sensor device which the user puts on is located outdoors, and accordingly, it can be expected that the signal quality of a reception signal is good, and error is less. On the other hand, in the event that the user is moving by "train" or by "car", the sensor device is in the train or car (indoor), and accordingly, a state of catching a satellite is poor, and signal quality is poor, and error increases.

Therefore, in the event that "moving state" is identified for each moving means (car, bus, train, walk, or the like) by the movement attribute identification adding unit 314, the virtual error $e_t$ according to the moving means may also be set to three-dimensional data other than interpolated data. For example, an arrangement may be made wherein, in the event that the movement attribute is "moving state", and the moving means is "walk" or "bicycle", the virtual error $e_t$ is set to "10 m", and in the event that the moving means is "train" or "car", the virtual error $e_t$ is set to "50 m".

Figure 57:
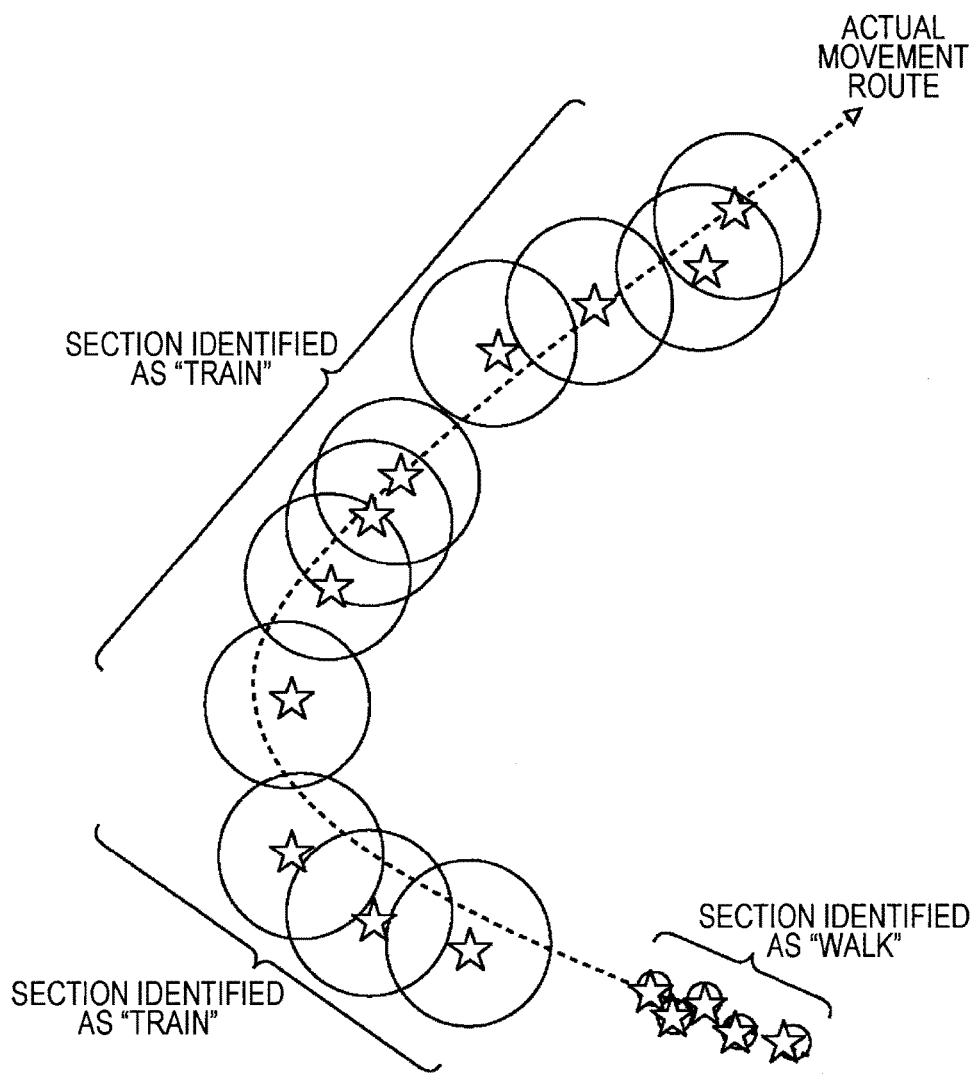
FIG. 57 is an image diagram of virtual error according to moving means.

FIG. 57 is an image diagram in the event that the virtual error $e_t$ is set according to the moving means.

In FIG. 57, a white star mark (☆) indicates three-dimensional data obtained by the sensor device, and a circle around thereof indicates virtual error that is set according to the moving means by the virtual error generating unit 315. Greater virtual error than that of three-dimensional data of which the moving means have been identified as "walk" is set to three-dimensional data of which the moving means have been identified as "train".

[Prediction Data Generation Processing]

Figure 58:
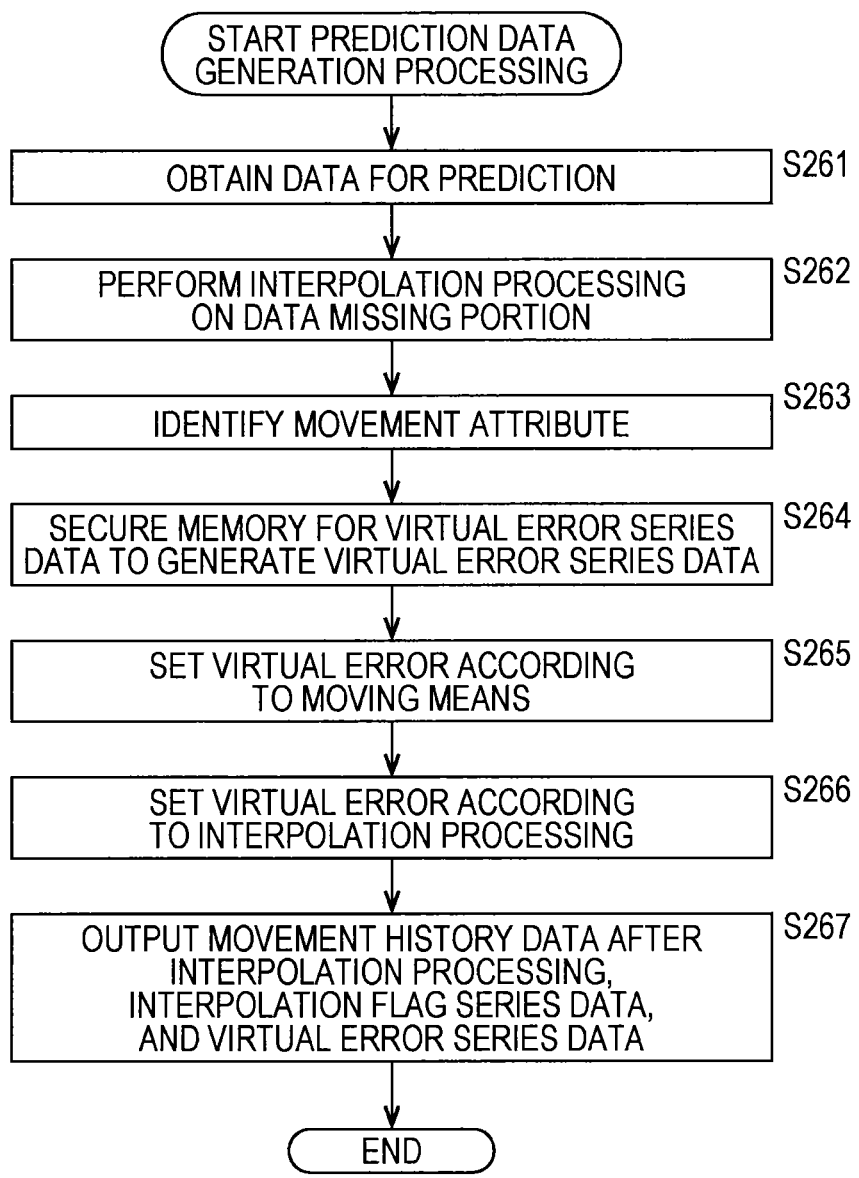
FIG. 58 is a flowchart for describing prediction data generation processing by a prediction data generating unit.

FIG. 58 is a flowchart of prediction data generation processing by the prediction data generating unit 302 in the event that the virtual error is set according to the moving means.

First, in step S261, the interpolation processing unit 313 obtains movement history data serving as data for prediction supplied from the prediction data preprocessor 301. There is still a data missing portion included in the movement history data obtained here.

In step S262, the interpolation processing unit 313 performs, in the event that there is a data missing portion in the obtained data for prediction, interpolation processing on the data missing portion thereof. More specifically, the interpolation processing unit 313 performs interpolation processing by linear interpolation using the above-mentioned Expression (1) on the data missing portion of the movement history data for the past predetermined period of time (predetermined section) not including the present time. On the other hand, as for the data missing portion including the present time, the interpolation processing unit 313 performs hold interpolation processing using (the obtained last) three-dimensional data immediately before data missing. Also, the interpolation processing unit 313 also generates interpolation flag series data at the same time as with the interpolation processing.

In step S263, the movement attribute identification adding unit 314 identifies, regarding each three-dimensional data of the movement history data, a movement attribute of "stay state" or "moving state", and adds this thereto. Also, with regard to the movement attribute of "moving state", moving means (car, bus, train, walk, or the like) is also identified, and the movement attribute for each moving means is added.

According to the processing in steps S262 and S263, interpolation flag series data that indicates whether the movement history data is interpolated data, and movement attribute series data that indicates movement attributes, corresponding to the supplied movement history data, are generated, and are supplied to the virtual error generating unit 315 along with the movement history data after the interpolation processing.

In step S264, the virtual error generating unit 315 secures memory for virtual error series data corresponding to the movement history data after the interpolation processing, and generates virtual error series data. With the virtual error series data generated here, "0" serving as an initial value is set to all of the virtual errors.

Note that amount to be secured as memory for the virtual error series data is, in the event of setting virtual error to interpolated data alone, equivalent to the number of interpolated data, and in the event of setting virtual error of moving means as well, equivalent to the number of three-dimensional data of the movement history data.

In step S265, the virtual error generating unit 315 sets virtual error according to moving means such as "walk" or "train" or the like to the virtual error series data. Specifically, the virtual error generating unit 315 includes a virtual-error-by-moving-means table in which virtual error to be set for each moving means is stored, and references the virtual-error-by-moving-means table to set virtual error in a portion corresponding to the virtual error series data according to each moving means that the movement attribute series data indicates.

In step S266, the virtual error generating unit 315 sets virtual error according to the interpolation processing to the virtual error series data. Specifically, the virtual error generating unit 315 references the interpolation flag series data to calculate, at the portion of virtual error corresponding to interpolated data, virtual error in Expression (8) at the time of interpolated data after linear interpolation, and to calculate virtual error in Expression (38) or the like at the time of interpolated data after hold interpolation, and adds these.

In step S267, the virtual error unit 315 outputs the movement history data after the interpolation processing, and interpolation flag series data and virtual error series data corresponding thereto to the prediction main processor 33 on the subsequent stage, and the processing is ended.

With the above-mentioned processing, though an example has been described wherein in step S266 virtual error according to moving means and virtual error according to the interpolation processing are simply added, virtual error according to moving means and virtual error according to the interpolation processing can be synthesized by calculation other than simple addition. For example, a value obtained by the square root of summation of the square of virtual error according to moving means, and the square of virtual error according to the interpolation processing can be taken as the final virtual error.

Note that, with the known/unknown determining unit 201 of the learning main processor 23 of the learning block 11, in the event of obtaining the observation probability P(o$_t$, e$_t$|s$_i$) with virtual error being taken into consideration as well, not only virtual error according to the interpolation processing but also virtual error according to moving means described above may be included.

[Processing of Prediction Main Processor 33]

Next, processing to be performed by the prediction main processor 33 will be described.

Figure 59:
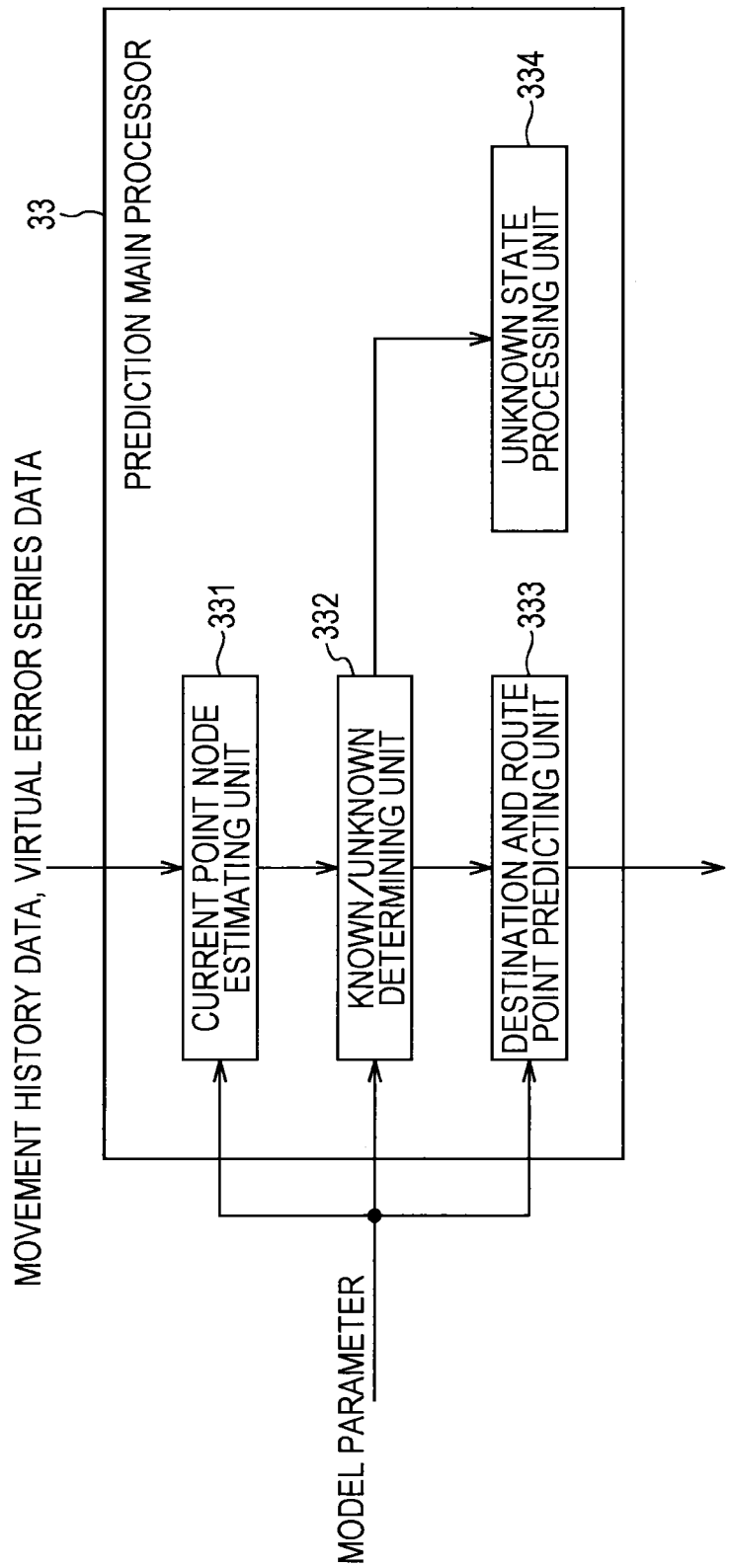
FIG. 59 is a block diagram illustrating a detailed configuration example of a prediction main processor.

FIG. 59 is a block diagram illustrating a detailed configuration example of the prediction main processor 33.

The prediction main processor 33 is configured of a current point node estimating unit 331, a known/unknown determining unit 332, a destination and route point predicting unit 333, and an unknown state processing unit 334.

The movement history data and virtual error series data supplied from the prediction preprocessor 32, and (the parameters of) the user's activity model obtained by learning of the learning block 11 are supplied to each of the current point node estimating unit 331, known/unknown determining unit 332, and destination and route point predicting unit 333.

The current point node estimating unit 331 estimates a state node (current point node) corresponding the user's current location using the movement history data and virtual error series data supplied from the prediction preprocessor 32, and the user's activity model obtained by learning of the learning block 11.

The Viterbi algorithm is employed for calculation of node series data, but as with the state node estimating unit 223 of the known/unknown determining unit 201, with regard to an interpolated data portion of the movement history data, the observation probability P(o$_t$, e$_t$|s$_i$) with the virtual error being taken into consideration in the above-mentioned Expression (7) is employed. That is to say, with regard to the interpolated data portion, observation probability with less distribution of data than the actual data is employed. Thus, as with the state node estimating unit 223 of the known/unknown determining unit 201, even when the interpolated data is actually greatly distanced from the center µ$_i$ of the corresponding state node s$_i$, the maximum likelihood state transition regarding the data missing portion can be estimated.

Note that the present invention is for enabling state node estimation to be performed without collapse even when there is a data missing portion included in the obtained movement history data, i.e., for enabling estimation of the current point node to be performed. To that end, with estimation of a state node even for the data missing portion, observation probability has to be calculated. In other words, even with a method for not generating interpolated data and virtual error, observation probability has to be calculated.

Therefore, for example, with regard to an interpolated data portion of movement history data, observation probability (o$_t$|s$_i$) represented by the following Expression (39) may be employed instead of the observation probability P(o$_t$, e$_t$|s$_i$) with the virtual error in Expression (7) being taken into consideration.

$$P(o_t | s_i) = \frac{1}{M} \quad (39)$$

Expression (39) is the simplest observation probability generation method assuming that the observation probability of the state node s$_i$ is equal regarding all of the state nodes regardless of the parameter (µ$_i$, σ$_i$) of a state node and the value of interpolated data. In this case, interpolated data and virtual error do not have to be generated, information to the effect that interpolation has been performed, i.e., interpolation flag series data alone has to be provided from the prediction preprocessor 32.

The known/unknown determining unit 332 determines, as with the known/unknown determining unit 201 of the learning main processor 23, whether the state node corresponding to the user's current location is known or unknown. Note that the known/unknown determining unit 332 differs from the known/unknown determining unit 201 of the learning main processor 23 in that the known/unknown postprocessor 227 is not provided, but has the same configuration other than this point.

The known/unknown determining unit 332 supplies, in the event that the state node corresponding to the current location is known, the result thereof to the destination and route point predicting unit 333. On the other hand, the known/unknown determining unit 332 supplies, in the event that the state node corresponding to the current location is unknown, the result thereof to the unknown state processing unit 334.

The destination and route point predicting unit 333 calculates a node series that can be changed from the current point node to have been determined as known, and an occurrence probability thereof. Specifically, the destination and route point predicting unit 333 calculates a node series from the current point node to the state node (destination node) of the destination, and an occurrence probability thereof. Note that the node of a route point can be included in the node series (route) to the state node of the destination, and accordingly, the prediction main processor 33 also predicts a route point simultaneously with the destination.

The destination and route point predicting unit 333 outputs the route (node series) to the destination serving as the prediction result to the prediction postprocessor 34 (FIG. 1).

On the other hand, the unknown state processing unit 334 which performs processing in the event that the current point node is unknown executes unknown state correspondence processing such as outputting an error message such as "This is an unknown state" or the like.

As described above, the prediction main processor 33 is configured to perform known/unknown determination of the current point node using the known/unknown determining unit 332 after estimating the current point node, and to perform destination prediction only at the time of a known case.

The current point node estimating unit 331 which performs estimation using the stochastic state transition model obtained by learning of the learning block 11 may output an estimation result even if the user is passing through a completely first route, and the current state node is unknown. However, as for a state node in an unknown state, it is difficult to accurately predict future thereof.

[Tree Search Processing of Current Point Node and Thereafter]

Next, description will be made regarding processing to search a destination node reachable from the current point node, and a route thereto (tree search processing of the current point node and thereafter), which the destination and route point predicting unit 333 performs in the event that determination is made that the current point node is known.

There is a reachable destination node in a tree structure made up of nodes that can be changed from the current point node. Accordingly, the destination can be predicted by searching a destination node out of state nodes that make up the tree. Also, with the tree search processing of the current point node and thereafter, in the event that a state node to which a route point attribute has been added (hereinafter, referred to as route point node) has been detected, a route to the route point is also stored.

The states $s_i$ of an HMM obtained by learning represent a predetermined point (location) on a map, and when the state $s_i$ and the state $s_j$ are connected, it may be conceived that this represents a route to move from the state $s_i$ to the state $s_j$.

In this case, the points corresponding to the states $s_i$ can be classified into one of an end point, a passing point, a branch point, and a loop. The end point is a point having an extremely less probability other than self transition (a probability other than self transition is equal to or smaller than a predetermined value), and having no movable point next time. The passing point is a point having one meaningful transition other than self transition, in other words, a point having one movable point next time. The branch point is a point having two or more meaningful transitions other than self transition, in other words, a point having two or more movable points. The loop is a point that agrees with any one in the route passed through so far.

In the event of searching a route to the destination, when there are different routes, it is desirable to present information such as time required and so forth regarding each route. Therefore, in order to search just enough available routes, the following conditions are set.

(1) A route that has branched once is regarded as another route even when joining together.

(2) An unsearched list is created when a route under search reaches a branch point, and search of a branch destination of the unreached list is performed.

(3) When an end point or loop appears within the route, search of the route thereof is ended. Note that, in the event of returning to the last point from the current point again, this is included in a loop.

Figure 60:
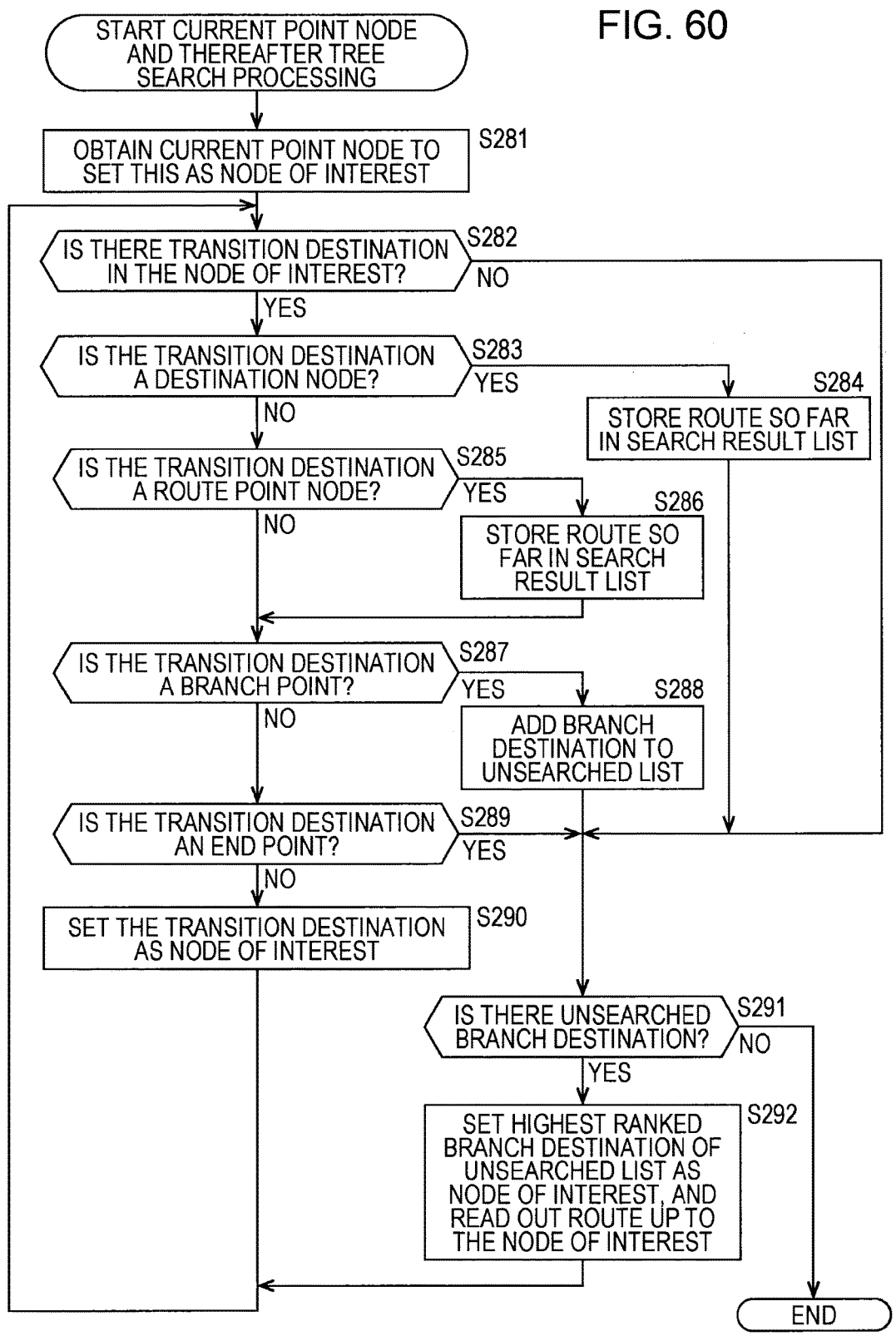
FIG. 60 is a flowchart for describing tree search processing.

FIG. 60 is a flowchart of the tree search processing of the current point node and thereafter by the destination and route point predicting unit 333 of the prediction main processor 33.

With the processing in FIG. 60, first, in step S281, the destination and route point predicting unit 333 obtains the current point node estimated by the current point node estimating unit 331 of the prediction main processor 33, and sets this as a node of interest which is a node to be observed.

In step S282, the destination and route point predicting unit 333 determines whether or not the node of interest has a transition destination. In the event that determination is made in step S282 that the node of interest has no transition destination, the processing proceeds to a later-described step S291.

On the other hand, in the event that determination is made in step S282 that the node of interest has a transition destination, the processing proceeds to step S283, where the destination and route point predicting unit 333 determines whether or not the transition destination is the destination node.

In the event that determination is made in step S283 that the transition destination is the destination node, the processing proceeds to step S284, where the destination and route point predicting unit 333 stores the route so far (state node series) in a search result list in the internal memory. After step S284, the processing proceeds to step S291.

On the other hand, in the event that determination is made in step S283 that the transition destination is not the destination node, the processing proceeds to step S285, where the destination and route point predicting unit 333 determines whether or not the transition destination is a route point node.

In the event that determination is made in step S285 that the transition destination is a route point node, the processing proceeds to step S285, where the destination and route point predicting unit 333 stores the route so far (state node series) in the search result list in the internal memory.

In order to output a representative route, a reachable probability, and time required up to the destination as prediction results, only a route when the transition destination is the destination has to be stored in the search result list. However, a route, probability, and time up to a route point may immediately be obtained whenever occasion requires by also storing a route when the transition destination is a route point.

In the event that determination is made in step S285 that the transition destination is not a route point node, or after step S286, the processing proceeds to step S287, where the destination and route point predicting unit 333 determines whether or not the transition destination is a branch point.

In the event that determination is made in step S287 that the transition destination is a branch point, the processing proceeds to step S288, where the destination and route point predicting unit 333 stores (adds) two state nodes of the branch destination in the unsearched list in the internal memory. After step S288, the processing proceeds to step S291. Note that, in the event that the branch destination is any one state node of the route under search, this becomes a loop, and accordingly, the destination and route point predicting unit 333 does not store the state node of the branch destination thereof in the unsearched list.

In the event that determination is made in step S287 that the transition destination is not a branch point, the processing proceeds to step S289, where the destination and route point predicting unit 333 determines whether or not the transition destination is an end point. In the event that determination is made in step S289 that the transition destination is an end point, the processing proceeds to step S291.

On the other hand, in the event that determination is made in step S289 that the transition destination is not an end point, the processing proceeds to step S290, where the destination and route point predicting unit 333 sets the state node of the transition destination as the node of interest, and the processing returns to step S282. Specifically, in the event that the transition destination is none of a destination node, route point node, a branch point, and an end point, the state to be searched is taken as the next state node of the transition destination.

After the processing in step S284, S288, or S289, in the event that the processing has proceeded to step S291, the destination and route point predicting unit 333 determines whether or not there is a state node registered in the unsearched list, i.e., whether or not there is a unsearched branch destination.

In the event that determination is made in step S291 that there is an unsearched branch destination, the processing proceeds to step S292, where the destination and route point predicting unit 333 sets the state node of the branch destination in the top of the unsearched list as the node of interest, and reads out a route up to the node of interest. The processing is then returned to step S282.

On the other hand, in the event that determination is made in step S291 that there is no unsearched branch destination, the tree search processing is ended.

As described above, with the tree search processing, with the tree structure made up of state nodes that can be changed from the user's current point node, processing to search all of the state nodes is performed until the state node reaches the destination node or an end point node (end point) having no transition destination, with the current point node as a starting point. A route from the user's current location to the destination is stored in the search result list as state node series from the current point node. Note that, with the tree search processing, search may be performed until the number of times of search satisfies a predetermined number of times serving as a completion condition.

[Example of Tree Search Results]

The tree search processing of the destination and route point predicting unit 333 will further be described with reference to FIG. 61.

Figure 61:
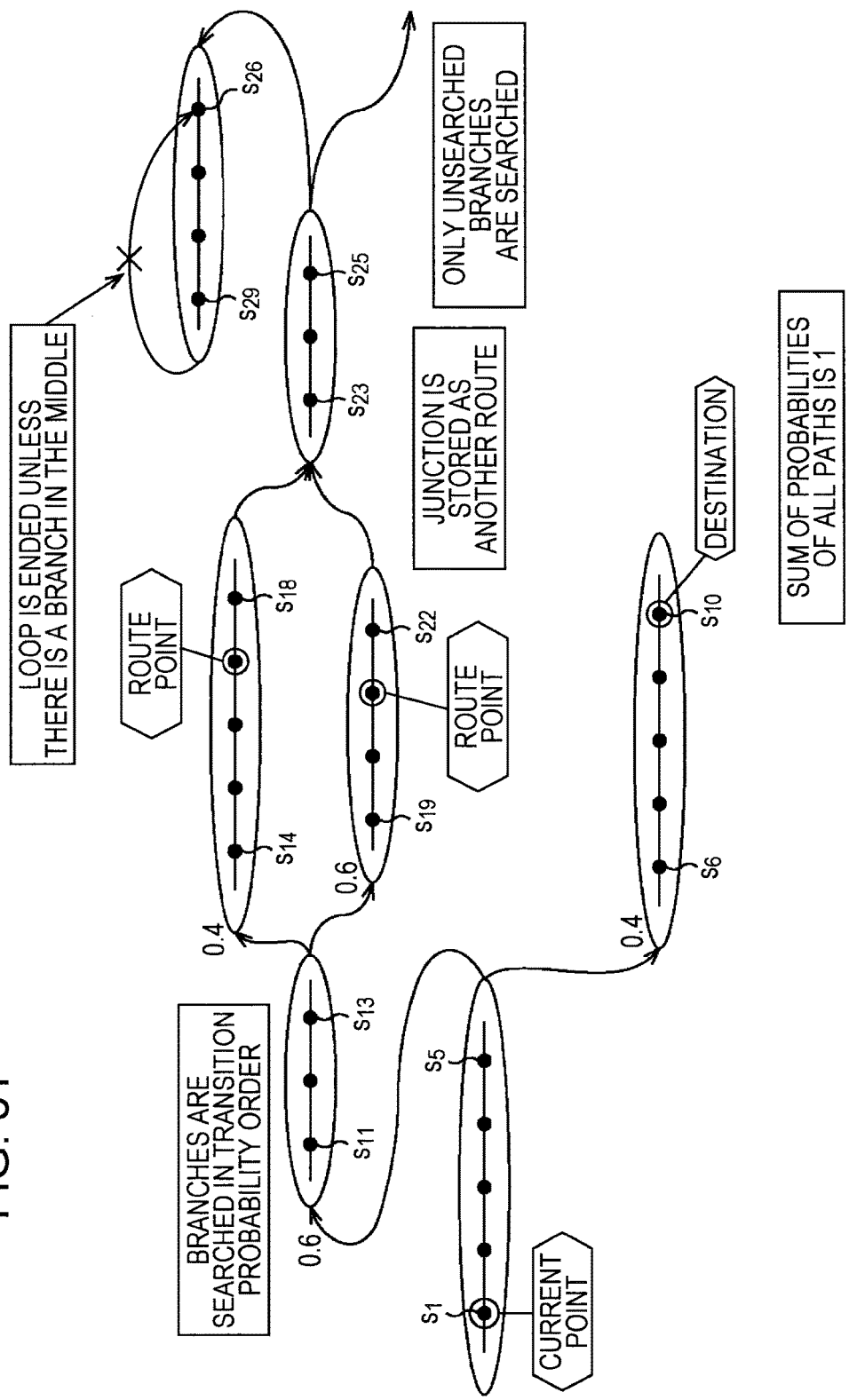
FIG. 61 is a diagram for further describing the tree search processing.

With the example in FIG. 61, in the event that the state $s_i$ is the current location, at least the following three routes will be searched. The first route is a route from the state $s_i$ to the state $s_{10}$) via the state $s_5$, state $s_6$, and so forth (hereinafter, also referred to as route A). The second route is a route from the state $s_i$ to the state $s_{26}$ via the state $s_5$, state $s_{11}$, state $s_{14}$, state $s_{23}$, state $s_{29}$, and so forth (hereinafter, also referred to as route B). The third route is a route from the state $s_1$ to the state $s_{26}$ via the state $s_5$, state $s_{11}$, state $s_{19}$, state $s_{23}$, state $s_{29}$, and so forth (hereinafter, also referred to as route C).

The destination and route point predicting unit 333 calculates probability that each searched route will be selected (selection probability of a route). The selection probability of a route is obtained by sequentially multiplying transition probability between states that make up a route. However, only a case of changing to the next state is taken into consideration, and a case of staying in a place thereof does not have to be taken into consideration, and accordingly, the selection probability of a route is obtained using transition probability [$a_{ij}$] normalized other than self transition probability from the state transition probability $a_{ij}$ of each state obtained by learning.

The transition probability [$a_{ij}$] normalized other than self transition probability can be represented by the following Expression (40).

$$[a_{ij}] = \frac{(1 - \delta_{ij})a_{ij}}{\sum_{j=1}^{N} (1 - \delta_{ij})a_{ij}} \quad (40)$$

Here, δ represents a Kronecker function, which is a function that becomes 1 only when subscripts i and j are the same, and becomes 0 other than that.

Accordingly, for example, in the event that the state transition probability $a_{ij}$ of the state $s_5$ in FIG. 61 is self transition probability $a_{5,5}$=0.5, transition probability $a_{5,6}$=0.2, and transition probability $a_{5,11}$=0.3, transition probability [$a_{5,6}$] and transition probability [$a_{5,11}$] in the event of branching from the state $S_5$ to the state $s_6$ or state $s_{11}$ become 0.4 and 0.6, respectively.

When the node number i of the state $s_i$ of the searched route is ($y_1$, $y_2$, ..., $y_n$), the selection probability of this route can be represented by the following Expression (41) using the normalized transition probability [$a_{ij}$].

$$P(y_1, y_2, \ldots, y_n) = [a_{y_1 y_2}][a_{y_2 y_3}] \ldots [a_{y_{n-1} y_n}] \quad (41)$$

$$= \prod_{i=1}^{n-1} [a_{y_{i-1} y_i}]$$

Note that, in reality, the transition probability [$a_{ij}$] normalized at a passing point is 1, and accordingly, the selection probability of the route is enough to sequentially multiply the normalized transition probability [$a_{ij}$] at the time of branching. Accordingly, the destination and route point predicting unit 333 may calculate the selection probability of the selected route using Expression (41) simultaneously while executing the tree search processing in FIG. 60.

With the example in FIG. 61, the selection probability of the route A is 0.4. Also, the selection probability of the route B is 0.24=0.6×0.4. The selection probability of the route C is 0.36=0.6×0.6. Summation of the calculated selection probabilities of the routes is 1=0.4+0.24+0.36, and accordingly it is found that just enough search can be realized.

Figure 62:
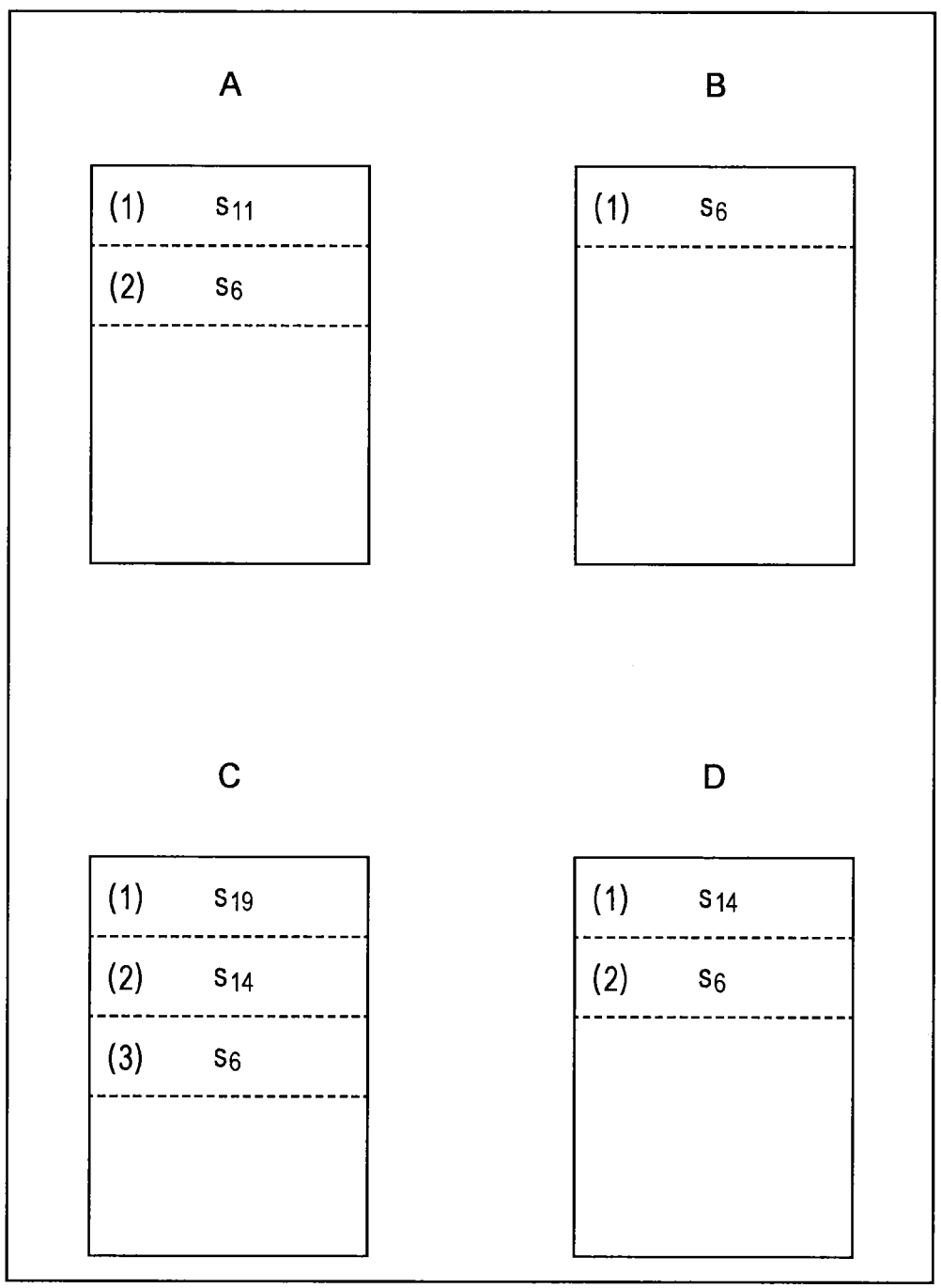
FIG. 62 is a diagram for further describing the tree search processing.

With the example in FIG. 61, the node of interest is sequentially proceeded from the state $s_1$ of the current location, and when the state $s_4$ is the node of interest, the state $s_5$ of the transition destination is a branch point, and accordingly, step S288 in FIG. 60 is executed, and as illustrated in A in FIG. 62, the state $s_{11}$ and state $s_6$ of the branch destinations are stored in the unsearched list. Here, with the state $s_{11}$ and state $s_6$, the selection probability of the state $s_{11}$ is high, and accordingly, the state $s_{11}$ is stored in a higher rank of the unsearched list.

Steps S291 and S292 in FIG. 60 are then executed, the state $s_{11}$ stored in a higher rank of the unsearched list is set as the node of interest, and the route of the state $s_{11}$ and thereafter is searched. When the state $s_{11}$ is set as the node of interest, as illustrated in B in FIG. 62, the state $s_{11}$ is deleted from the unsearched list.

Upon search being advanced with the state $s_{11}$ as the node of interest, the branch destinations of the state $s_{14}$ and state $s_{19}$ are detected, and accordingly, step S288 in FIG. 60 is executed, the state $s_{14}$ and state $s_{19}$ are stored in the unsearched list. At this time, the state $s_{14}$ and state $s_{19}$ are stored in higher ranks of the current unsearched list, and of the state $s_{14}$ and state $s_{19}$, the selection probability of the state $s_{19}$ is higher, and accordingly, the state $s_{19}$ is stored in a higher rank than the state $s_{14}$. Accordingly, the unsearched list becomes as illustrated in C in FIG. 62.

Hereinafter, similarly, steps S291 and S292 in FIG. 60 are executed, the state $s_{19}$ stored in a higher rank of the unsearched list is set as the node of interest, and the route of the state $s_{19}$ and thereafter is searched. When the state $s_{19}$ is set as the node of interest, as illustrated in D in FIG. 62, the state $s_n$ is deleted from the unsearched list.

As described above, with the tree search processing by the destination and route point predicting unit 333, a detected branch destination is recorded in a higher rank of the unsearched list, whereby the processing is executed by a depth-first algorithm to first search, of branch destination routes, one having a higher selection probability.

Note that it may be conceived that it is difficult to all since depth in search becomes deeper, in other words, the hierarchy in a lower rank becomes deeper with the current point node as the highest rank. In such a case, search may be ended in the middle thereof by adding a condition such as: (1) A branch destination having a lower transmission probability is not searched, (2) A route having a lower occurrence probability is not searched, (3) A restriction is applied to depth for search, (4) A restriction is applied to the number of braches to be searched, for example.

FIG. 63 illustrates an example of the search result list in the tree search processing.

From a route having a higher selection probability is sequentially registered in the search result list by performing the tree search processing by the depth-first algorithm.

With the example in FIG. 63, a route $R_1$ ($r_1$, $r_2$, $r_3$, $r_4$) up to a destination $g_1$ is registered in the first of the search result list, a probability that this route $R_1$ will be selected is $P_1$, and time taken up to the destination $g_1$ using the route $R_1$ is $T_1$. A route $R_2$ ($r_1$, $r_2$, $r_3$, $r_5$) up to a destination $g_2$ is registered in the second of the search result list, a probability that this route $R_2$ will be selected is $P_2$, and time taken up to the destination $g_2$ using the route $R_2$ is $T_2$. A route $R_3$ ($r_1$, $r_2$, $r_6$) up to a destination $g_3$ is registered in the third of the search result list, a probability that this route $R_3$ will be selected is $P_3$, and time taken up to the destination $g_3$ using the route $R_3$ is $T_3$.

A route $R_4$ ($r_1$, $r_2$, $r_7$) up to a route point $w_2$ is registered in the fourth of the search result list, a probability that this route $R_4$ will be selected is $P_4$, and time taken up to the route point $w_2$ using the route $R_4$ is $T_4$. A route $R_5$ ($r_1$, $r_8$) up to a route point $w_1$ is registered in the fifth of the search result list, a probability that this route $R_5$ will be selected is $P_5$, and time taken up to the route point $w_1$ using the route $R_5$ is $T_5$.

A route $R_6$ ($r_1$, $r_8$, $w_1$, $r_8$, $r_9$) up to the destination $g_3$ is registered in the sixth of the search result list, a probability that this route $R_6$ will be selected is $P_6$, and time taken up to the destination $g_3$ using the route $R_6$ is $T_6$. A route $R_7$ ($r_1$, $r_{10}$, $r_{11}$) up to the destination $g_2$ is registered in the seventh of the search result list, a probability that this route $R_7$ will be selected is $P_7$, and time taken up to the destination $g_2$ using the route $R_7$ is $T_7$.

A probability that each route will be selected from the destination or a route point is calculated by the above-mentioned Expression (41). Further, in the event that there are multiple routes up to the destination, summation of the selection probabilities of the multiple routes up to the destination becomes the arrival probability of the destination.

Accordingly, with the example in FIG. 63, in order to reach the destination $g_2$, there are a case of employing the route $R_2$ and a case of employing the route $R_7$, and accordingly, the arrival probability of the destination $g_2$ becomes ($P_2+P_7$).

Similarly, in order to reach the destination $g_3$, there are a case of employing the route $R_3$ and a case of employing the route $R_6$, and accordingly, the arrival probability of the destination $g_3$ becomes ($P_3+P_6$). Note that the arrival probability of the destination $g_1$ is the same as the probability $P_1$ for the route $R_1$ being selected.

[Processing of Prediction Postprocessor 34]

Next, processing to be performed by the prediction postprocessor 34 will be described.

Description will be made regarding how to obtain time taken when moving with the selected route up to the destination or a route point.

For example, let us say that the current location at the current point-in-time $t_1$ is state $s_{y1}$, and a route determined at point-in-time ($t_1$, $t_2$, ..., $t_g$) is ($s_{y1}$, $s_{y2}$, ..., $s_{yg}$). In other words, let us say that the node number i of the state $s_i$ of the determined route is ($y_1$, $y_2$, ..., $y_g$). Hereinafter, for simplification of description, the state $s_i$ equivalent to a location may be represented with the node number i thereof.

The current location $y_1$ at the current point-in-time $t_1$ has been determined by the current point node estimating unit 331, and accordingly, a probability $P_{y1}(t_1)$ that the current location at the current point-in-time $t_1$ will be $y_1$ is $P_{y1}(t_1)=1$. Also, a probability that the user will be in another state other than $y_1$ at the current point-in-time $t_1$ is 0.

On the other hand, a probability $P_{yn}(t_n)$ that the user will be in a node number $y_n$ at predetermined point-in-time $t_n$ can be represented by the following.

$$P_{y_n}(t_n) = P_{y_n}(t_n-1)a_{y_ny_n} + P_{y_{n-1}y_n} \quad (42)$$

The first term in the right side in Expression (42) represents a probability in the event that the user has originally been the position $y_n$ thereof, and has performed self transition, the second term in the right side represents a probability that the user has been changed to the position $y_n$ from the last position $y_{n-1}$. In Expression (42), the state transition probability $a_{ij}$ obtained by learning is used without change unlike calculation of the selection probability of a route.

A predicted value $\langle t_g \rangle$ at point-in-time $t_g$ when arriving at the destination $y_g$ can be represented with a probability that the user has been in a location $y_{g-1}$ one location prior to the destination $y_g$ at point-in-time $t_{g-1}$ immediately prior thereto, and moves the destination $y_g$ at point-in-time $t_g$ as follows.

$$\langle t_g \rangle = \sum_t t_g \left( \frac{P_{x_{g-1}}(t_g-1)a_{x_{g-1}x_g}}{\sum_t P_{x_{g-1}}(t_g-1)a_{x_{g-1}x_g}} \right) \quad (43)$$

Specifically, the predicted value $\langle t_g \rangle$ is represented with an expected value of time from the current point-in-time to "when moving to the state $s_{yg}$ at point-in-time $t_g$ after staying in the state $s_{yg-1}$ one state prior to the state $s_{yg}$ at the point-in-time $t_{g-1}$ immediately prior thereto".

With that, time taken when moving to a predetermined destination or route point using the selected route is obtained by the predicted value $\langle t_g \rangle$ of the above-mentioned Expression (43).

Description will be made regarding representative route selection processing wherein in the event that a route to the destination has been searched using the example in FIG. 63, this is selected as a representative route.

In the event that a search result list as with FIG. 63 has been obtained, from a route having a higher selection probability has sequentially been registered in (a higher rank of) the search result list, and accordingly, the first to the third in the search result list of which the selection probabilities are higher and the destinations differ are output as prediction results. Specifically, the destination $g_1$ and the route $R_1$ thereof, the destination $g_2$ and the route $R_2$ thereof, and the destination $g_3$ and the route $R_3$ are selected as destinations and representative routes thereof.

Next, the fourth and fifth of the search result list are routes to the destination, and accordingly, these are skipped, and it is studied whether to take the route $R_6$ for arriving at the destination $g_3$, of the sixth of the search result list, as a representative route. This route $R_6$ is taken as a route using a route point $w_1$ not included in the route $R_3$ of the same destination $g_3$, which has already been selected as a representative route. Accordingly, the route $R_6$ for arriving at the destination $g_3$ is also selected as a representative route.

Next, it is studied whether to determine the route $R_7$ for arriving at the destination $g_2$, which is the seventh of the search result list, to be a representative route. This route $R_7$ is, as with the same destination $g_2$ which has already selected as a representative route, a route which does not pass through a predetermined route point. Accordingly, the route $R_7$ for arriving at the destination $g_2$ is not selected as a representative route.

In this manner, with the representative route selection processing, without presenting a similar route which passes through generally the same route, routes that pass through different route points, which are conceived to be beneficial for the user, may be presented as prediction results even if they have the same destination.

Note that, with regard to the route $R_6$ for arriving at the destination $g_3$, of the sixth in the search result list, search has been ended at the route point $w_1$ with the method according to the prior application 2 indicated in [Background Art]. However, according to the prediction system 1, it is possible to search a route for arriving at the destination $g_3$ using the route point $w_1$ without ending at the route point $w_1$.

According to the prediction system 1, a route point on the way can be prevented from being predicted as the destination by classifying the destination and a route point to add the corresponding attribute to a state node obtained by learning. Also, in the event that multiple routes to the same destination have been searched, without presenting a similar route which passes through generally the same route, routes that pass through different route points, which are conceived to be beneficial for the user, can be presented.

Figure 64:
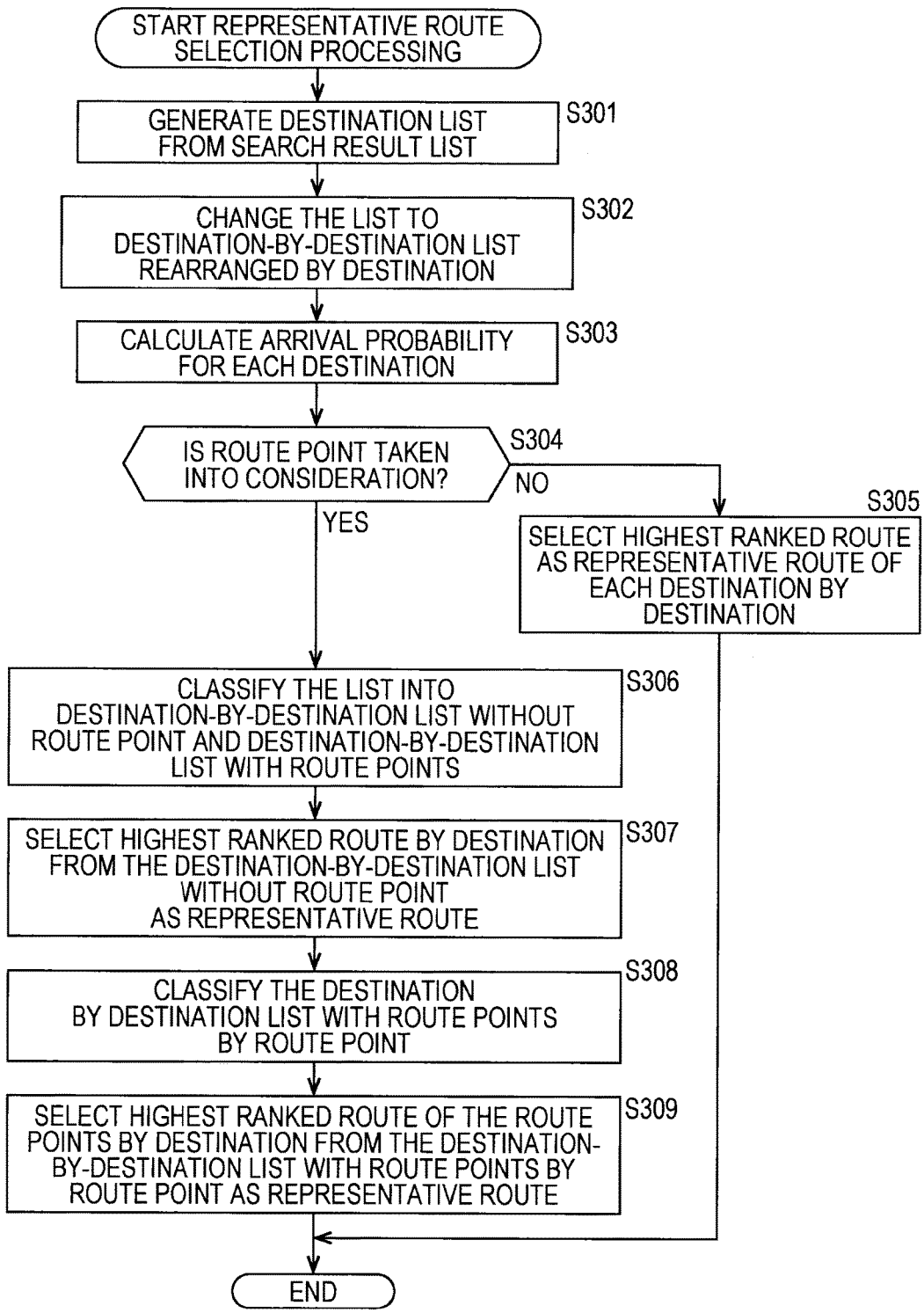
FIG. 64 is a flowchart for describing representative route selection processing.

FIG. 64 is a flowchart of the representative route selection processing to be performed by the prediction postprocessor 34.

First, in step S301, the prediction postprocessor 34 excludes routes to a route point from the search result list created at the destination and route point predicting unit 333, and generates a destination list which is a search result list including destinations alone.

In step S302, the prediction postprocessor 34 changes the destination list into a destination-by-destination list where the destination list is rearranged by destinations. At this time, the prediction postprocessor 34 generates a destination-by-destination list so as not to change the order within the same destination.

In step S303, the prediction postprocessor 34 calculates an arrival probability for each destination. In the event that there is only one route to the destination, the selection probability of the route thereof becomes an arrival probability, and in the event that there are multiple routes to the destination, summation of the multiple selection probabilities (occurrence probabilities) becomes the arrival probability of the destination thereof.

In step S304, the prediction postprocessor 34 determines whether to take route points for selection of a representative route into consideration. In the event that determination is made in step S304 that route points are not taken into consideration, the processing proceeds to step S305, where the prediction postprocessor 34 selects the top-level route as a representative route of each destination, and the processing is ended. As a result thereof, in the event that there are multiple routes to the destination, the route to the destination having a higher selection probability is taken as a representative route of each destination, and time required thereof is presented as time required to the destination. Note that, in the event that there are many destinations, a predetermined number of destinations alone from the top level can be presented.

On the other hand, in the event that determination is made in step S304 that route points are taken into consideration, the processing proceeds to step S306, where the prediction postprocessor 34 classifies the destination-by-destination list into a destination-by-destination list without a route point, and a destination-by-destination list with a route point.

In step S307, the prediction postprocessor 34 selects the top-level route by destinations from the destination-by-destination list without a route point as a representative route. Thus, a route without a route point for each destination, serving as a representative route, is determined.

Next, in step S308, the prediction postprocessor 34 further classifies the destination-by-destination list with a route point by route points.

In step S309, the prediction postprocessor 34 selects the top-level route of the route points from the destination-by-destination list with a route point by destinations as a representative route. Thus, a route with a route point for each destination, serving as a representative route, is determined. As a result thereof, in the event that there is a route without a route point and a route with a route point as routes to the destination, both thereof are taken as representative routes for each destination, and time required of both is presented as time required to the destination.

With that, the representative route selection processing is ended. In this manner, in the event that there are multiple routes to the destination, instead of presenting multiple top-level occurrence probabilities, presenting by classifying these by route points may approximate to prediction that the user actually senses.

[Whole Processing of Prediction Block 13]

Figure 65:
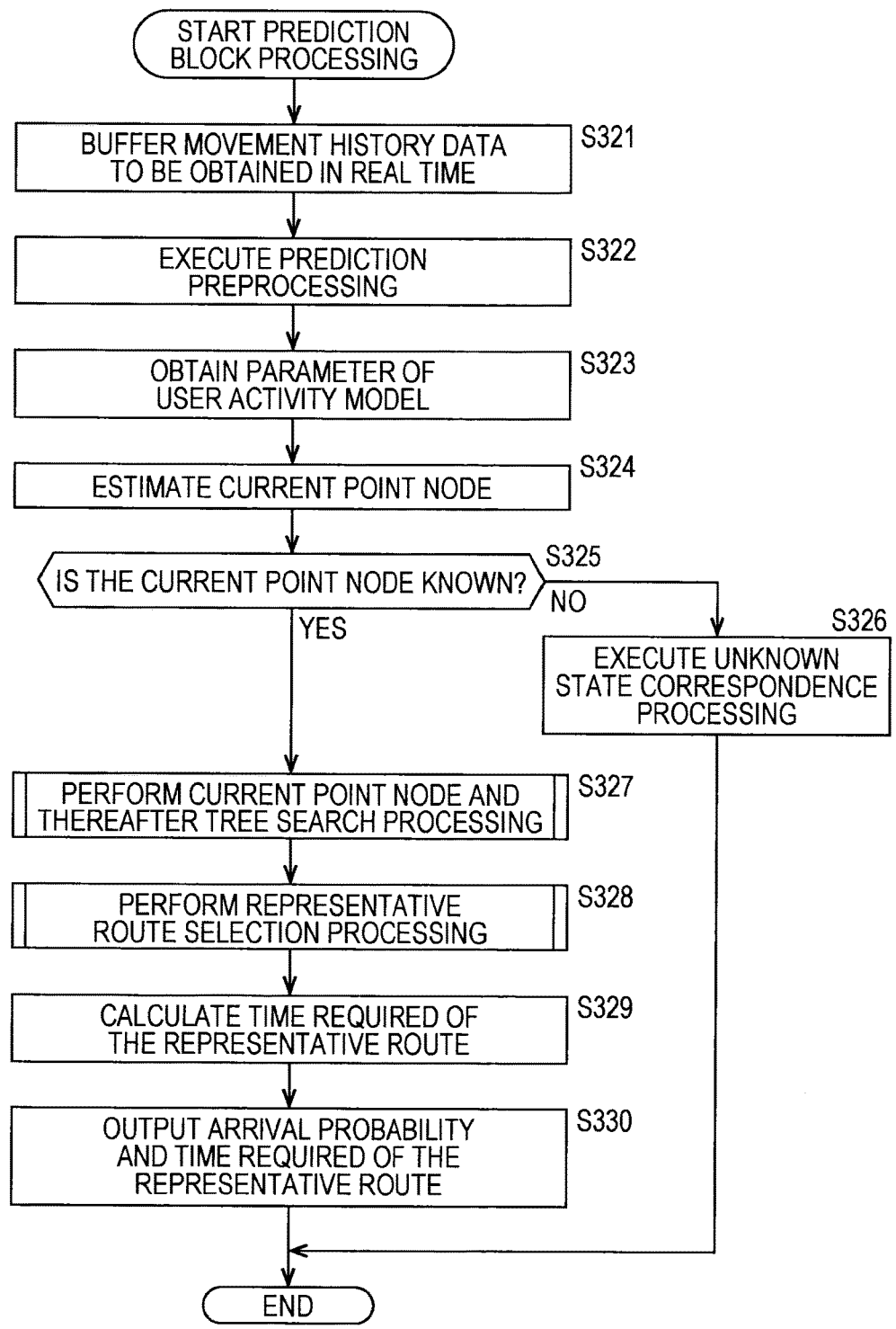
FIG. 65 is a flowchart for describing the entire processing of a prediction block.

The whole processing of the prediction block 13 will be described with reference to the flowchart in FIG. 65.

First, in step S321, the buffering unit 31 buffers, in order to perform prediction processing, movement history data (data for prediction) to be obtained in real time.

In step S322, the prediction preprocessor 32 executes prediction preprocessing. Specifically, the prediction preprocessor 32 executes processing to divide the movement history data, processing to remove explicit abnormal data of the movement history data, and interpolation processing to perform linear interpolation or hold interpolation on a data missing portion of the movement history data. Here, interpolation flag series data that indicates whether or not the movement history data is three-dimensional data (interpolated data) obtained by the interpolation processing, and virtual error series data are also created together. The prediction preprocessor 32 then outputs the movement history data after the interpolation processing and interpolation flag series data and virtual error series data corresponding thereto to the prediction main processor 33.

In step S323, the prediction main processor 33 obtains parameters of the user's activity model obtained by learning of the learning block 11 from the model-parameter-by-user storage unit 12. This processing to obtain the parameters may be executed before starting of the processing in FIG. 65.

In step S324, the current point node estimating unit 331 of the prediction main processor 33 estimates a state node corresponding to the user's current location (current point node) using the user's activity model with the parameters obtained by learning of the learning block 11. More specifically, the current point node estimating unit 331 calculates node series data corresponding to the movement history data using the user's activity model with the parameters obtained by learning of the learning block 11. The last state node of the calculated node series data corresponds to the current point node.

The Viterbi algorithm is employed for calculation of node series data, but as with the state node estimating unit 223 of the known/unknown determining unit 201, the observation probability $P(o_t, e_t|s_i)$ in which the virtual error in Expression (7) has been taken into consideration is employed regarding the interpolated data portion of the movement history data. Thus, as with the state node estimating unit 223 of the known/unknown determining unit 201, even when the interpolated data is greatly distanced from the center $\mu_i$ of the actually corresponding state node $s_i$, the maximum likelihood state transition regarding the data missing portion can be estimated. Also, as described above, there may be employed an observation probability $(o_t|s_i)$ represented by Expression (39) wherein the observation probabilities are equal with all of the state nodes.

In step S325, the known/unknown determining unit 332 executes known/unknown determination processing to determine the estimated current point node to be a known state or unknown state.

More specifically, the known/unknown determining unit 332 has basically the same configuration as with the known/unknown determining unit 201 of the learning main processor 23, and accordingly, first, an unknown state addition model is constructed wherein one unknown state node has been added to the user's activity model with the parameters obtained by learning. Next, state series nodes having the highest likelihood are obtained by executing the Viterbi algorithm on the unknown state addition model, in which the virtual error of interpolated data has been taken into consideration. Next, the observation likelihood expected value L(t)' is calculated by multiplying the virtual error by a monotone increasing correction term (a+b·$e_t$), and known/unknown determination is performed using this observation likelihood expected value L(t)'.

As a result of the known/unknown determination processing in step S325, in the event that determination is made that the current point node is unknown, the processing proceeds to step S326, where the known/unknown determining unit 332 supplies the determination result thereof to the unknown state processing unit 334. The unknown state processing unit 334 executes unknown state correspondence processing such as outputting an error message such as "This is an unknown state" or the like, and the processing is ended.

On the other hand, as a result of the known/unknown determination processing in step S325, in the event that determination is made that the current point node is known, the processing proceeds to step S327, where the known/unknown determining unit 332 supplies the determination result thereof to the destination and route point predicting unit 333. In step S327, the destination and route point predicting unit 333 executes the tree search processing of the current point node and thereafter described with reference to FIG. 60. Simultaneously with the tree search processing, an occurrence probability of a route (node series) to the destination or a route point is also obtained by Expression (41).

In step S328, the prediction postprocessor 34 executes the representative route selection processing described with reference to FIG. 64.

In step S329, the prediction postprocessor 34 calculates time required of each selected representative route using the above-mentioned Expression (43).

In step S330, the prediction postprocessor 34 outputs a representative route, an arrival probability, and time required up to the predicted destination as prediction results, and the processing is ended.

As described above, with the processing by the prediction block 13, a route from the user's current location to the destination is searched using information regarding the estimated destination node and route point node and current point node, and the user's activity model to be expressed by the parameters obtained by learning. The state node obtained by learning is appended with destination and route point attributes, and accordingly, route points can be prevented from being predicted as a destination.

Also, the state node obtained by learning is appended with destination and route point attributes, and accordingly, even with routes to the same destination, a route without a route point and a route with a route point maybe output as representative routes.

Further, even when there is a data missing portion in movement history data including the current location obtained in real time, the prediction block 13 generates interpolated data using hold interpolation processing, and sets virtual error. With estimation of state node series, the prediction block 13 may obtain state node series corresponding to movement history data after the interpolation processing (without collapse due to the interpolated data) by using, with regard to interpolated data, the set virtual error and using an observation probability with less contribution of data than the actual data as the observation probability of a state node. Thus, the current point node equivalent to the user's current location can be estimated, and also, a route from the current location to the destination can be obtained. Specifically, even when there is a gap in the current point data to be obtained in real time, the current location and destination can be predicted.

[Configuration Example of Computer]

The above-mentioned series of processing may be executed not only by hardware but also by software. In the event of executing the series of processing using software, a program making up the software thereof is installed to a computer. Here, the computer includes a computer embedded in dedicated hardware, or for example, a general-purpose personal computer or the like whereby various functions may be executed by installing various programs.

Figure 66:
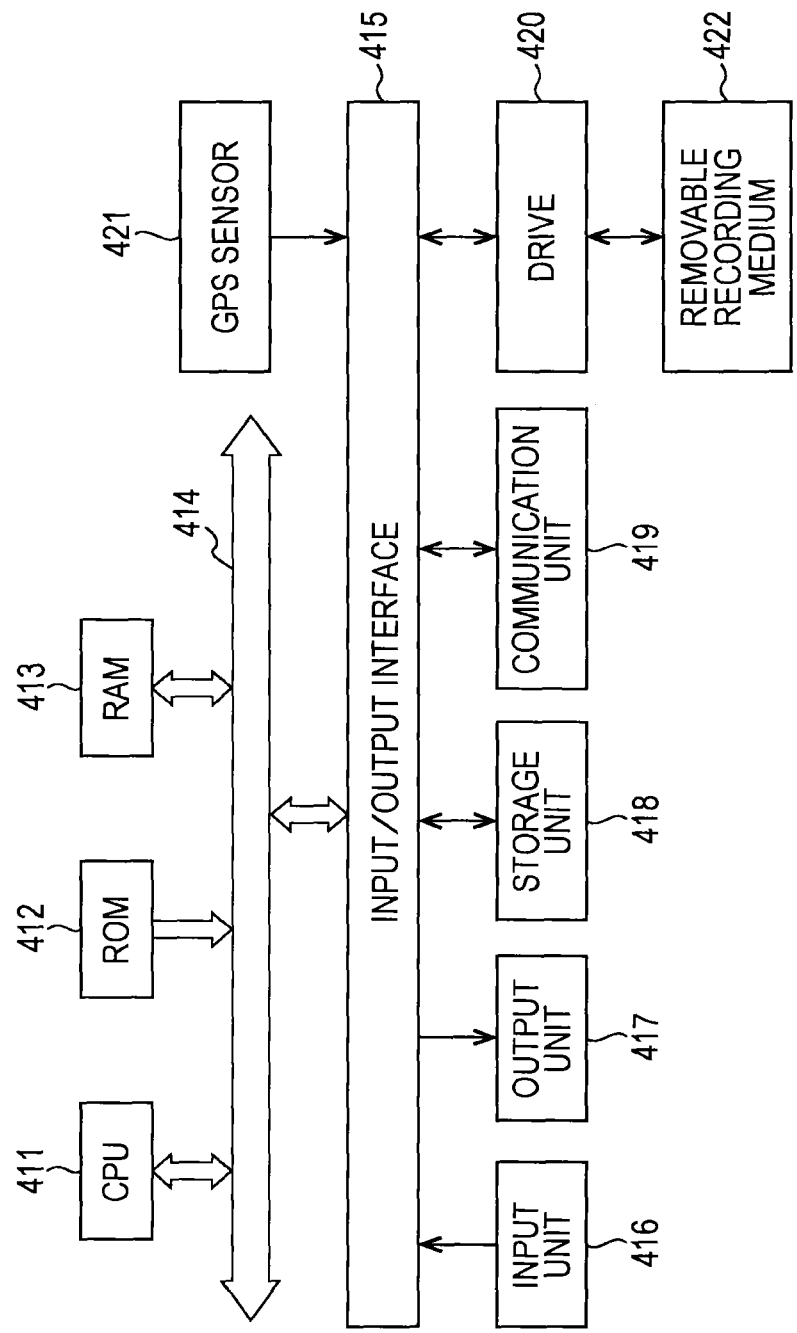
FIG. 66 is a block diagram illustrating a configuration example of an embodiment of a computer to which the present invention has been applied.

FIG. 66 is a block diagram illustrating a configuration example of hardware of a computer which executes the above-mentioned series of processing using a program.

With the computer, a CPU (Central Processing Unit) 411, ROM (Read Only Memory) 412, and RAM (Random Access Memory) 413 are mutually connected by a bus 414.

Further, an input/output interface 415 is connected to the bus 414. There are connected to the input/output interface 415 an input unit 416, an output unit 417, a storage unit 418, a communication unit 419, a drive 420, and a GPS sensor 421.

The input unit 416 is made up of a keyboard, mouse, microphone, and so forth. The output unit 417 is made up of a display, speaker, and so forth. The storage unit 418 is made up of a hard disk, nonvolatile memory, and so forth. The communication unit 419 is made up of a network interface and so forth. The drive 420 which drives a removable recording medium 422 such as a magnetic disk, optical disc, magneto-optical disk, semiconductor memory, or the like. The GPS sensor 421 serving as the above-mentioned sensor device outputs three-dimensional data made up of data of the position of the current location (latitude and longitude), and point-in-time at that time.

With the computer thus configured, the above-mentioned series of processing is performed by the CPU 411 loading to the RAM 413 a program stored in the storage unit 418 via the input/output interface 415 and bus 414, and executing this, for example.

The program that the computer (CPU 411) executes may be provided by being recorded in the removable recording medium 422 serving as a package medium or the like, for example. Also, the program may be provided via a cable or wireless transmission medium such as a local area network, the Internet, or digital satellite broadcast.

With the computer, the program may be installed on the storage unit 418 via the input/output interface 415 by mounting the removable recording medium 422 to the drive 420. Also, the program may be installed on the storage unit 418 by being received at the communication unit 419 via a cable or wireless transmission medium. Additionally, the program may be installed on the ROM 412 or storage unit 418 beforehand.

Note that, with the present Specification, steps described in the flowcharts may be performed, of course, in a time-series manner along sequence described in the present Specification, even in the event of not necessarily being performed in a time series manner, may be performed in parallel or at the required timing such as call-up being performed, or the like.

The system mentioned in the present Specification represents the entire device made up of multiple devices.

Note that embodiments of the present invention are not restricted to the above-mentioned embodiments, and various modifications may be made without departing from the essence of the present invention.

REFERENCE SIGNS LIST

1 prediction system
11 learning block
13 prediction block
22 learning preprocessor
23 learning main processor
24 learning postprocessor
25 destination and route point detector
32 prediction preprocessor
33 prediction main processor
34 prediction postprocessor
73 resampling processing unit
201 known/unknown determining unit
223 state node estimating unit
224 likelihood-by-sample calculating unit
302 prediction data generating unit
313 interpolation processing unit
314 movement attribute identification adding unit
315 virtual error generating unit
331 current point node estimating unit
332 known/unknown determining unit
333 destination and route point predicting unit

The invention claimed is:

1. A data processing device comprising:
circuitry configured to
obtain a parameter of a probability model when a user's movement history data to be obtained as data for learning is represented as the probability model that represents the user's activity;
estimate, of state nodes of the probability model using the parameter obtained by the circuitry, a destination node and a route point node equivalent to a movement destination and a route point;
obtain the user's movement history data within a predetermined period of time from the present which differs from the data for learning, as data for prediction, and in the event that there is a data missing portion included in the obtained data for prediction, generate the data missing portion thereof by interpolation processing, and calculate virtual error with actual data corresponding to interpolated data generated by the interpolation processing:
input the data for prediction of which the data missing portion has been interpolated to the probability model using the parameter obtained by learning, and with estimation of state node series corresponding to the data for prediction of which the data missing portion has been interpolated, estimate a current point node equivalent to the user's current location by using the virtual error as an observation probability of the state nodes regarding the interpolated data, and using an observation probability with less contribution of data than a full set of actual data;
determine whether the current point node obtained by the circuitry is a known-state node or an unknown-state node;
search, in the event that the current point node has been determined to be a known-state node, a route from the user's current location to a destination using information regarding the destination node and the route point node and the current point node, and the probability model obtained by learning;
perform known/unknown determination based on an observation likelihood expected value of each of the state nodes to be calculated from the observation probability of the state nodes, and use the observation likelihood expected value to which a correction term that corrects the data missing portion so as to obtain a greater value than actual data is added;
calculate an arrival probability and time required for the searched destination;
and control a display or a speaker to output the arrival probability and the time required for the searched destination.

2. A data processing device comprising:
circuitry configured to
obtain a parameter of a probability model when a user's movement history data to be obtained as data for learning is represented as the probability model that represents the user's activity;
estimate, of state nodes of the probability model using the parameter obtained by the circuitry, a destination node and a route point node equivalent to a movement destination and a route point;
obtain the user's movement history data within a predetermined period of time from the present which differs from the data for learning, as data for prediction, and in the event that there is a data missing portion included in the obtained data for prediction, generate the data missing portion thereof by interpolation processing, and calculate virtual error with actual data corresponding to interpolated data generated by the interpolation processing, the interpolation processing being linear interpolation on a past data missing portion not including a current point node, and interpolation processing by hold interpolation on a data missing portion including the current point node;
input the data for prediction of which the data missing portion has been interpolated to the probability model using the parameter obtained by learning, and with estimation of state node series corresponding to the data for prediction of which the data missing portion has been interpolated, estimate a current point node equivalent to the user's current location by using the virtual error as an observation probability of the state nodes regarding the interpolated data, and using an observation probability with less contribution of data than a full set of actual data;
determine whether the current point node obtained by the circuitry is a known-state node or an unknown-state node;
search, in the event that the current point node has been determined to be a known-state node, a route from the user's current location to a destination using information regarding the destination node and the route point node and the current point node, and the probability model obtained by learning;

perform known/unknown determination based on an observation likelihood expected value of each of the state nodes to be calculated from the observation probability of the state nodes, and use the observation likelihood expected value to which a correction term that corrects the data missing portion so as to obtain a greater value than actual data is added:

calculate an arrival probability and time required for the searched destination;

and control a display or a speaker to output the arrival probability and the time required for the searched destination.

3. The data processing device according to claim 2, wherein the circuitry is configured to calculate, regarding movement history data subjected to interpolation processing by the linear interpolation, error between interpolated data and smaller one of distance with movement history data immediately before data missing, or distance with movement history data immediately after data restoration, as the virtual error, and calculate, regarding movement data subjected to interpolation processing by the hold interpolation, the virtual error using a predetermined function according to elapsed time after data missing.

4. A data processing device comprising:

circuitry configured to obtain a parameter of a probability model when a user's movement history data to be obtained as data for learning is represented as the probability model that represents the user's activity by, in the event that after obtaining the parameter of the probability model once, movement history data serving as new data for learning is supplied, and there is a data missing portion included in the new data for learning, generating the data missing portion thereof by interpolation processing, and generating the new data for learning including the interpolated data, and determining whether the new data for learning including the interpolated data is movement history data in a known route or movement history data in an unknown route, and not performing updating of a probability distribution parameter of a state node of parameters of existing models which are the already obtained probability models regarding the interpolated data determined to be the movement history data in the known route:

estimate, of state nodes of the probability model using the parameter obtained by the circuitry, a destination node and a route point node equivalent to a movement destination and a route point:

obtain the user's movement history data within a predetermined period of time from the present which differs from the data for learning as data for prediction and in the event that there is a data missing portion included in the obtained data for prediction, generate the data missing portion thereof by interpolation processing, and calculate virtual error with actual data corresponding to interpolated data generated by the interpolation processing:

input the data for prediction of which the data missing portion has been interpolated to the probability model using the parameter obtained by learning and with estimation of state node series corresponding to the data for prediction of which the data missing portion has been interpolated, estimate a current point node equivalent to the user's current location by using the virtual error as an observation probability of the state nodes regarding the interpolated data, and using an observation probability with less contribution of data than a full set of actual data:

determine whether the current point node obtained by the circuitry is a known-state node or an unknown-state node;

search, in the event that the current point node has been determined to be a known-state node, a route from the user's current location to a destination using information regarding the destination node and the route point node and the current point node, and the probability model obtained by learning:

perform known/unknown determination based on an observation likelihood expected value of each of the state nodes to be calculated from the observation probability of the state nodes, and use the observation likelihood expected value to which a correction term that corrects the data missing portion so as to obtain a greater value than actual data is added:

calculate an arrival probability and time required for the searched destination;

and control a display or a speaker to output the arrival probability and the time required for the searched destination.

5. A data processing method comprising:

obtaining a parameter of a probability model when a user's movement history data to be obtained as data for learning is represented as the probability model that represents the user's activity;

estimating, of state nodes of the probability model using the parameter, a destination node and a route point node equivalent to a movement destination and a route point;

obtaining the user's movement history data within a predetermined period of time from the present which differs from the data for learning, as data for prediction, and in the event that there is a data missing portion included in the obtained data for prediction, generating the data missing portion thereof by interpolation processing, and calculating virtual error with actual data corresponding to interpolated data generated by the interpolation processing;

inputting the data for prediction of which the data missing portion has been interpolated to the probability model using the parameter obtained by learning, and with estimation of state node series corresponding to the data for prediction of which the data missing portion has been interpolated, estimating a current point node equivalent to the user's current location by using the virtual error as an observation probability of the state nodes regarding the interpolated data, and using an observation probability with less contribution of data than a full set of actual data;

determining whether the current point node is a known-state node or an unknown-state node;

searching, in the event that the current point node has been determined to be a known-state node, a route from the user's current location to a destination using information regarding the destination node and the route point node and the current point node, and the probability model obtained by learning;

performing known/unknown determination based on an observation likelihood expected value of each of the state nodes to be calculated from the observation probability of the state nodes, and use the observation likelihood expected value to which a correction term that corrects the data missing portion so as to obtain a greater value than actual data is added:

calculating, using circuitry, an arrival probability and time required for the searched destination;

and controlling a display or a speaker to output the arrival probability and the time required for the searched destination.

6. A non-transitory computer readable medium including executable instructions which when executed by a computer cause the computer to:

obtain a parameter of a probability model when a user's movement history data to be obtained as data for learning is represented as the probability model that represents the user's activity;

estimate, of state nodes of the probability model using the parameter, a destination node and a route point node equivalent to a movement destination and a route point;

obtain the user's movement history data within a predetermined period of time from the present which differs from the data for learning, as data for prediction, and in the event that there is a data missing portion included in the obtained data for prediction, generate the data missing portion thereof by interpolation processing, and calculate virtual error with actual data corresponding to interpolated data generated by the interpolation processing;

input the data for prediction of which the data missing portion has been interpolated to the probability model using the parameter obtained by learning, and with estimation of state node series corresponding to the data for prediction of which the data missing portion has been interpolated, estimate a current point node equivalent to the user's current location by using the virtual error as an observation probability of the state nodes regarding the interpolated data, and using an observation probability with less contribution of data than a full set of actual data;

determine whether the current point node is a known-state node or an unknown-state node;

search, in the event that the current point node has been determined to be a known-state node, a route from the user's current location to a destination using information regarding the destination node and the route point node and the current point node, and the probability model obtained by learning;

perform known/unknown determination based on an observation likelihood expected value of each of the state nodes to be calculated from the observation probability of the state nodes, and use the observation likelihood expected value to which a correction term that corrects the data missing portion so as to obtain a greater value than actual data is added;

calculate an arrival probability and time required for the searched destination;

and control a display or a speaker to output the arrival probability and the time required for the searched destination.

* * * * *